United States Patent
Atanackovic

(10) Patent No.: US 9,614,122 B2
(45) Date of Patent: Apr. 4, 2017

(54) OPTICAL TUNING OF LIGHT EMITTING SEMICONDUCTOR JUNCTIONS

(71) Applicant: THE SILANNA GROUP PTY LTD, Eight Mile Plains (AU)

(72) Inventor: Petar Atanackovic, Henley Beach South (AU)

(73) Assignee: The Silanna Group Pty Ltd, Eight Mile Plains, QLD (AU)

( * ) Notice: Subject to any disclaimer, the term of this patent is extended or adjusted under 35 U.S.C. 154(b) by 0 days.

(21) Appl. No.: 15/192,731

(22) Filed: Jun. 24, 2016

(65) Prior Publication Data

US 2016/0308090 A1 Oct. 20, 2016

Related U.S. Application Data

(62) Division of application No. 14/325,131, filed on Jul. 7, 2014, now Pat. No. 9,412,911.

(Continued)

(51) Int. Cl.
*H01L 21/00* (2006.01)
*H01L 33/00* (2010.01)
(Continued)

(52) U.S. Cl.
CPC .......... *H01L 33/0095* (2013.01); *H01L 22/24* (2013.01); *H01L 22/26* (2013.01);
(Continued)

(58) Field of Classification Search
CPC ......... H01L 22/24; H01L 22/26; H01L 33/38; H01L 33/005; H01L 33/60; H01L 33/0079;
(Continued)

(56) References Cited

U.S. PATENT DOCUMENTS 5,532,510 A 7/1996 Amorai-Moriya et al.
5,606,176 A 2/1997 Nitta
(Continued)

FOREIGN PATENT DOCUMENTS

EP 2081063 A 7/2009
EP 2237334 A 10/2010
(Continued)

OTHER PUBLICATIONS

Amano et al, Nitride-Based UV Lasers, Lasers and Electro-Optics Society, 2007. LEOS 2007. The 20th Annual Meeting of the IEEE, Oct. 2007, pp. 380-381.
(Continued)

*Primary Examiner* — (Vikki) Hoa B Trinh
(74) *Attorney, Agent, or Firm* — The Mueller Law Office, P.C.

(57) ABSTRACT

Light emitting semiconductor junctions are disclosed. An exemplary light emitting junction has a first electrical contact coupled to a first side of the junction. The exemplary junction also has a second electrical contact coupled to a second side of the junction. The exemplary junction also has a region of set straining material that exerts a strain on the junction and alters both: (i) an optical polarization, and (ii) an emission wavelength of the junction. The region of set straining material is not on a current path between said first electrical contact and said second electrical contact. The region of set straining material covers a third side and a fourth side of the light emitting junction along a cross section of the light emitting junction. The light emitting semiconductor junction device comprises a three-five alloy.

20 Claims, 58 Drawing Sheets

Related U.S. Application Data

(60) Provisional application No. 61/844,228, filed on Jul. 9, 2013.

(51) Int. Cl.
  H01L 33/44 (2010.01)
  H01L 27/15 (2006.01)
  H01L 33/20 (2010.01)
  H01L 33/32 (2010.01)
  H01L 21/66 (2006.01)
  H01L 33/30 (2010.01)

(52) U.S. Cl.
  CPC ............ H01L 27/153 (2013.01); H01L 33/20 (2013.01); H01L 33/32 (2013.01); H01L 33/44 (2013.01); H01L 33/30 (2013.01); *H01L 2933/005* (2013.01); *H01L 2933/0058* (2013.01)

(58) Field of Classification Search
  CPC ....... H01L 33/405; H01L 33/46; H01L 33/56; H01L 2933/0058; H01L 2933/0025; H01L 2933/0033
  See application file for complete search history.

(56) References Cited

U.S. PATENT DOCUMENTS

| | | |
|---|---|---|
| 5,689,123 A | 11/1997 | Major et al. |
| 5,719,884 A | 2/1998 | Roth et al. |
| 6,190,985 B1 | 2/2001 | Buynoski |
| 6,194,742 B1 | 2/2001 | Kern et al. |
| 6,483,147 B1 | 11/2002 | Lin |
| 6,712,478 B2 | 3/2004 | Sheu et al. |
| 6,900,501 B2 | 5/2005 | Darmawan |
| 6,958,497 B2 | 10/2005 | Emerson et al. |
| 7,030,428 B2 | 4/2006 | Saxler |
| 7,312,474 B2 | 12/2007 | Emerson et al. |
| 7,335,545 B2 | 2/2008 | Currie |
| 7,538,859 B2* | 5/2009 | Tearney ............... A61B 5/0066 356/35.5 |
| 7,588,994 B2 | 9/2009 | Lochtefeld et al. |
| 7,769,066 B2 | 8/2010 | Chakraborty et al. |
| 7,825,432 B2 | 11/2010 | Saxler et al. |
| 7,830,926 B1 | 11/2010 | Kim |
| 8,044,384 B2 | 10/2011 | Bergmann et al. |
| 8,044,417 B2 | 10/2011 | Masui et al. |
| 8,153,515 B2 | 4/2012 | Saxler |
| 8,170,388 B2 | 5/2012 | Schrauwen et al. |
| 8,227,268 B2 | 7/2012 | Emerson et al. |
| 8,227,791 B2 | 7/2012 | Yan |
| 8,227,818 B2 | 7/2012 | Weisbuch et al. |
| 8,242,484 B2 | 8/2012 | Khan |
| 8,354,663 B2 | 1/2013 | Adivarahan et al. |
| 8,399,876 B2 | 3/2013 | Kim |
| 9,240,517 B2 | 1/2016 | Johnston et al. |
| 9,240,533 B2 | 1/2016 | Lee et al. |
| 9,246,311 B1 | 1/2016 | Raring et al. |
| 9,252,329 B2 | 2/2016 | Northrup et al. |
| 9,269,788 B2 | 2/2016 | Gaska et al. |
| 9,281,439 B2 | 3/2016 | Niwa et al. |
| 9,281,441 B2 | 3/2016 | Shur et al. |
| 9,281,445 B2 | 3/2016 | Donofrio |
| 9,287,442 B2 | 3/2016 | Shatalov et al. |
| 9,287,449 B2 | 3/2016 | Gaska et al. |
| 9,287,455 B2 | 3/2016 | Shur et al. |
| 9,293,670 B2 | 3/2016 | Toita et al. |
| 9,299,880 B2 | 3/2016 | Grandusky et al. |
| 9,312,428 B2 | 4/2016 | Shatalov et al. |
| 9,312,448 B2 | 4/2016 | Lunev et al. |
| 9,318,650 B2 | 4/2016 | Zhang |
| 9,318,652 B1 | 4/2016 | Liao et al. |
| 9,330,906 B2 | 5/2016 | Shatalov et al. |
| 9,331,240 B2 | 5/2016 | Khan et al. |
| 9,331,244 B2 | 5/2016 | Shatalov et al. |
| 9,331,246 B2 | 5/2016 | Kneissl et al. |
| 9,337,387 B2 | 5/2016 | Shatalov et al. |
| 9,356,192 B2 | 5/2016 | Pernot et al. |
| 9,368,580 B2 | 6/2016 | Shatalov et al. |
| 9,368,582 B2 | 6/2016 | Kizilyalli et al. |
| 9,385,271 B2 | 7/2016 | Shur et al. |
| 9,397,260 B2 | 7/2016 | Jain et al. |
| 9,397,269 B2 | 7/2016 | Chae et al. |
| 9,401,452 B2 | 7/2016 | Northrup et al. |
| 9,401,456 B2 | 7/2016 | Lee et al. |
| 9,412,901 B2 | 8/2016 | Shur et al. |
| 9,412,902 B2 | 8/2016 | Shatalov et al. |
| 9,412,922 B2 | 8/2016 | Jang et al. |
| 9,437,430 B2 | 9/2016 | Schowalter et al. |
| 9,437,774 B2 | 9/2016 | Gaska et al. |
| 9,437,775 B2 | 9/2016 | Takeuchi et al. |
| 9,444,224 B2 | 9/2016 | Chua et al. |
| 9,450,157 B2 | 9/2016 | Yamada et al. |
| 9,455,300 B1 | 9/2016 | Collins et al. |
| 9,461,198 B2 | 10/2016 | Liao et al. |
| 9,466,761 B2 | 10/2016 | Choi et al. |
| 9,468,695 B2 | 10/2016 | Liao et al. |
| 9,496,455 B2 | 11/2016 | Park et al. |
| 9,502,509 B2 | 11/2016 | Shatalov et al. |
| 9,502,606 B2 | 11/2016 | Pernot et al. |
| 2007/0051962 A1 | 3/2007 | Lai |
| 2009/0296765 A1 | 12/2009 | Takayama et al. |
| 2011/0013874 A2 | 7/2010 | Schrauwen et al. |
| 2012/0273807 A1 | 11/2012 | Von et al. |
| 2013/0039664 A1 | 2/2013 | Clifton et al. |
| 2014/0319559 A1* | 10/2014 | Guo ................... H01L 33/0079 257/97 |
| 2015/0014723 A1 | 1/2015 | Atanackovic |

FOREIGN PATENT DOCUMENTS

| | | |
|---|---|---|
| WO | 2009005894 A | 1/2009 |
| WO | 2011159993 A | 12/2011 |
| WO | 2012106282 A1 | 8/2012 |
| WO | 2012165752 A | 12/2012 |

OTHER PUBLICATIONS

Fu et al, Biaxial and Uniaxial Strain Effects on the Ultraviolet Emission Efficiencies of AlxGa1—xN Films with Different Al Concentrations, Journal of Applied Physics 108, 103107, Nov. 2010.

Fu et al., Exploring Optimal UV Emission Windows for AlGaN and AlInN Alloys Grown on Different Templates, Basic Solid State Physics 248, No. 12, pp. 2816-2820, Jul. 2011.

Hirayama et al., 222-282 nm AlGaN and InAlGaN based deep-UV LEDs Fabricated on High-Quality AlN Template, Proceedings of SPIE vol. 7216, 721621-1, May 2009.

Notice of Allowance dated Apr. 12, 2016 for U.S. Appl. No. 14/325,131.

Wang and Wu, Study of Optical Anisotropy in Nonpolar and Semipolar AlGaN Quantum Well Deep Ultraviolet Light Emission Didode, Journal of Applied Physics 112, Aug. 3, 2012.

Wang and Wu, Study of Optical Anisotropy of c-plane/m-plane Ultra-violet LED and Laser Diode by k.p Method, Optical Society of America, CLEO Technical Digest, May 2012.

Zhao et al., Self-Consistent Analysis of Strain-Compensated InGaN—AlGaN Quantum Wells for Lasers and Light-Emitting Diodes, IEEE Journal of Quantum Electronics, vol. 45, No. 1, Jan. 2009.

* cited by examiner

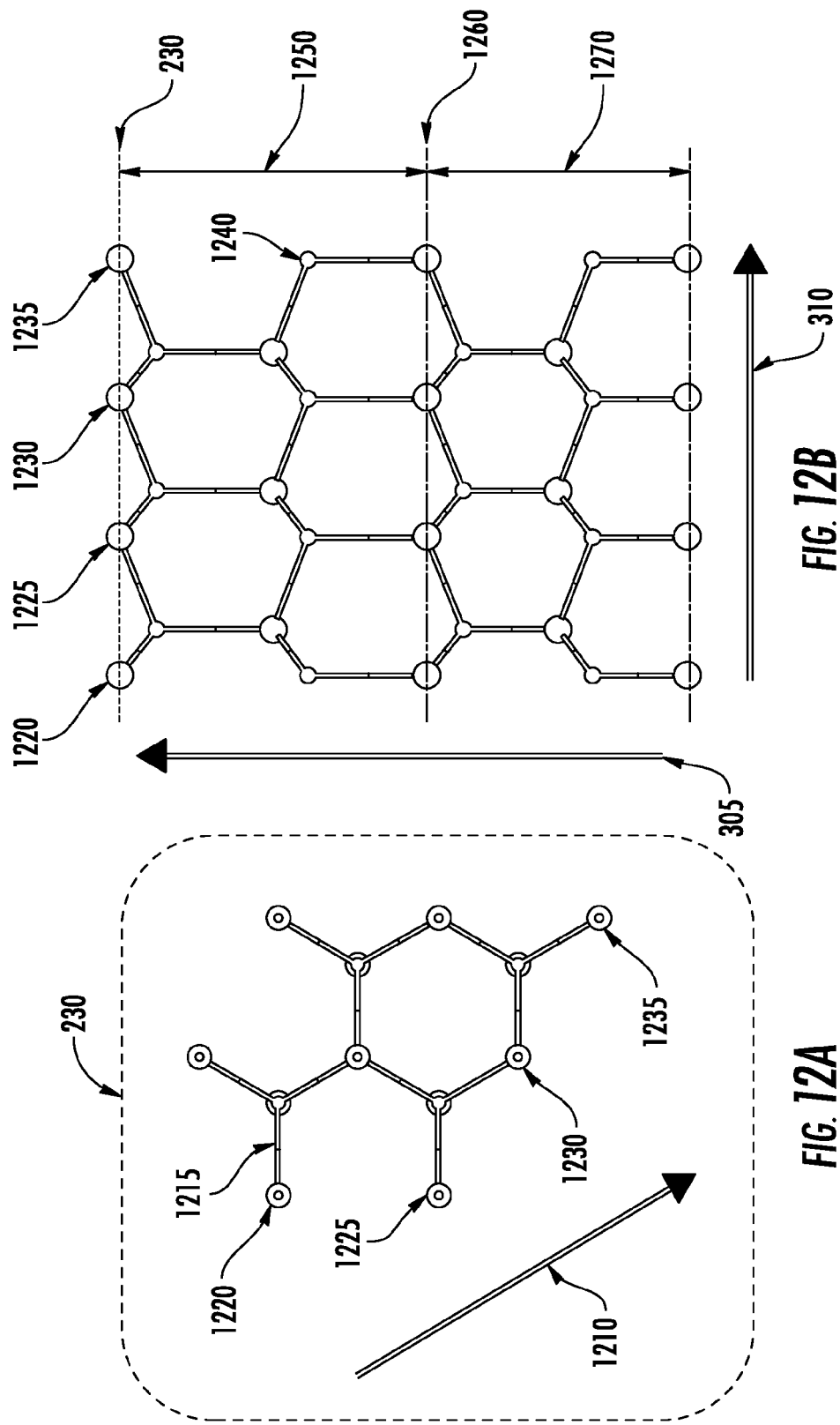

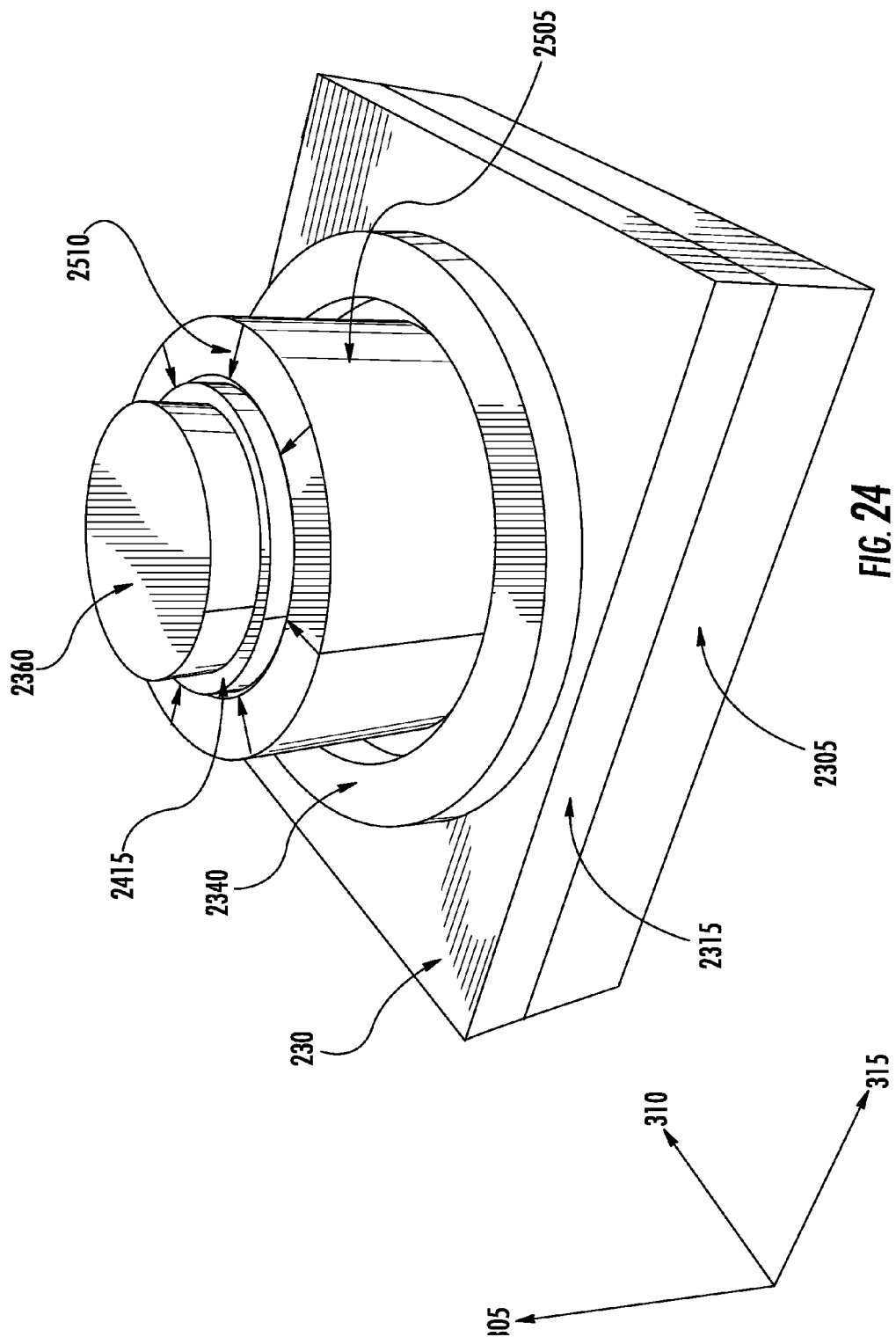

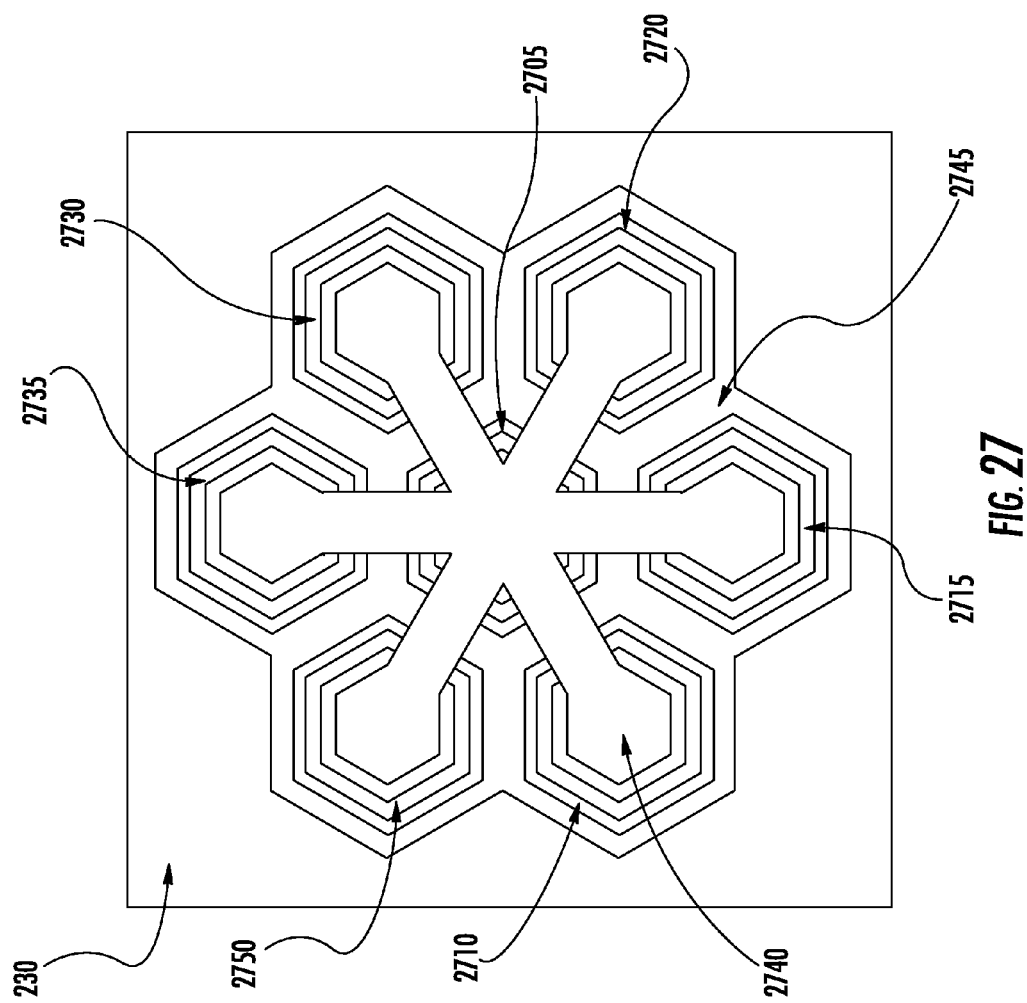

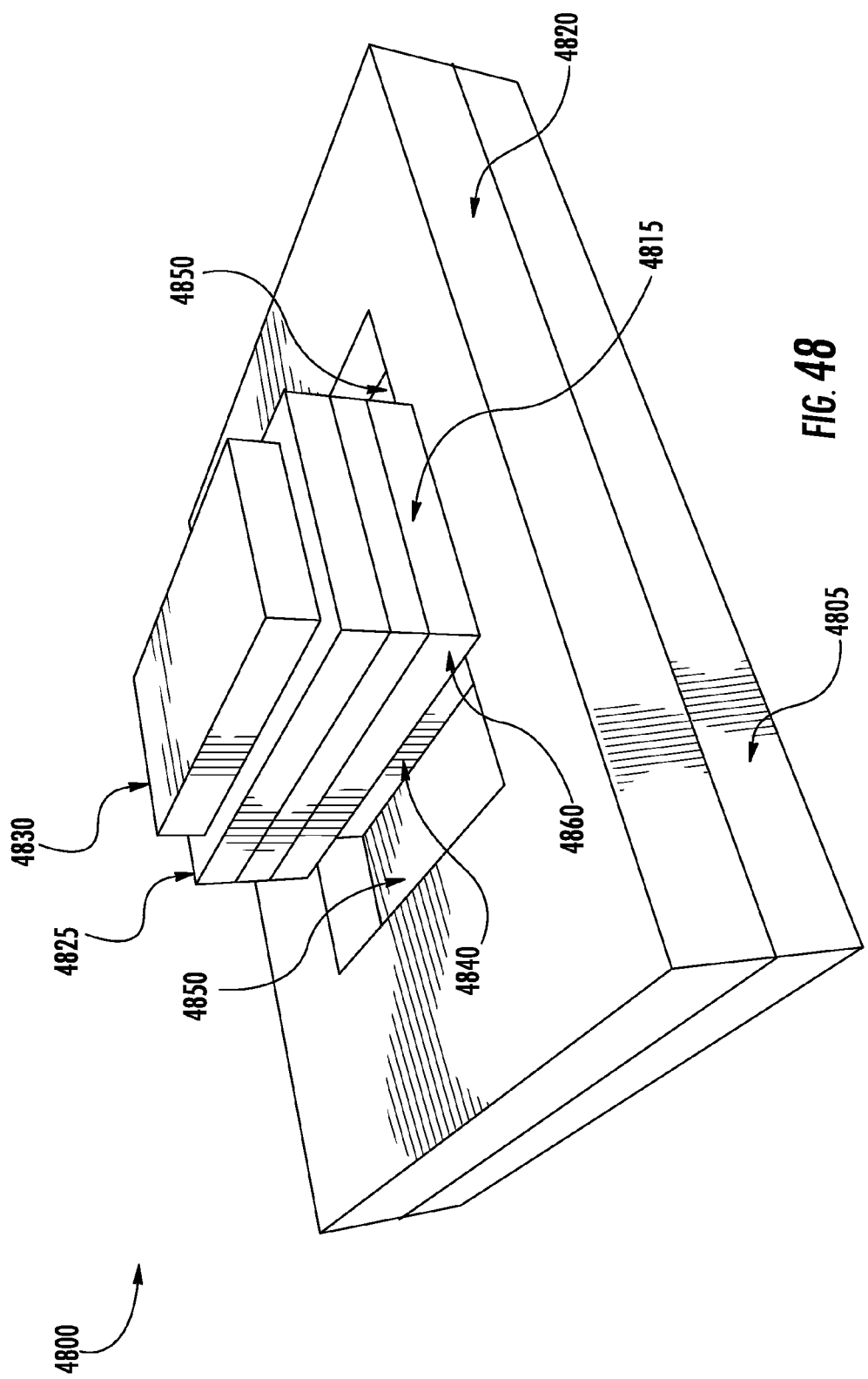

OPTICAL TUNING OF LIGHT EMITTING SEMICONDUCTOR JUNCTIONS

CROSS-REFERENCE TO RELATED APPLICATIONS

This application is a divisional application of U.S. patent application Ser. No. 14/325,131, filed Jul. 7, 2014, which claims the benefit of U.S. Provisional Application No. 61/844,228, filed Jul. 9, 2013, both of which are incorporated by reference herein in their entirety.

BACKGROUND OF THE INVENTION

Semiconductor optoelectronic devices are efficient energy transformers which can convert electrical energy into optical energy. The reciprocal process is also possible wherein optical energy is converted directly into electrical energy. Optically emissive devices that generate light from an electrical source are used as solid-state semiconductor light sources such as incoherent light emitting diodes (LEDs) and coherent light emitting laser diodes. Semiconductor light sources take advantage of the interaction of optical energy with the semiconductor's crystal structure which has a specific electronic energy configuration known as the electronic band structure.

The industrial and commercial potential for LEDs and semiconductor lasers continues to expand. Although LEDs have been available since the 1960s, the efficiency of LEDs has continuously improved since that time, and solid-state lighting applications using LEDs are now considered a viable alternative to incandescent and high intensity discharge light sources. Modern LEDs produce light across the visible and near infrared electromagnetic spectrum, and researchers have developed semiconductor materials for LEDs that produce deep ultraviolet (DUV) light typically operating in the optical wavelength range of 190 nm to 290 nm. DUV-LEDs producing incoherent light have significant commercial potential for surface and air sterilization or sanitation, extremely high-density optical storage having high speed read & write ability that is competitive to nanoscale imprint technologies, fine geometry lithography, and information processing systems generally. In particular, optical communication links using the deep ultraviolet band offers unique short range device connectivity. Various additional applications that require efficient and compact sources for ultraviolet light are enabled by DUV-LEDs such as those involving the interrogation of biological systems.

Semiconductor light sources generate light using semiconductor junctions comprising at least a p-type semiconductor region and an n-type semiconductor region. The p-type semiconductor region is designed to be a source of holes, whereas the n-type region is a source of electrons. Under the appropriate external electrical bias, electron and holes are injected from their respective sources towards an electron-hole-recombination region (EHR)—which can be described with reference to FIG. 1a.

For the case of a p-n junction diode, the electron-hole-recombination region is substantially the depletion region between the p-type and n-type semiconductors. Alternatively, an intentional intrinsic region or not-intentionally doped (NID) region can be inserted between the p-type and n-type regions to form a p-i-n diode. A p-i-n diode is designed such that a majority of the electron-hole-recombination occurs spatially within the intrinsic or NID region.

FIG. 1a illustrates a semiconductor junction 100 comprising distinct spatial regions of semiconductor material types and the associated energy band diagram 101 along a spatial direction comprising the ordinate of the diagram. The abscissa of energy band diagram 101 correlates spatially with cross section 102 of semiconductor junction 100. In other words, the left side of energy band diagram 101 corresponds to the p-type portion 103 of semiconductor junction 100, and the right side of energy band diagram 101 corresponds to the n-type portion 104 of semiconductor junction 100. The p-type portion 103 of the semiconductor junction comprises mobile positive charge carriers in the form of holes 105. The n-type portion 104 of the semiconductor junction comprises mobile negative charge carriers in the form of electrons 106. The electrons and holes can diffuse and drift toward the depletion region or intrinsic region 107. For the case of p-n and p-i-n junctions, the regions 103, 107 and 104 can comprise a uniform bandgap composition and can collectively be referred to as a homojunction. If anyone or all of the regions 103, 107 or 104 comprise dissimilar semiconductor compositions of differing bandgap, then a so called heterojunction device is formed. For the case of a p-n device, there will be an equilibrium reaction wherein electrons and holes diffuse across the interface defining a p-type region and an n-type region forming a built-in potential. This built-in potential establishes a depletion region that is neither n-type nor p-type and is ideal for functioning as an EHR. In p-i-n junctions, the region 107 is additionally and intentionally engineered with a predetermined dimension which is often larger than the depletion region formed by an abrupt p-n junction. This is particularly useful for controlling the spatial extent of EHR for the purpose of photon generation and extraction of said photon externally from the device.

The mechanism by which semiconductor junction 100 generates light comprising photons having distinct energy spectrum (or equivalent wavelength spectrum) is by the simultaneous particle recombination of spatially coincident electrons in the lowest energy potion of the conduction band with holes in the highest portion of the valence band. That is, the process of generating a photon of energy $E_p$ is determined by the energy difference between an electron in the conduction band and hole in the valence band where $E_p = E_c(\underline{k}=0, z) - E_v(\underline{k}=0, z) \sim E_G$. The respective electron and hole energies are in general taken at the same semiconductor crystal momentum vector $\underline{k}$ of the host semiconductor band structure (having a distinct energy-momentum dispersion defining said band structure) in order to conserve energy and momentum during the conversion process. This is due to the fact that a photon has zero momentum. High efficiency optical generation via electron-hole recombination process occurs for so-called direct bandgap semiconductors wherein the energy-momentum dispersion has the lowest lying energy of conduction band occurring at $\underline{k}=0$ and the highest lying valence band also occurring at $\underline{k}=0$. In general, all optical properties of interest for light emission occur in the vicinity of the so called zone center of the band structure, which is centered at $\underline{k}=0$. Therefore, the bandgap of the host semiconductor represented by $E_G \equiv E_G(\underline{k}=0)$ is typically defined as the energy difference between said lowest energy conduction and highest valence band energies at $\underline{k}=0$. This allows representations of the spatial band structure of p-n and p-i-n devices to be abbreviated by their $\underline{k}=0$ representation, as described with reference to FIG. 1a. Note, in general $E_p \leq E_G$ due to the coulomb attraction of the electron and hole forming an intermediary particle called an exciton having binding energy $E_B$.

The energy band diagram 101 of the layered p-i-n diode 100 of FIG. 1a is therefore representative of a homogeneous bandgap semiconductor spatially modified along a direction comprising the ordinate of the diagram, so as to exhibit a distinct p-type 103, an optional NID or depletion region 107 and an n-type region 104. The so called conduction band edge $E_c(\underline{k}=0, z)$ 108 represents the $\underline{k}=0$ energy position of the lowest energy conduction band of the host semiconductor, whereas the valence band edge $E_v(\underline{k}=0, z)$ 109 represents the highest valence band energy position relative to the conduction band edge 108.

The p-type 103 and n-type 104 regions can be electrically contacted by ideal low resistance ohmic contacts forming a two electrical terminal device. Under appropriate externally applied electrical bias applied to the contacts, the junction of FIG. 1a can be operated to function in forward bias mode wherein mobile electrons 106 in region 104 and holes 105 in region 103 are injected toward region 107. For the case of a p-n homojunction, region 107 is the well known depletion region of width WD setup by the abrupt junction formed between the n-type 104 and p-type region 103. The built-in electric field along the device direction, comprising the ordinate of the diagram, is determined by the difference in acceptor and donor doping concentrations in regions 103 and 104, respectively, and the applied electrical bias.

For the case of a p-i-n diode, the intrinsic region has a width that is intentionally engineered to have width $W_i$ and is generally not intentionally doped with impurity species or is advantageously compensated or chemically modified so that the Fermi energy $E_F$ lies wholly within the bandgap of the host semiconductor. Preferably, the intrinsic region should be devoid of non-radiative traps or loss paths provided by structural defects and have $E_F$ positioned approximately to half of $E_G$.

Once the light has been generated in the semiconductor junction it will need to be coupled out from the interior of the device and emitted externally for utility as a light source. In this regard, the design of semiconductor laser diodes and LEDs differ significantly. Both LEDs and laser diodes can be designed to be of a vertically emitting type (i.e., light is generated within the device and emitted substantially perpendicular to the plane of the layers) or a waveguide type (i.e., light generated and guided within the device and emitted substantially parallel to the plane of the layers). In both of these optical design configurations, the optical polarization of the generated light is of critical importance.

In general, lasers require the additional feature of parallel reflective layers bounding the optical generation region in order to recycle photons back into the EHR region for the express purpose of producing stimulated emission and thus coherent light. In contrast, LEDs are generally classed as producing photons due to spontaneous emission process and thus produce incoherent light output. LEDs can produce light that is optically polarized or non-polarized, whereas laser diodes produce polarized emitted light. The polarization state of a given device is determined by both the semiconductor bandstructure and the optical structure configuration, namely, vertical emitter or waveguide type. The choice of any one particular optical configuration using specific semiconductor materials will be determined by the optical properties of the light required for a given application and the cost of producing the device. In general, vertically emissive devices are of lower cost than waveguide type devices. However, achieving high optical extraction efficiency (which is the ratio of the amount of light generated within the device to the amount of light extracted externally from the device), is often the prime goal. This has proven to be a limiting attribute for deep ultraviolet LEDs wherein the extraction efficiency is fundamentally limited by the semiconductor band structure and the high optical refractive index of the semiconductor material itself.

The effect of the optical polarization of light internally generated by a semiconductor junction on the performance of the device can be described with reference to FIG. 1b. This figure displays a semiconductor structure 110 comprising an active layer 111 and a substrate 112. Substrate 112 is generally a single crystal material if used for subsequent epitaxial deposition of active layers 111. Alternatively, substrate 112 may be non-crystalline or amorphous if used as a mechanical support or as an optical coupler for otherwise mechanically transferred crystalline active layers 111.

Substrate 112 may further be either selected from an optically opaque or transparent material if utilized as a crystalline template for seeding epitaxial layers 111. If the substrate is transparent to the design emission wavelength, then light can be coupled externally from the device layers 111. If the crystalline substrate 112 is opaque to the design wavelength, then optical energy can be coupled out from the device laterally as a waveguide or from the topmost surface. Yet a further method of coupling energy out from active layers 111 using an opaque substrate is to remove a portion of the substrate material beneath the active region of a device so as to enable emission through an aperture in the substrate.

For application of homojunction and heterojunction LEDs to deep ultraviolet wavelengths in the range of 200 to 260 nm, the wide band gap semiconductor materials having a composition of aluminium-gallium-indium-nitride (with chemical formula $Al_xGa_yIn_{1-x-y}N$, where $0 \leq x \leq 1$, $0 \leq y \leq 1$) and magnesium-zinc-oxide ($Mg_xZn_{1-x}O$ where $0 \leq x \leq 1$, $0 \leq y \leq 1$) are of particular interest. Other material compositions are also possible. However, the technologically mature AlGaInN and MgZnO materials have been shown to be able to form stable and continuous compositions of ternary and quaternary alloys by varying the mole fractions of the incorporated metals within the nitride or oxide crystalline structure.

The group-III Nitride material is presently the most mature wide band gap semiconductor material and is widely used in near ultraviolet and visible LEDs in the wavelength range of 250 to 600 nm. Unfortunately, deep ultraviolet LEDs based on AlGaN, AlInGaN or AlInN operating with bandgap energies in the range from about 200 nm to approximately 260 nm suffers a deleterious and fundamental limitation of the electronic band structure that is inefficient for vertical type emitters.

Furthermore, heterojunction LED devices using two or more dissimilar composition of group-III Nitrides formed as a wurtzite crystal structure suffer from the disadvantageous creation of internal spontaneous and piezoelectric electric fields due to extremely large induced polarization charges at each heterojunction interface. That is, at each interface (for example the interface between $Al_xGa_{1-x}N/Al_yGa_{1-y}N$ where $x \neq y$) these polarization charges generate built-in electric polarization fields which tend to prevent the efficient spatial localization of electrons and holes, and thus exhibit poor electrical-to-optical generation efficiency.

The internal polarization charges at a group-III Nitride heterojunction interface can be reduced and potentially eliminated if grown epitaxially as substantially single crystal films on semi-polar or non-polar surfaces, and have been identified in the prior art. Unfortunately, epitaxial deposition of thin films of wurtzite group-III Nitrides on non-polar crystal surfaces typically result in poor crystal quality films when compared to a deposition on the so called polar surface c-plane having hexagonal unit cell crystal symmetry. Thus the highest structural quality material for group-III Nitrides (and indeed also for MgZnO) is obtained by depositing on the polar c-plane and in turn results in the highest polar type of crystal with largest internal polarization charge for a given heterojunction interface. Thin film single crystal group-III Nitrides deposited along a growth direction which is substantially perpendicular to the c-plane therefore results in the two distinct crystal structure film types labelled as metal-polar and nitrogen-polar. Achieving a group-III Nitride structure that exhibits pure polarity-type, namely metal-polar and nitrogen polar is in general a desirable goal for device operation. Introduction of structural defects increases the probability of creating mixed polarity domains within the films during epitaxy.

There is yet a further problem with prior art group-III Nitride bulk substrate growth and epitaxial deposition methods. Native single crystal group-III Nitride binary substrates of GaN and AlN are available with low defect density but have relatively high cost of manufacture when compared to high quality single crystal sapphire and silicon. Epitaxial growth of electronic and optical devices using single crystal low defect density ternary AlGaN and AlInAl or quaternary AlInGaN films are also limited by the in-plane lattice constant mismatch Δa of the film with respect to the crystalline substrate. Therefore, Δa is a function of group-III Nitride epitaxial material composition relative to the underlying substrate lattice constant.

In general, epitaxial layer deposition degrades in structural quality for a given group-III Nitride composition when the individual layer thickness exceeds the so called critical layer thickness (CLT) when deposited on a dissimilar substrate. The critical layer thickness is defined as the maximum epitaxial layer thickness that can accommodate the in-plane lattice distortion of the crystal unit cell elastically without creating misfit dislocations. The CLT correlates strongly with the lattice mismatch. This places severe limitations on the material combinations of epitaxially layered heterojunction devices if structural defects are required to be low.

In particular, for the case of LEDs and laser diodes, these structural crystal defects arising from lattice constant mismatch of dissimilar group-III Nitride films present alternative electron and hole recombination pathways that are non-radiative in nature and thus represent a major production loss for the desired emission energy engineered by the bandgap or heterojunction device.

Therefore, the lattice constant mismatch problem of heterojunctions and multilayered stacks of dissimilar composition films (each having an associated distinct band structure and crystal lattice constant) limits the ultimate internal quantum efficiency and design range of emission wavelengths for optically emissive devices. The management of internal elastic strain of each of the dissimilar layers comprising a heterojunction device or multilayered stack comprising a plurality of dissimilar composition films is important for controlling the final crystal structure quality of the device. In practice, the previously discussed lattice mismatch issues place severe limitation on the choice compositions selected for constructing a given device and thus the design space of possible bandgap engineered devices.

Yet a further major problem in the group-III Nitrides is the deposition process complexity for creating multiple layers of dissimilar compositions with a wide range of alloy compositions within a given deposition process, albeit by using either chemical vapor deposition (CVD), metal organic CVD (MOCVD), molecular beam epitaxy (MBE), vapor phase epitaxy (VPE), sputter deposition, ion beam deposition, and other methods. That is, in general large variation in the composition of the group-III Nitrides alloys typically require distinct deposition process specification to achieve high structural quality films. For example, Al-rich films of a given AlxGa1−xN alloy (x>0.5) require different process conditions compared to Ga-rich films (x<0.5) such as different constituent metal-to-active nitrogen ratios during deposition and different growth temperatures. Therefore, high quality multilayered thin film epitaxial structures comprising a plurality of widely varying AlGaN film compositions require a complex growth process and thus have an increased cost and potentially lower final structure production yield due to normal deposition process variability.

SUMMARY OF INVENTION

In one embodiment, a new method for tuning the electronic and optical property of a semiconductor used for an optically emissive device to achieve a predetermined optical state is provided. The desired optical state is specified as the emission wavelength and optical polarization. The method tunes the final optical and electrical properties of an optically emissive device using a post semiconductor layer formation process and is during the physical device formation steps. The method allows for the tuning of both the optical emission wavelength and the optical polarization emitted by the device using a post semiconductor deposition band structure tuning process.

In another embodiment, a new method to circumvent the limitations in the prior art for application to deep ultraviolet optically emissive device operating in the wavelength range of 190-250 nm using wide band gap semiconductors is provided. The wide band gap semiconductors can include compositions of group-III Nitrides such as binary AlN, binary GaN and binary InN and or ternary AlGaN, AlnN, and or quaternary AlGaInN. The wide band gap semiconductors can also include compositions of group-II metal Oxides such as MgZnO. The wide band gap semiconductors can also include compositions of boron-aluminium-nitride ($B_xAl_{1-x}N$).

In another embodiment, a post epitaxial semiconductor formation process is used to engineer a stressor region on at least a portion of the said semiconductor region to improve the local band structure characteristics defined by a region substantially bounded by said stressor. At least one of a desired optical property or a desired activated dopant concentration is achieved by introducing the post epitaxial stressor formed as described herein.

In another embodiment, a semiconductor homojunction or heterojunction is initially formed via a semiconductor formation process. The semiconductor is then formed into an optically emissive device comprising a plurality of physically subtractive and additive processes to achieve formation of electrical contacts and optical coupling layers. During the device formation process but after the epitaxial or semiconductor film formation, externally applied stressors are engineered advantageously to achieve a desired optical state during completed device operation.

In another embodiment, an ultraviolet light emitting diode is provided. The ultraviolet light emitting diode comprises an ultraviolet light emitting junction. The diode also comprises a first electrical contact coupled to a first side of the junction. The diode also comprises a second electrical contact coupled to a second side of the junction. The diode also comprises a region of set straining material that exerts a strain on the junction and alters both: (i) an optical polarization, and (ii) an emission wavelength of the junction. The region of set straining material lies outside a current path that includes the first electrical contact and the second electrical contact. The light emitting semiconductor junction device comprises a three-five alloy.

In another embodiment, a light emitting semiconductor junction device is provided. The light emitting semiconductor junction comprises a light emitting junction. The light emitting semiconductor junction also comprises a first electrical contact coupled to a first side of the junction. The light emitting semiconductor junction also comprises a second electrical contact coupled to a second side of the junction. The light emitting semiconductor junction also comprises a region of set straining material that exerts a strain on the junction and alters both: (i) an optical polarization, and (ii) an emission wavelength of the junction. The first electrical contact and the second electrical contact provide a current path to the light emitting junction independent of the region of set straining material. The region of set straining material covers a third side and a fourth side of the light emitting junction along a cross section of the light emitting junction. The light emitting semiconductor junction device comprises a three-five alloy.

In another embodiment, a light emitting semiconductor junction device comprises a light emitting junction. The light emitting semiconductor junction device also comprises a first electrical contact coupled to a first side of the junction. The light emitting semiconductor junction device also comprises a second electrical contact coupled to a second side of the junction. The light emitting semiconductor junction device also comprises a region of set straining material that exerts a strain on the junction and alters both: (i) an optical polarization, and (ii) an emission wavelength of the junction. The region of set straining material is not on a current path between said first electrical contact and said second electrical contact. The region of set straining material covers a third side and a fourth side of the light emitting junction along a cross section of the light emitting junction. The light emitting semiconductor junction device comprises a three-five alloy.

BRIEF DESCRIPTION OF THE DRAWINGS

FIG. 12A illustrates a portion of the atomic arrangement of a wurtzite crystal found in an oriented plane. The oriented plane represents the idealized c-plane of a wurtzite crystal.

FIG. 12B illustrates a portion of the atomic arrangement of a wurtzite crystal found in an oriented plane taken along the crystal growth axis. The diagram illustrates ideal epitaxial growth of dissimilar lattice constant wurtzite materials undergoing elastic deformation.

FIG. 24 illustrates a 3D implementation a cylindrical symmetry p-i-n diode comprising a wurtzite semiconductor. The device shows the position of the cylindrical stressor and the in-plane radial symmetric compressive stress applied to the p-i-n diode due to the stressor.

FIG. 27 illustrates a top view of an integrated light emitting device comprising a plurality of hexagonal p-i-n mesa diodes close-packed and electrically interconnected. Each p-i-n mesa has an in-plane stressor as shown in FIG. 26B.

FIG. 48 illustrates a 3D representation of p-i-n device subjected to two types of stressors. A first stressor is disposed on the topmost surface of the device. A second stressor is created by etching a trench in the semiconductor. An optional undercut etch beneath a portion of the active device is shown.

DETAILED DESCRIPTION OF THE EMBODIMENTS

Figure 1A:
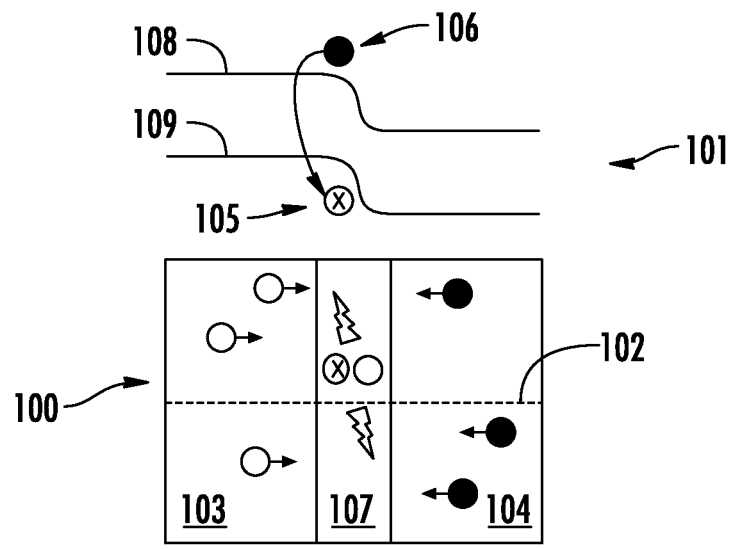
FIG. 1A illustrates a light emitting semiconductor structure that is found in the related art. The recombination of electrons and holes within a p-i-n diode is described.

Desired improvements over the conventional application of group-III nitride semiconductors to the epitaxial fabrication of LED and laser-diodes include: (i) lowering the production cost of the device; (ii) increasing the thin film formation and device yield to a target specification; (iii) increasing the crystalline epitaxial structure quality (i.e., having lower defect density); (iv) reducing problematic internal electric polarization fields generated in heterojunction devices; (v) increasing the extraction efficiency of light generated within the optical device; (vi) increasing the lifetime and reliability of device; and (vii) reducing dependence on crystal polarity variation.

The following disclosure includes a description of light emitting semiconductor junction devices that are optically tuned using an engineered strain inducing region that is formed across at least a portion of the device. The strain inducing region can be formed after the light emitting junction itself has been formed and made operable to generate light in response to an electronic stimulus. For example, the strain inducing region could be formed after the active semiconductor layers have been deposited upon a substrate and also after the electrical contacts have been formed for the light emitting junction. In yet another example, the strain inducing region could be formed after the active semiconductor layers have been deposited upon a substrate and integrated as part of the formation steps defining the electrical contacts.

The characteristics of light generated by a light emitting junction may be measured before the strain inducing region is formed. These characteristics could include the wavelength and the optical polarization of the light generated by the active semiconductor layers. This can readily be performed using a whole wafer mapping method such a non-contact or non-destructive characterization technique. For example, photoluminescence readily provides spatial and spectral mapping of semiconductor properties across an entire wafer area. Once the semiconductor properties are established, then a tailored set strain inducing region is engineered in order to alter the wavelength and polarity of the desired generated light. The strain inducing region is then initially set during the device fabrication process. The benefit of a set strain inducing region is that it can be formed using global wafer processing steps, and can therefore alter the characteristics of a large number of devices at the same time.

In general, non-uniformity in semiconductor material properties across a wafer area occurs in two forms. A first non-uniformity occurs on the atomistic scale with a length scale of angstroms to tens of nanometers. A second non-uniformity occurs on the length scale of millimeters to centimeters and has a gradual variation across the wafer surface. This second type of non-uniformity is of particular interest to post epitaxial semiconductor layer deposition, and results from temperature and deposition specie non-uniformities. An example of these larger scale gradual variations (such as ternary band gap energy) may result in radial variations out from the center of the wafer or a transition in a property from one side of a wafer to an opposite side (these trends are characteristic of particular deposition processes, namely, single wafer or multi-wafer processes). As such, a post epitaxial deposition corrective method for the non-uniformity is valuable for improving the whole on wafer device yield in view of the epitaxial film or semiconductor non-uniformity. The spatially engineered strain inducing regions can therefore be tailored to specific portions of the characterized semiconductor wafer having non-uniform property. The strain inducing step can be method of further additive or subtractive material or via implantation technique of foreign species.

Conversely, the post epitaxial strain inducing method provides an opportunity for attaining a desired optical and electronic property of a semiconductor that is not able to be formed by epitaxy alone. For example, high aluminium percent AlGaN semiconductor alloys used for deep ultraviolet device application require bandgap energies of 6.195 eV (200 nm) to 4.765 eV (260 nm). At these AlGaN compositions the electronic band structure produces optical emission that does not favor vertically emissive device operation but rather waveguide type. This is due to the valence band energy and symmetry type inherent to said alloy which determines the optical polarization state of the lowest energy band gap—and therefore dominates the optical properties. Therefore, to create vertically emissive devices from the aforementioned high aluminium percent (Al %) AlGaN alloy, it is possible to impose a post growth strain inducing region to alter the electronic properties of the semiconductor alloy band structure so that it does become responsive to vertically emissive behaviour. That is, post semiconductor growth strain inducing method can be used to tune the electronic band structure of said semiconductor.

Yet a further opportunity for post semiconductor deposition modification of the electronic band structure is for tuning the desired lowest energy bandgap and thus the optical emission energy of the final optically emissive device. In particular, group-III Nitrides are extremely susceptible to strain induced modification of the electronic band structure. Even more so are the high Al % AlGaN alloys, which are of particular interest to the examples described herein.

Yet a further aspect of the examples described herein is the ability to standardize the epitaxial semiconductor wafer structure so as to increase the uniformity (and thus yield) of the semiconductor properties for a given semiconductor formation process. This has the benefit of further reducing the active epitaxial or semiconductor wafer cost. Then using strain induced tuning of said active semiconductor via wafer scale processing, many different optically emissive wavelength and optical polarization type devices can be fabricated using a standardized wafer composition or structure.

For example, a bulk-like AlGaN alloy wafer can be formed as a p-i-n homojunction epitaxial structure. Thick film homogeneous composition AlGaN can be deposited to achieve extremely low levels of disadvantageous structural defects. This is due to reducing the limitations of lattice constant mismatch of dissimilar composition AlGaN materials. Then the formed active semiconductor layers comprising the delivered wafer can be processed using the teachings described herein to introduce strain inducing regions for the express purpose of tuning the semiconductor properties into a desired state.

Furthermore, each individual device could be individually tuned via an on wafer trimming procedure, using for example ion implantation through a spatially selective mask or via focused ion-beams. Conversely, devices can also be formed wherein the strain inducing region across a portion of an active semiconductor is dynamically alterable. For example, physical deflection or distortion of a semiconductor film in the form of a two dimensional membrane can also modify the optical and electronic property of the active semiconductor. For example, a p-i-n homojunction is formed into a device having a spatial portion that is a membrane. The membrane can be distorted in a plane parallel to the semiconductor film so as to laterally stretching the membrane or compressing the membrane in one or two dimension in said plane and thereby introduce biaxial or uniaxial strain. Alternatively, the membrane can be deflected in a direction that is normal to the plane of the semiconductor film resulting in a three dimensional strain inducing region. Furthermore, the membrane can be pre-stressed using a strain inducing region.

Portions of the following disclosure additionally describe a process for tuning the wavelength of light generated by a light emitting semiconductor junction using a strain inducing procedure that is disassociated from the selection of materials for the light emitting semiconductor junction. This strain is induced after the material for the junction has been selected, and the junction itself has been formed. In specific instances, the strain is induced through a global wafer processing step. The following disclosure also describes procedures for iteratively selecting the material for the junction and the degree of strain induced in the junction. In specific instances, the aforementioned disassociation of the selection of material and the induced strain facilitates these iterative procedures as they provide two degrees of freedom for selecting the polarization and wavelength of the generated light. Furthermore, instances where the strain is induced after the junction is formed facilitate these iterative procedures because the effect of the induced strain can be separately measured and applied to the next iteration of the procedure.

As described with reference to FIG. 1a, the material selected to form a light emitting semiconductor junction has a direct impact on both the polarization and wavelength of the generated light for a given device structure. Indeed, the band gap of the selected material is perhaps the most critical factor in determining the energy of the generated light. However, the introduction of strain to a light emitting semiconductor junction can also alter the wavelength of light generated by the junction. Introducing strain to a device will alter the crystal structure of the material and will therefore alter the band gap. As a result, related approaches have attempted to tune the light generated by a semiconductor junction by layering different composition semiconductor materials with variant crystal structures in order to tune the optical emission wavelength. The layered materials seek to minimize the induced internal strain as the dissimilar crystal structure films are sequentially deposited layer-by-layer on rigid substrate of fixed crystal structure. The deposited films, if different in composition to the substrate, can either stretch or compress in the plane of the layers in order to form atomic bonds and minimize crystalline defects such as misfit dislocations.

The crystal structure mismatch must be carefully managed and limited in layered dissimilar crystal structured stacks during formation; otherwise the epitaxial manufacturing process will have much lower yields caused by dislocation defects generated by this internal crystal structure mismatch strain. It is also generally more challenging to arbitrarily control the multiple compositions of heterogeneous junctions as compared to epitaxial growth of a single composition junction. This is particular important for group-III Nitride semiconductors wherein the composition control and layer thickness is challenging for application to high Al % group-III Nitrides applied to deep ultraviolet operation.

Figure 2:
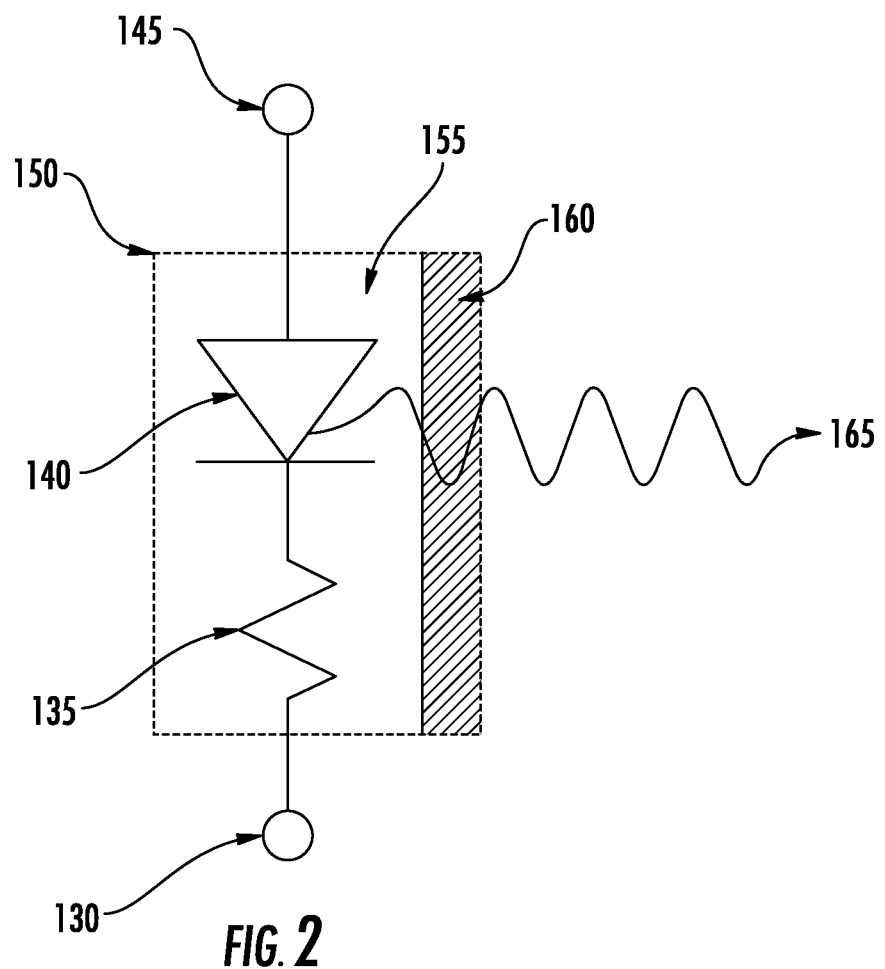
FIG. 2 illustrates a light emitting semiconductor structure that is found in the related art. The equivalent electrical circuit and basic optical function of a light emitting device is described.

Referring to FIG. 2, a light emitting device 150 operation is shown. Two electrical terminals 145 and 130 connect the electrical portion of the semiconductor hetero-junction or homo-junction 140. A preferred device 150 is a diode formed via p-n or p-i-n electrical conductivity regions. The external electrical terminals 145 and 130 typically form an internal resistance 135 due to non-ohmic behavior of the metal to semiconductor junctions. Light that is internally generated by the diode 140 is optically coupled through the semiconductor active region 155 and through an optical coupler 160 forming the out-coupled optical energy 165. The optical coupler 160 can be optical matching layer or layers made of transparent materials with a lower refractive index than the host semiconductor active region 155. Optical coupler 160 can also be a physically patterned structure such as a photonic band gap material, having the properties of minimizing the internal reflection losses of photons generated from within the region 155 so as to increase the out-coupled light power efficiency.

Fundamental to deep ultraviolet light emitting devices is the choice of semiconductor to achieve the desired wavelength of operation. A semiconductor electronic bandstructure and electrical conductivity can be intentional altered by three methods: (i) semiconductor composition; (ii) induced strain; and (iii) impurity type doping. The electronic band structure of a semiconductor can be altered by internal strain (typically due to hetero-epitaxy) and external strain (by the application of external stressor to the semiconductor). Wurtzite semiconductors form the most technologically mature materials for the formation of deep ultraviolet light emitting diodes. Wurtzite wide bandgap semiconductors such as the group-III Nitrides, have a particularly important property. The wurtzite band structure for high Al % group-III Nitride compositions is particularly sensitive to internal and external strains imposed upon the crystal. Fundamentally, single crystal structured wurtzite can be manipulated to obtain unique optical energy and optical polarization properties by careful choice of composition and strain. Unfortunately, the composition of a group-III Nitride semiconductor required for operation in the desirable optical wavelength range of 200-280 nm is limited for vertical emission structures.

Figure 3:
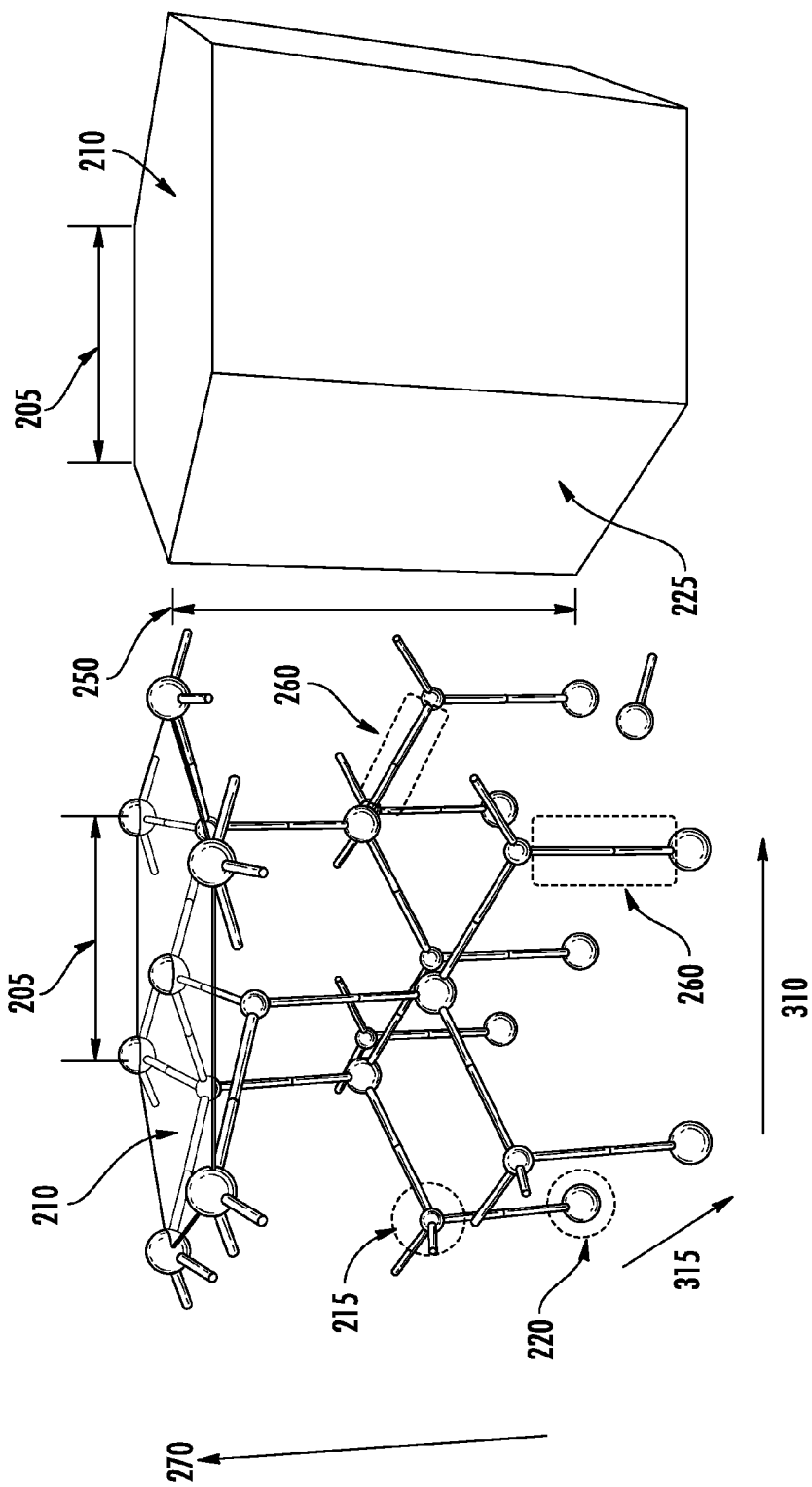
FIG. 3A illustrates an atomic crystal semiconductor structure that is found in the related art. An ideal unit cell of a wurtzite semiconductor crystal is described.
FIG. 3B illustrates a light emitting semiconductor structure that is found in the related art. The equivalent representation of the hexagonal wurtzite unit cell is shown.

FIG. 3A shows the wurtzite crystal atomic arrangement of atoms comprising a two atom species composition of the form of wz-AB. The two atomic species comprising the ionic crystal is formed for example, by anions of nitrogen and cations of a group-III metal. For example, the metal can be chosen from Al, Ga or In. Both the nitrogen 215 and metal 220 atoms form polar bonds 260 as shown in FIG. 3A. The fundamental repeating unit of interest herein is the unit cell represented by the atomic structure of FIG. 3A. The wurtzite arrangement of group-III Nitride results in a hexagonal symmetry of the unit cell which can be represented by the simpler geometry shown in FIG. 3B. That is, let the detailed atomic arrangement of the unit cell in FIG. 3A be represented by the hexagonal column of FIG. 3B. It is found empirically that the wurtzite crystal structure can be epitaxially deposited layer-by-layer with high crystalline perfection by growth along a direction 270. This enables the alternating stacking sequence of A-B-A-B- . . . , and so on, along the crystal growth direction 270 for the formation of the wurtzite crystal. The unit cell represented by FIGS. 3A and 3B shows the so called c-plane face hexagon 210 having equal side of length 205 separating the cations 220 (for example Al atoms on the c-plane). The vertical height along the growth direction 270 for the fundamental unit cell is given by the length 250. For example, the bulk wurtzite AlN crystal can now be fully specified by a crystal structure having dimension 205 given by 3.112 angstroms and dimension 250 given by 4.982 angstroms (at room temperature and no external or internal strain).

Figure 4:
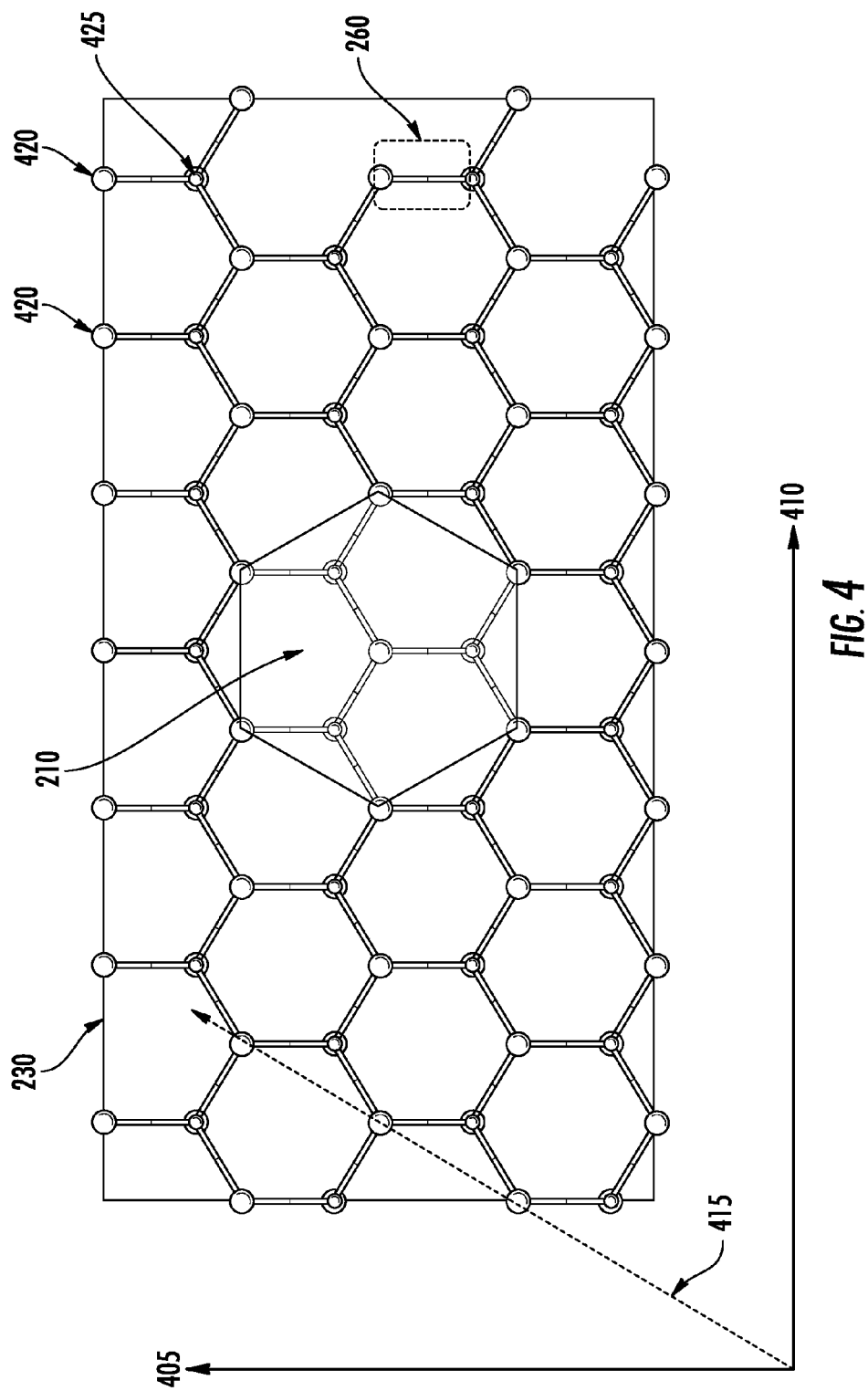
FIG. 4 illustrates a wurtzite c-plane atomic arrangement of a wurtzite semiconductor structure that is found in the related art.
Figure 5:
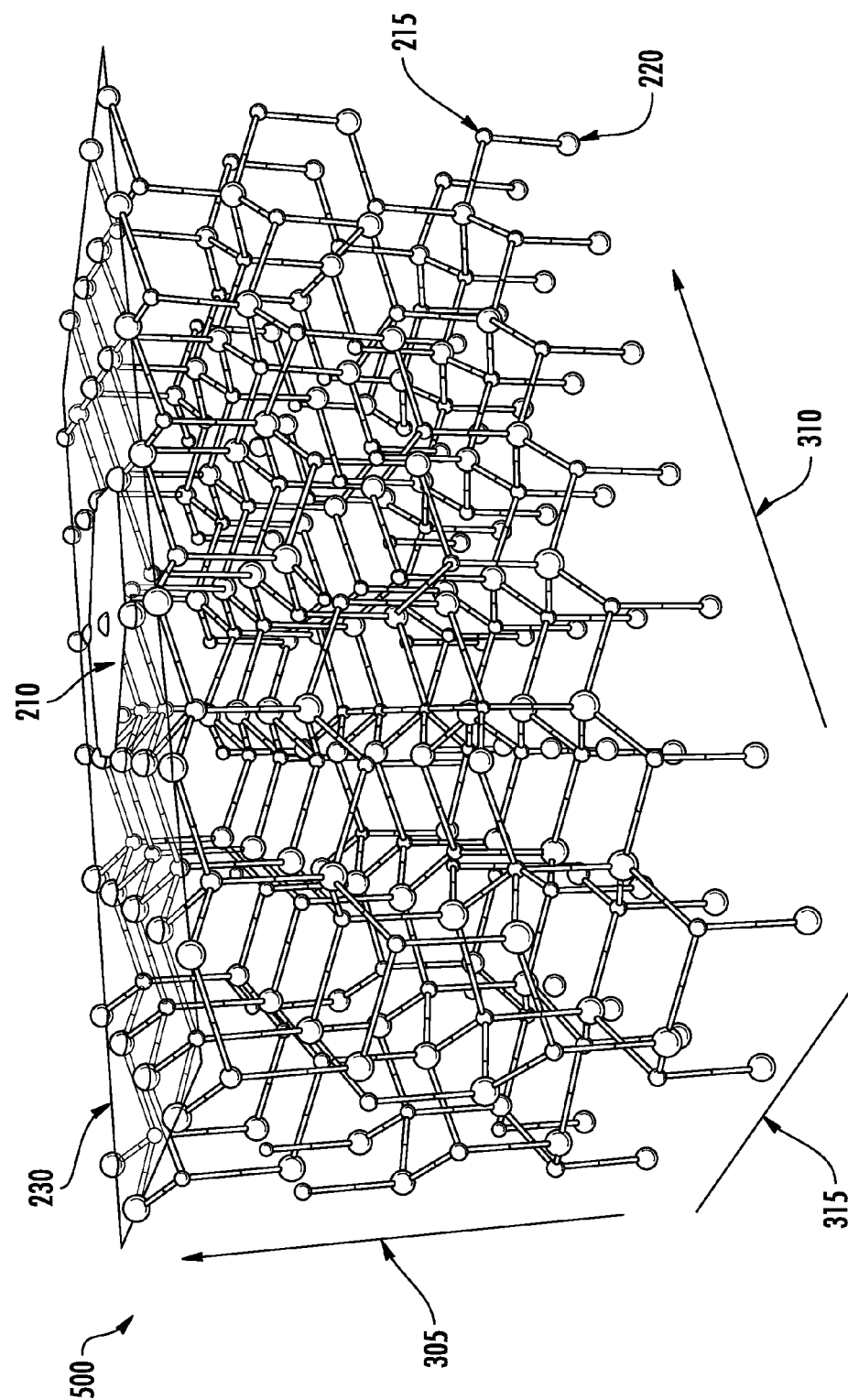
FIG. 5 illustrates a 3D wurtzite atomic arrangement of a wurtzite semiconductor structure. A calculated finite 3D slab of oriented wurtzite material is disclosed. The slab is shown oriented along a high symmetry crystal growth direction.

An idealized epitaxial layer of single crystal structured wurtzite semiconductor, such as AlGaN, is formed simultaneously as a sheet of interconnected and adjacent unit cells 500 in FIG. 5. As shown in FIG. 4, top view c-plane surface 230 comprising close packed wurtzite unit cells 210. The metal atoms 420 are shown on the topmost plane and the next layer below comprises nitrogen atoms 425 (small black spheres). In the plane of the layer there exist three high symmetry crystal directions, shown as 405, 410 and 415. There also exist higher order symmetry directions within the wurtzite crystal. The high 3-fold rotation symmetry of atoms within the c-plane directly determines the electronic band structure of wurtzite crystal.

FIG. 5 shows a perspective drawing of calculated atomic positions of AlN. The interconnected atoms for Al and N are illustrated to show the nitrogen polar bond formed along the c-axis 305 by the N 215 and Al 220 atoms. The c-plane surface 230 comprising a plurality of hexagonal unit cell faces 210 that can be defined by the crystal axes 315 and 310. FIG. 5 represents a three dimensional slab of wurtzite material oriented along a growth direction 305. The lateral extent of the crystal along directions 315 and 310 is substantially determined by the available substrate surface area. The vertical extent of the crystal along direction 305 is determined by the growth rate and time of deposition for a particular deposition process. Using optimized growth conditions for the wurtzite crystal, the anions and cations comprising the wurtzite semiconductor are self-assembled layer-by-layer into the idealized crystal shown in FIGS. 2, 3, 4 and 5. Non-ideal crystal formations occur due to atomic bond misfit dislocations, layer stacking faults and the like. Such non-ideal occurrences can be tolerated within the crystal structure without detracting from the fundamental electronic band structure property sought by the idealized structure. However, if the crystal imperfections begin to dominate the idealized picture, then the electronic band structure will deleteriously suffer and the utility of semiconductor material will diminish. Many of the approaches described herein alleviate this problem because misfit dislocations are mitigated and electronic performance is modified by a post growth stressor method.

Understanding the unique properties of single crystal wurtzite semiconductor structure enables description of another process that can applied in combination with approaches described herein. The formation of specific conductivity type regions occurs by substitutional doping of metal sites within the wurtzite crystal and is achieved in simplest form by co-deposition of impurity atoms simultaneously during the film formation process. However, other methods are possible, such as impurity sheet doping and ion implantation technique.

Figure 6:
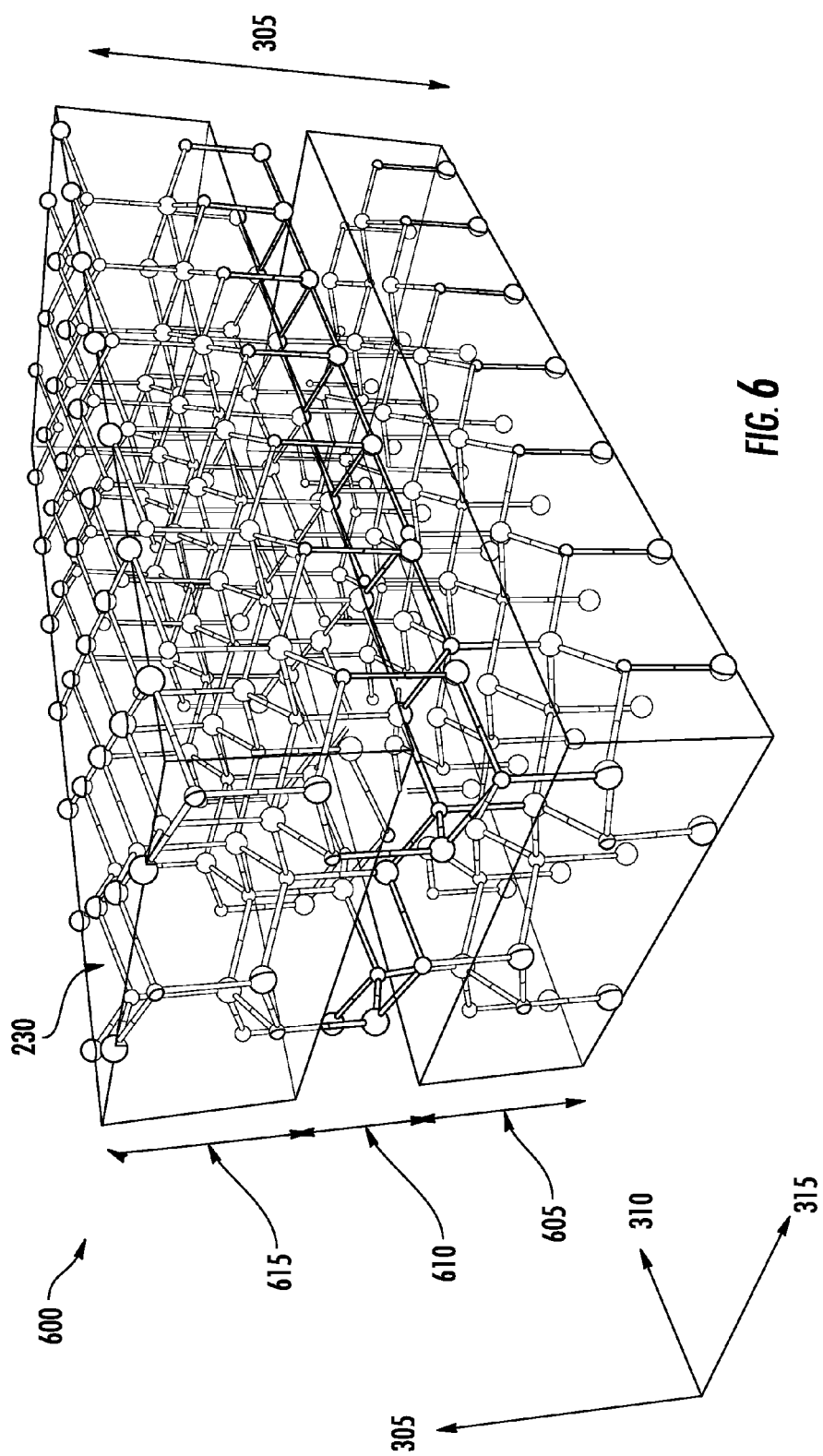
FIG. 6 illustrates an oriented 3D wurtzite crystal slab with atomic arrangement of Nitrogen-polar bonds along the growth axis. The electrical doped layer regions form an oriented wurtzite vertical p-i-n diode.

FIG. 6 shows a 3D wurtzite slab grown along a direction 305 forming so-called c-plane 230 oriented films. The structure of FIG. 6 comprises three distinct layered regions labelled as layers 605, 610 and 615. An n-type layer 605, a not intentionally doped (NID) or intrinsic layer 610 and a p-type 615 layer are shown forming the layered p-i-n device formed using a single wurtzite semiconductor host composition. It is understood that impurity atoms randomly populate a portion of the respective doped layer metal sites forming an activated doping concentration. The device 600 forms a vertical p-i-n homojunction.

Figure 7:
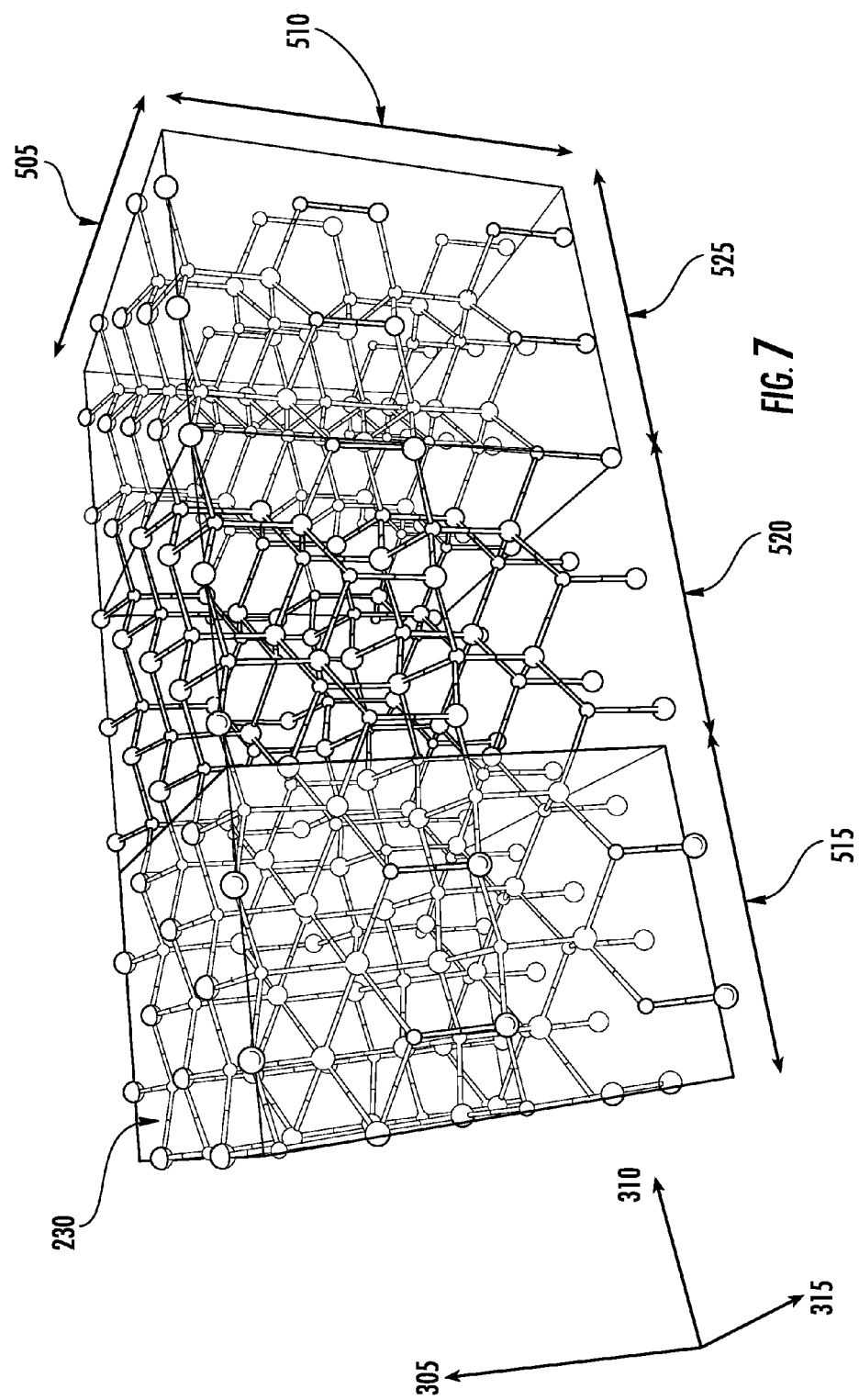
FIG. 7 illustrates an oriented 3D wurtzite crystal slab with atomic arrangement of Nitrogen-polar bonds along the growth axis. The electrical doped regions form an oriented wurtzite lateral p-i-n diode.
Figure 8:
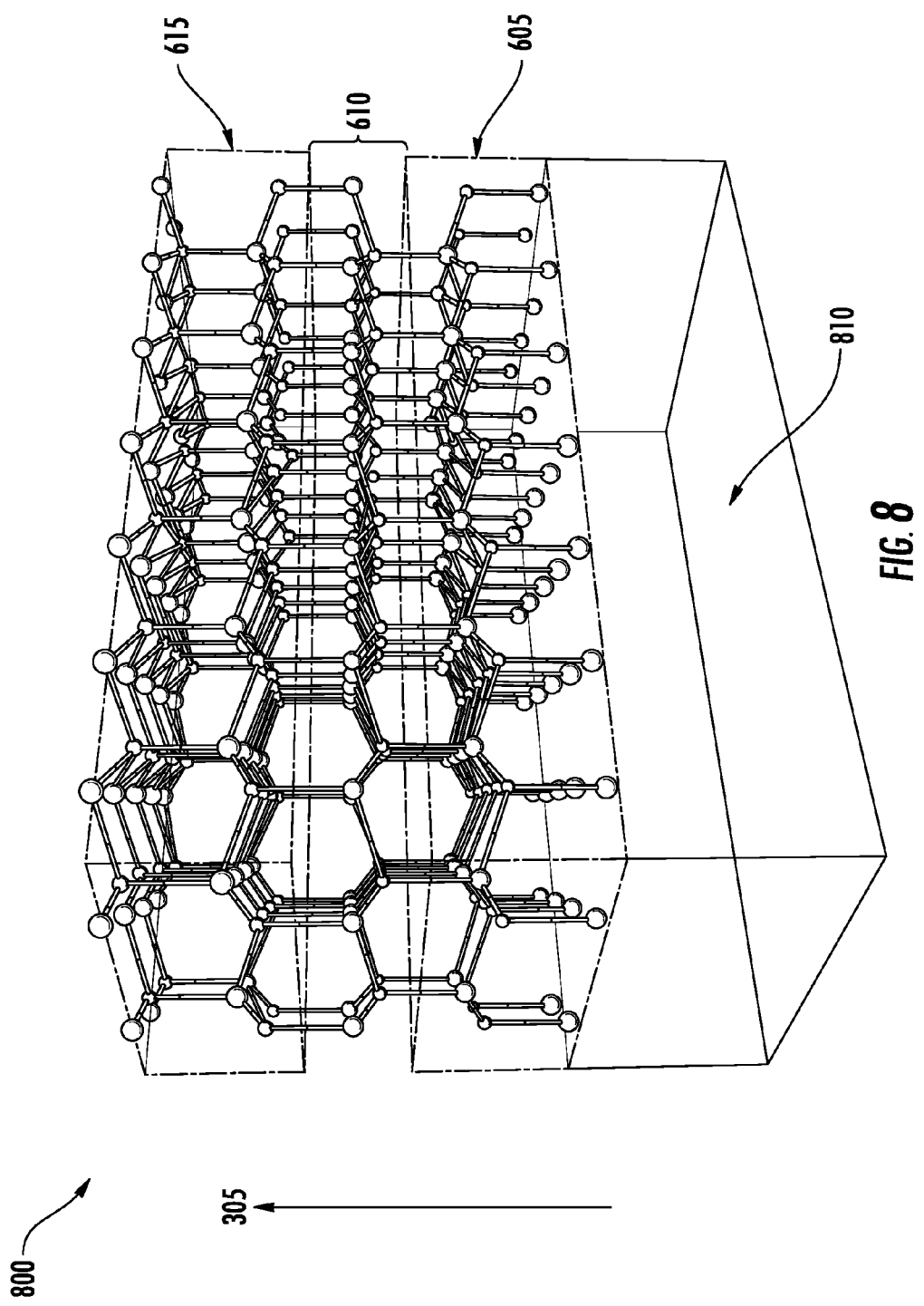
FIG. 8 illustrates a representation of an oriented wurtzite vertical p-i-n structure disposed upon a substrate.
Figure 9:
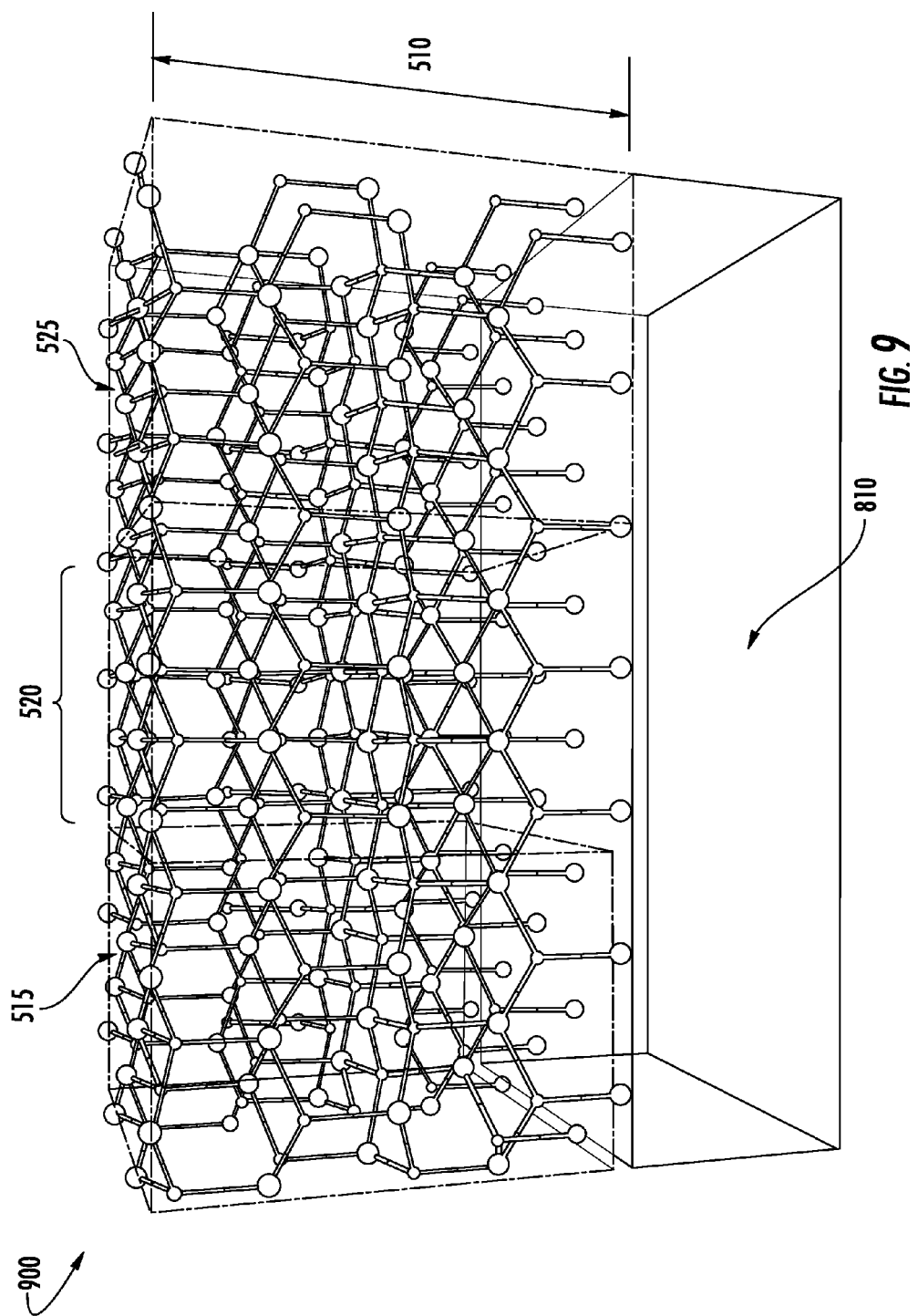
FIG. 9 illustrates a representation of an oriented wurtzite lateral p-i-n structure disposed upon a substrate.

Alternately, a slab of wurtzitic material can be formed into a lateral p-i-n homojunction by diffusion, impurity ion implantation or wafer bonding to form the device 700 shown in FIG. 7. An n-type region 515 laterally connects an intrinsic or NID region 520 to a p-type region 525. The epitaxial thickness 510 and device width 505 are now defined post epitaxial growth of the wurtzite semiconductor. FIGS. 8 and 9 show the vertical p-i-n homojunction 800 and lateral p-i-n homojunction 900 formed along a crystal growth direction 305 and on a substrate 810.

Figure 10:
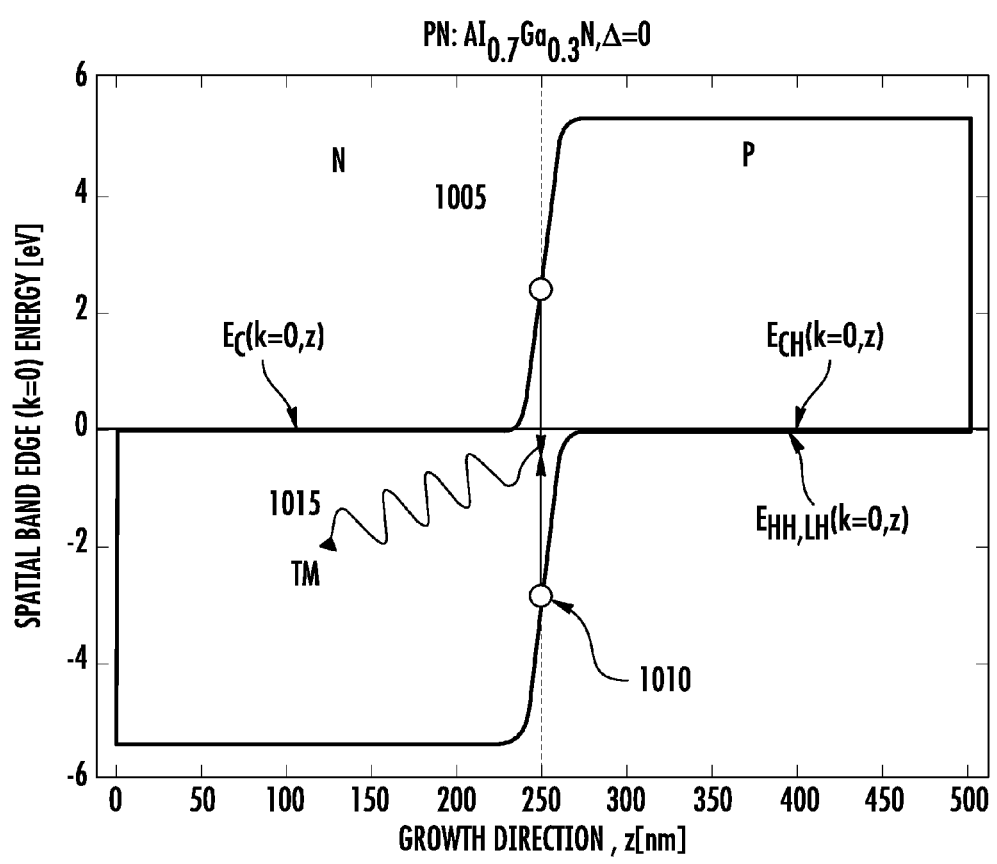
FIG. 10 illustrates the calculated spatial band structure of a group-III Nitride p-n junction.
Figure 11:
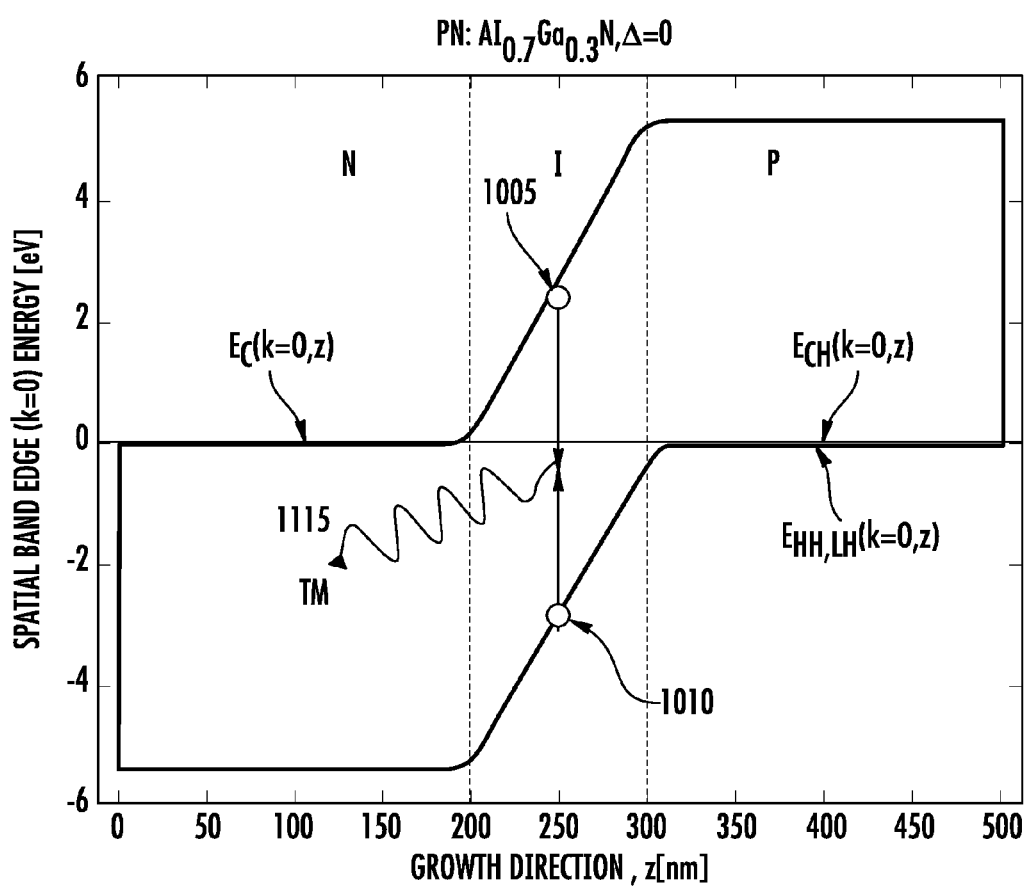
FIG. 11 illustrates the calculated spatial band structure of a group-III Nitride p-i-n junction.

Electrical device structures implemented in a wurtzite semiconductor are now discussed. FIGS. 10 and 11 disclose the p-n and p-i-n homojunctions, respectively formed using group-III Nitride material. Specifically, a group-III Nitride semiconductor composition of x=0.7 (i.e., 70% Al) $Al_xGa_{1-x}N$ ternary alloy is selected to highlight the unique electronic band structure issues facing light emitting diode operation in the deep ultraviolet wavelength regime. FIGS. 10 and 11 disclose the calculated spatial band structures of the diodes showing the variation in conduction band edge energy $E_C(k=0,z)$ and the three zone center valence bands labeled as the crystal-field split (CH) band $E_{CH}(k=0,z)$, the heavy-hole band $E_{HH}(k=0,z)$ and the light-hole band $E_{LH}(k=0,z)$.

Referring to FIG. 8, the layered p-i-n diode that is formed along the c-axis 305 is parallel to the growth direction, z labelled in FIGS. 10 and 11. The valence band labels reflect the energy-momentum dispersion properties and have a distinct symmetry type that is directly tied to the optical polarization processes that occur. Electrons 1005 are injected from the n-type region, and holes 1010 are injected from the p-type region. Recombination of an electron and hole within a direct band gap semiconductor is represented as pure vertical transitions with respect to the spatial band structures shown. A photon 1015 and 1115 are generated by electronic recombination of an electron and a hole annihilating to form a new particle being the photon. As the growth direction is along the c-axis of the wurtzite crystal 305, the layers are formed upon the c-plane 230 of crystal and the energy ordering of the valence bands $E_{CH}$, $E_{HH}$ and $E_{LH}$ are as shown in the band diagrams of FIGS. 10 and 11. The $k=0$ representation of the band structure energy-momentum dispersion is sufficient to describe the optical processes with the devices of FIGS. 10 and 11. The highest lying valence band in x=0.7 (i.e., 70% Al) $Al_xGa_{1-x}N$ ternary alloy without any strain is the CH band. As such, photons can couple to the electronic transition between the conduction band and the CH band efficiently with optical polarization substantially perpendicular to the growth direction, z. This mode of operation is ideal for waveguide type structure wherein the light propagates substantially parallel to the plane of the layer (labelled as transverse magnetic polarization TM), however, it is disadvantageous for vertical type emitters (i.e., light propagating parallel to growth direction or substantially perpendicular to the plane of the layers).

Strain can be used to engineer the optical properties of wurtzite semiconductors for utility as light emitting devices. A method to introduce strain in wurtzite semiconductors is via the method depositing lattice mismatched semiconductors to form heterojunctions. By changing the semiconductor composition of group-III Nitride alloy, the band structure can be selected. A fundamental limitation, discussed previously, for the heteroepitaxial growth of layered semiconductors is that of managing the misfit strain energy and avoiding deleterious crystalline dislocations. The critical layer thickness for group-III Nitride semiconductors places a limit of 1-100 monolayers of material which can be epitaxially deposited under elastic deformation (i.e., achieving dislocation free interfaces) for in-plane strains of the order of 0.1 to 1%. This limitation in thickness of material renders optical structures impractical or deficient in optical thickness and thus limited devices performance and efficiency.

The epitaxial growth of different semiconductor compositions to form a heterojunction can be explained with reference to FIGS. 12A and 12B. Consider a top view of the c-plane oriented film comprising a ternary semiconductor of AlGaN as shown in FIG. 12A. The c-plane 230 shows a metal terminated surface comprising Al and Ga atoms forming the ternary AlGaN wurtzite crystal structure. The crystal direction 1210 is similar to the direction 415 of FIG. 4. FIGS. 12A and 12B further show labelled Al metal atoms 1220 and 1230 and Ga metal atoms 1225 and 1235. FIG. 12B shows the vertical crystal structure along the growth direction 305 with the uppermost c-plane 230. The upper c-plane metal atoms are labelled showing the orientation of direction 1210 in FIG. 12A.

Referring to FIG. 12B again, a representation of the heterostructure formed by an $Al_{0.5}Ga_{0.5}N$ layer 1250 deposited elastically on an AlN layer 1270 is shown. It is understood that many more monolayers along the growth direction 305 can occur, but only one monolayer of each is shown for clarity.

The principle of elastic deformation of lattice mismatched wurtzite materials is disclosed in FIGS. 12A and 12B by understanding that the $Al_{0.5}Ga_{0.5}N$ alloy has unstrained unit cell crystal dimensions which are larger than the underlying AlN layer. That is, the dimension 205 of FIG. 3A is larger for $Al_{0.5}Ga_{0.5}N$ compared to AlN. Therefore, in order for the $Al_{0.5}Ga_{0.5}N$ epilayer to form a dislocation free interface 1260 on the AlN surface, there needs to be a contraction of the $Al_{0.5}Ga_{0.5}N$ unit cell parameter 205. Within the elastic deformation regime, the unit cell volume is conserved and therefore the $Al_{0.5}Ga_{0.5}N$ unit cell deformed laterally to accommodate the in-plane lattice constant mismatch at 1260 and compensates by elongating the unit cell parameter 250. The ability of the $Al_{0.5}Ga_{0.5}N$ layer to elastically deform in this manner is limited by the thickness 1250 of alloy deposited. Beyond the CLT of $Al_{0.5}Ga_{0.5}N$ deposited on AlN, the strain energy at the interface 1260 exceeds the competing energy to form a dislocation (missing bonds at the interface 1260). Looking again at FIG. 12A at the top view of the $Al_{0.5}Ga_{0.5}N$ c-plane 230, it is evident that hexagonal unit cells parameters 205 are matched for both the $Al_{0.5}Ga_{0.5}N$ and AlN material. This uniform lateral contraction of the unit cell parameter 205 occurs in all directions within the plane of the layer and is called tri-axial strain (refer to the in-plane high symmetry directions 405, 410 and 415 of FIG. 4). That is, a preferred direction within the plane of the layers can not be manipulated in preference to the other in-plane directions for the explicit purpose of introducing a preferred direction of strain.

Figure 13B:
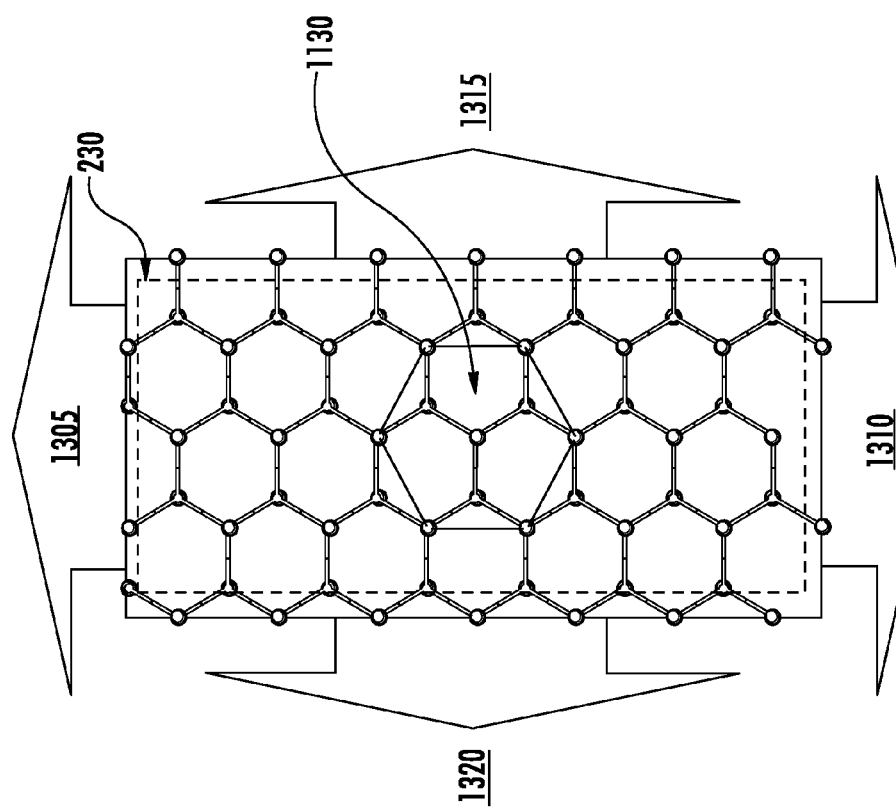
FIG. 13B illustrates tensile bi-axial in-plane forces upon an oriented wurtzite film during lattice mismatched epitaxy on a larger lattice constant wurtzite surface. The atomic arrangement is depicted specifically in the c-plane.
Figure 13A:
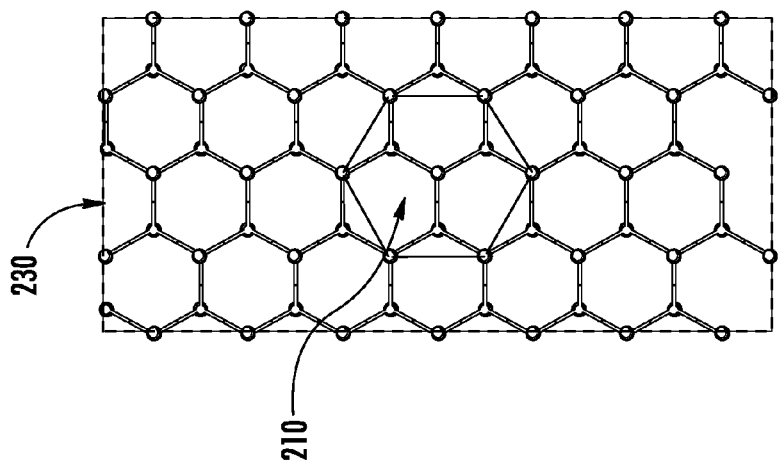
FIG. 13A illustrates an oriented wurtzite film that is used as the starting surface for lattice mismatched epitaxy by a larger lattice constant wurtzite surface. The atomic arrangement is depicted specifically in the c-plane.

Conversely, tensile tri-axial in-plane strain can be introduced in a lattice mismatched wurtzite film as shown in FIGS. 13A and 13B. FIG. 13A shows the c-plane 230 of a wurtzite semiconductor, for example AlN, with the unit cell 210 identified. If the wurtzite film is then stretched equally by tensile in-plane forces 1305, 1310, 1315 and 1320 within the plane, as shown by FIG. 13B and as would occur by epitaxial deposition onto a larger underlying lattice constant material, then the unit cell would symmetrically increase in size to 1330. This is the only elastic deformation process that can occur with high crystal quality growth for the epitaxial deposition of mismatched lattice constant wurtzite alloys.

Figure 14B:
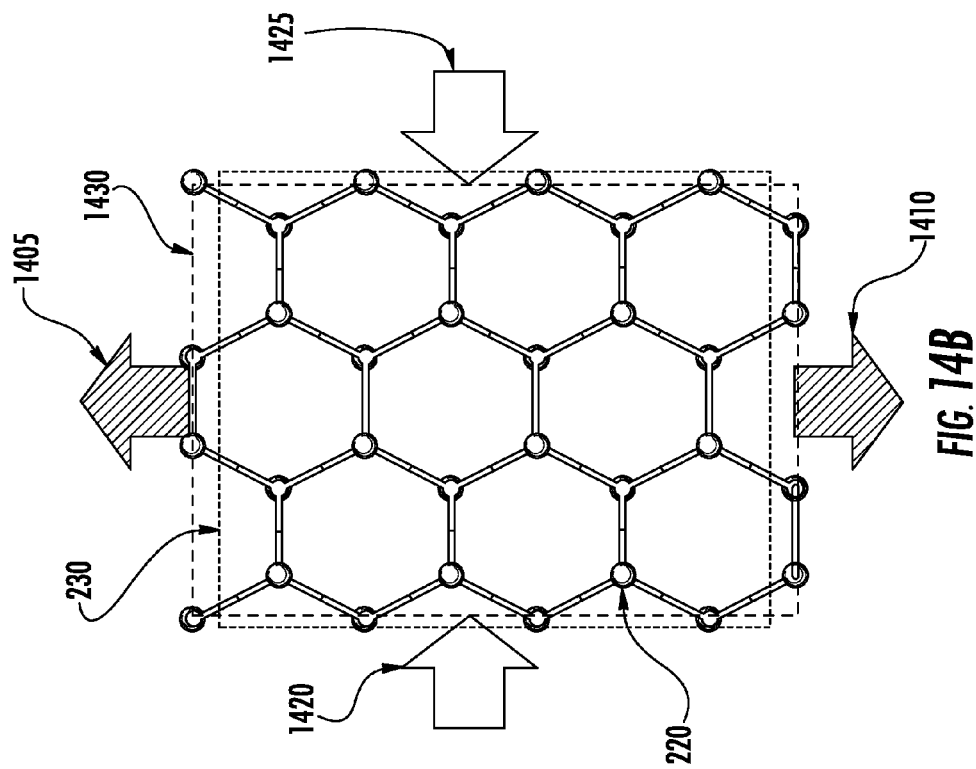
FIG. 14B illustrates the c-plane oriented wurtzite structure of FIG. 14A under the influence of a uni-axial stressor.
Figure 14A:
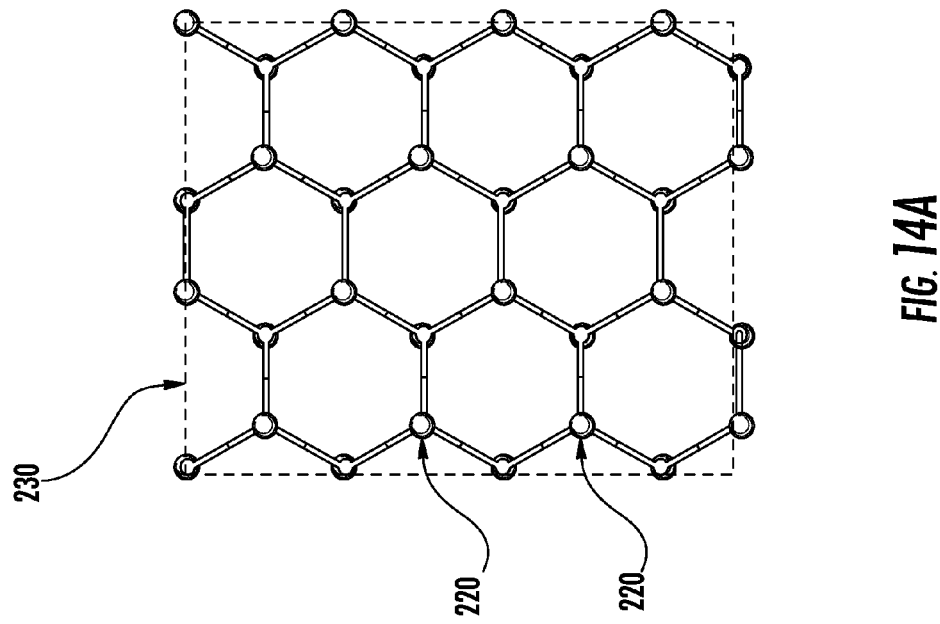
FIG. 14A illustrates the c-plane atomic arrangement a wurztite semiconductor. A metal terminated surface is shown.

There are suitable methods for introducing so called uniaxial strain to the wurtzite crystal as shown in FIGS. 14A and 14B. Again, a top view of a c-plane oriented film 230 is shown with topmost metal terminations 220 in FIG. 14A. FIG. 14B shows a uniaxial compressive stress applied in the plane of the layer along directions 1420 and 1425. The wurtzite crystal responds within the elastic deformation regime by elongating along the in-plane crystal directions 1405 and 1410 such that it encompasses region 1430 of c-plane 230.

Figure 15:
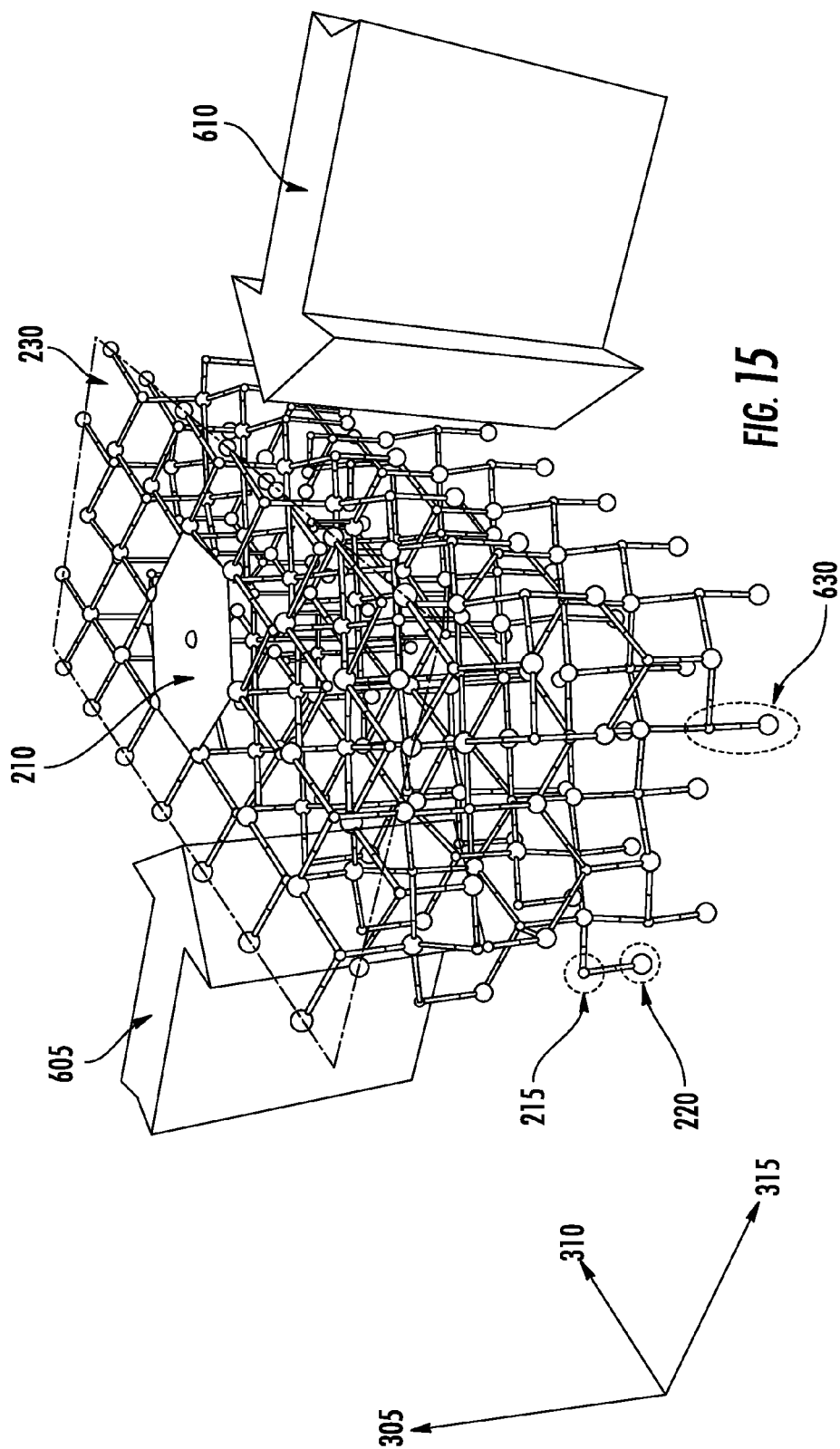
FIG. 15 illustrates the orientation of a uniaxial stressor applied to a specific crystal direction of a 3D wurtzite crystal slab. The uniaxial stressor is applied perpendicular to the growth axis.

FIG. 15 shows the 3D representation of a portion of the c-plane oriented 230 wurtzite crystal structure having uniaxial stress applied along the preferred crystal axis 315 to achieve a compressive in-plane strain. The uniaxial stressors 605 and 610 provide equal and opposite directional strain to the wurtzite crystal slab. One or more uniaxial stressors can be supplied to the wurtzite crystal and can be along arbitrary directions. In preference, uniaxial, bi-axial and tri-axial stressors are claimed herein which can be directed across an active region comprising a wurtzite semiconductor. Another approach involves at least one in-plane stressor disposed across a portion of a wurtzite semiconductor and substantially perpendicular to the c-axis of the wurtzite crystal. Another approach involves at least one in-plane stressor disposed across a portion of a wurtzite semiconductor and substantially parallel to the c-axis of the wurtzite crystal. Another approach involves at least one in-plane stressor disposed across a portion of a wurtzite semiconductor directing a strain field that has components parallel and perpendicular to the c-axis of the wurtzite crystal.

Figure 16:
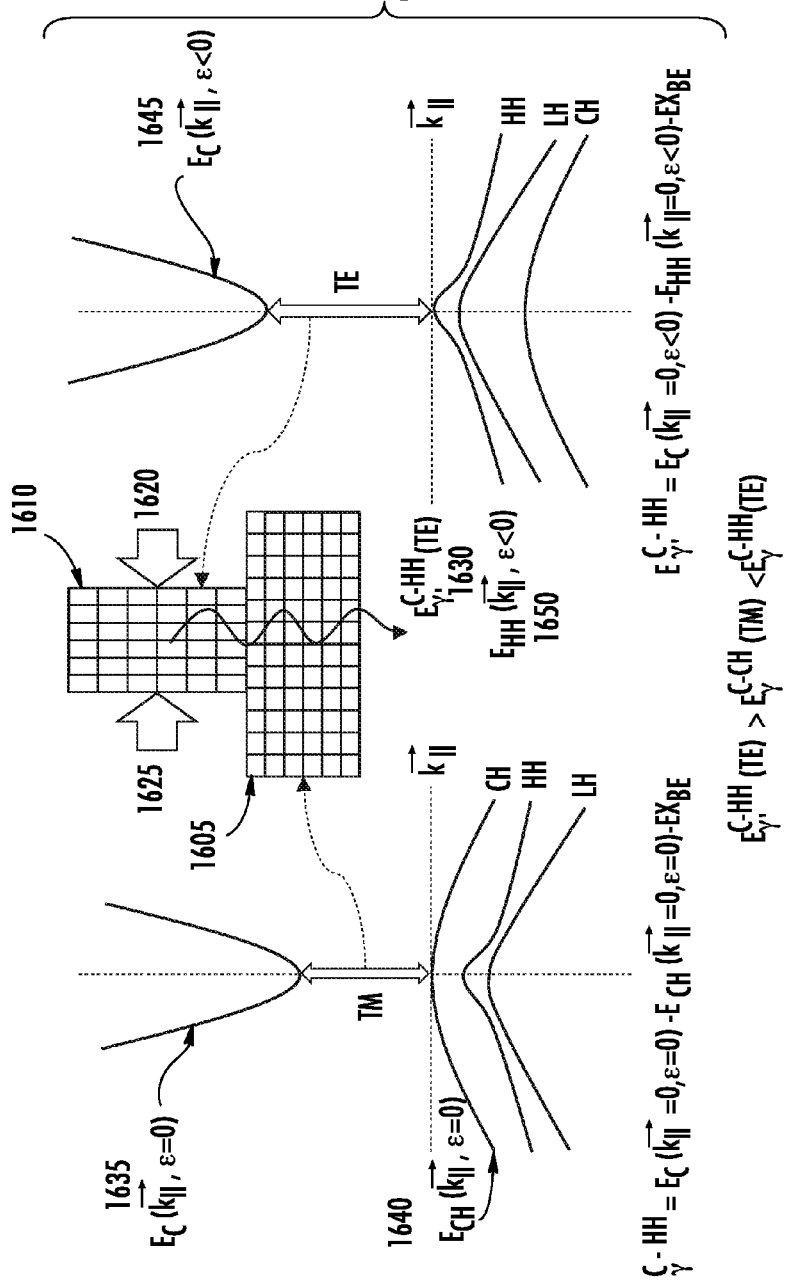
FIG. 16A illustrates a representation of a strain-free energy-momentum band diagram of a wurtzite semiconductor. The band diagram further represents an example high Al % group-III Nitride compound with valence band ordering as shown.
FIG. 16B illustrates a strained energy-momentum band diagram of a wurtzite semiconductor. The band diagram further represents an example high Al % group-III Nitride compound with valence band ordering as shown subjected to a large in-plane compressive stress.

FIGS. 16A and 16B show the effect of strain on the wurtzite band structure for the case of compressive uniaxial, bi-axial or tri-axial strain. FIG. 16A shows the energy-momentum band structure of a direct bandgap and high Al % group-III Nitride semiconductor having the valence band ordering as shown. The CH band 1640 is the highest lying valence band and thus optical processes are dominated by electron-hole transitions between the conduction band 1635 minimum and the CH band 1640 maximum, which are coincident at $\underline{k}=0$. Necessarily, symmetry arguments dictate that the dominant optical polarization of the $E\gamma^{C-CH}$ transition will be of TM type relative to the c-axis of the wurtzite crystal.

The energy of the photon $E\gamma^{C-CH}$ that couples to the material 1605 will be further reduced from the energy gap at $\underline{k}=0$ by the exciton energy $EX_{BE}$. For example, consider the lower portion 1605 of the device having no externally applied stressor ($\epsilon=0$) and composed of $Al_{0.7}Ga_{0.3}N$. If the same alloy is then spatially strained such that an upper portion 1610 is subjected to uniaxial compressive stress as shown, then the energy-momentum band structure is modified as in FIG. 16B. If sufficient in-plane strain is applied across material 1610 then the band structure can be transformed so as to reverse the energy order of the valence band and result in the heavy-hole and light-hole being above that of the CH band. Symmetry again dictates that the material 1610 becomes optically active to TE polarization coupling between the conduction band 1645 and the highest lying HH band 1650 at $\underline{k}$=0. Therefore, the simultaneous effect of spatially modifying the bandstructure of material 1610 via compressive in-plane stressor $\epsilon$<0 produces an increase in the fundamental optical transition energy $E\gamma^{C-HH}(\epsilon<0)$ relative to the strain free material below, and a change in the coupling of optical polarization to the energy bands. If region 1610 is generating photons 1630 with TE mode $E\gamma^{C-HH}(\epsilon<0)$, for example using a p-i-n or p-n diode configuration, then they can not efficiently couple to TM absorption within the lower potion 1605 semiconductor. This is particularly advantageous for optical extraction efficiency of light from a device and is claimed herein.

Figure 17:
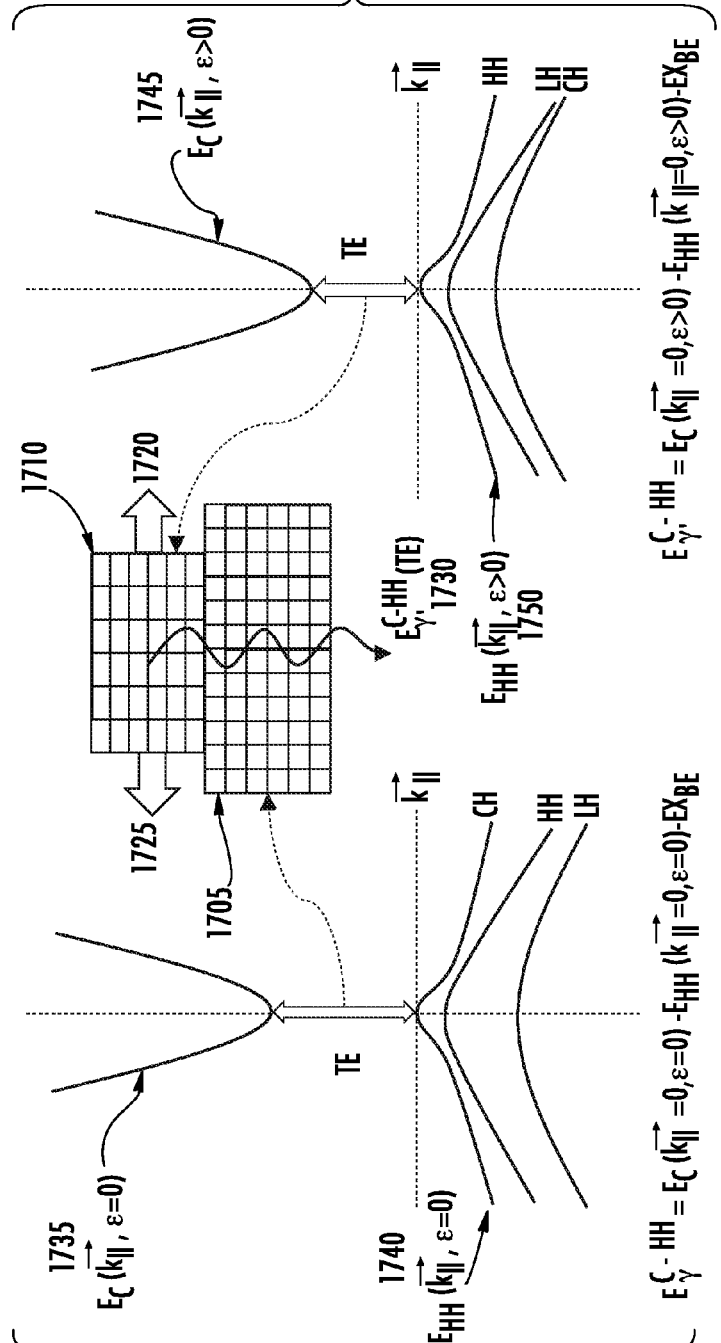
FIG. 17A illustrates a representation of a strain-free energy-momentum band diagram of a wurtzite semiconductor. The band diagram further represents an example group-III Nitride compound with valence band ordering as shown.
FIG. 17B illustrates a strained energy-momentum band diagram of a wurtzite semiconductor. The band diagram further represents an example group-III Nitride compound with valence band ordering as shown subjected to a large in-plane tensile stress.

Yet another example of how the band structure can be transformed is disclosed in FIG. 17. Consider again a wurtzite material 1705 that is configured with strain-free energy-momentum dispersion bandstructure as shown in FIG. 17A. The optical activity is dominated by the $\underline{k}$=0 energy transition between the conduction band 1735 and the highest lying HH band 1740 having TE-like energy $E\gamma^{C-HH}$ ($\epsilon$=0). Application of, for example, uniaxial tensile strain via stressors 1720 and 1725 to a region 1710 will reduce the effective bandgap to $E\gamma^{C-HH}(\epsilon>0)$. Which will alter the bands to 1745 and 1750 respectively. Therefore, a photon 1730 generated within active region 1710 can escape through the lower region 1705 by virtue of having a smaller photon energy that is not absorbed in material 1705.

Figure 18:
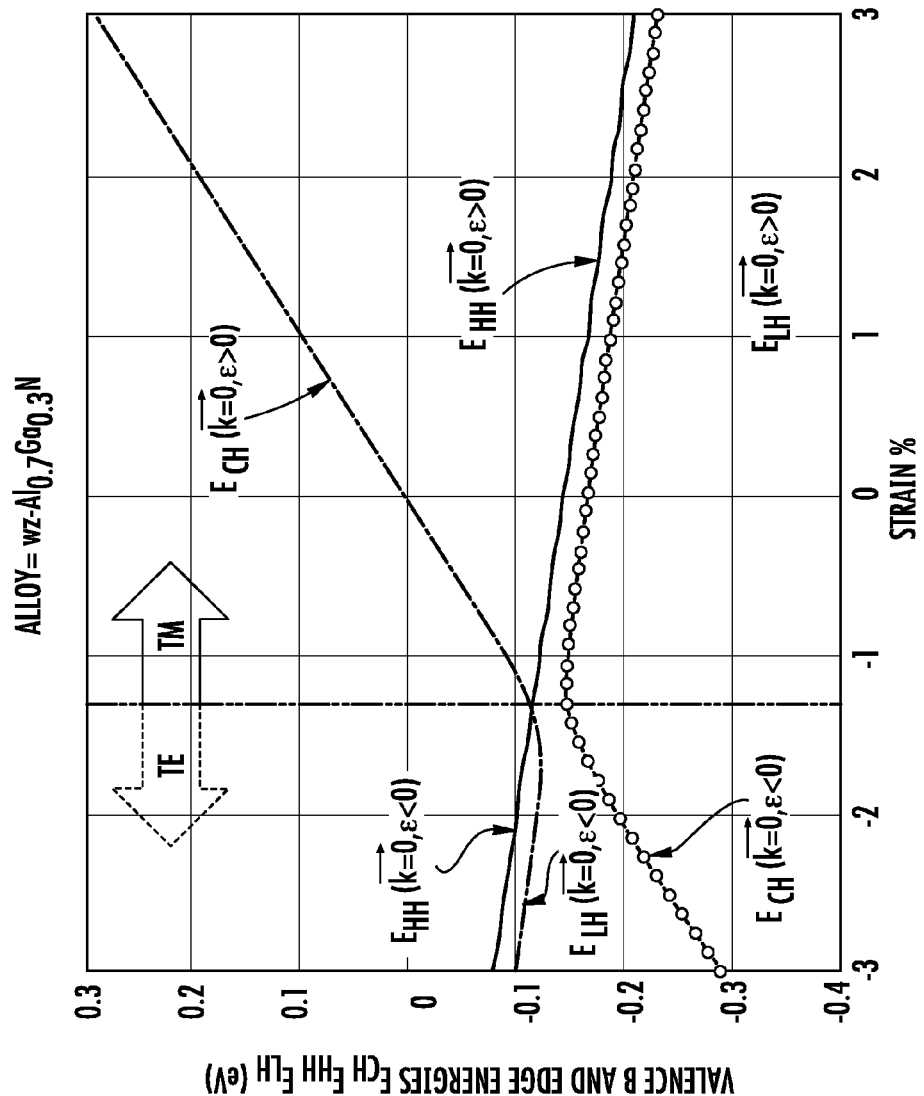
FIG. 18 illustrates the calculated valence band energy and ordering variation under various in-plane strain conditions for the case of a high Al % group-III Nitride wurtzite semiconductor. The optical polarization property of the lowest energy valence band is indicated as TE or TM.
Figure 19:
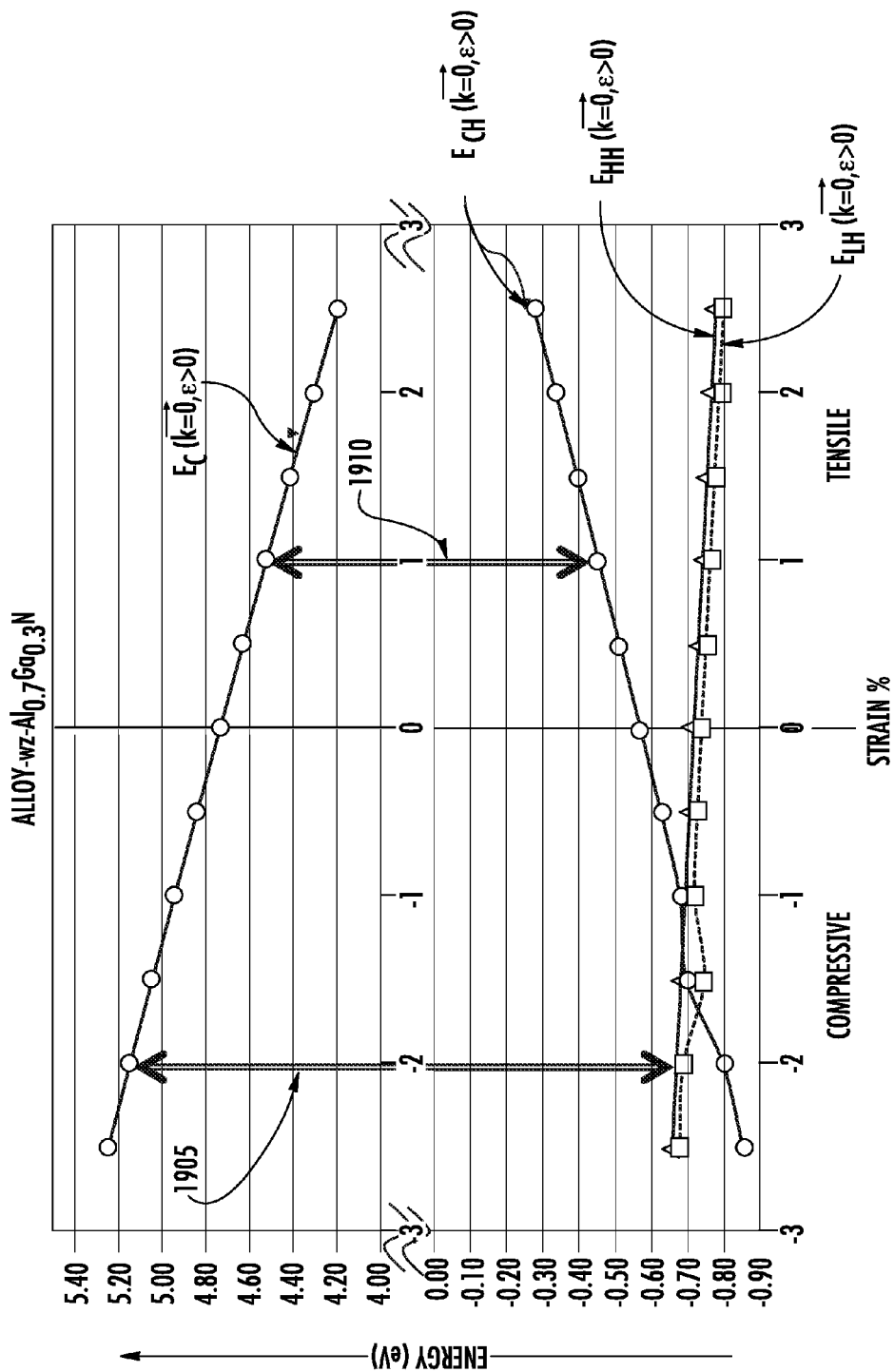
FIG. 19 illustrates the calculated energy band structure comprising the conduction band and the three high symmetry valence bands of a wurtzite semiconductor under the influence of various in-plane strains.

Group-III Nitride alloys are of particular interest. FIG. 18 shows yet one more example of how the unique band structure of the wurtzite crystal symmetry semiconductors are controlled by the approaches described herein. FIG. 18 shows the valence band energy at the center of the Brilliouin zone (k=0) of the CH, HH and LH bands as a function of uniaxial, biaxial or tri-axial strain applied perpendicular to the c-axis (305). For the AlGaN alloy composition having x=70% $Al_{0.7}Ga_{0.3}N$, which is of high utility for deep UV light emitting diodes, the bandstructure is dominated by the valence band energy ordering. Clearly, the application of in-plane stress to the AlGaN material results is a dramatic transformation in both fundamental band gap and the optical polarization properties. For in-plane compressive strain exceeding $\epsilon \leq -1.25\%$ the TM-like material transforms into TE-like behavior. The fundamental bandgap (i.e., the lowest energy photon that can be emitted or absorbed) is then determined by the energy transition from the conduction band minimum and the valence band maximum. As both the valence band maximum and conduction band minimum are directly affected by the in-plane strain, the optical gap varies as shown in FIG. 19. Clearly, compressive in-plane strain results in an increase in the fundamental optical transition 1905, whereas in-plane tensile strain results in a reduction of the fundamental gap 1910 relative to the zero strain bulk case ($\epsilon$=0). The implications for these trends are summarized by the selected alloys disclosed in FIG. 20.

Figure 20:
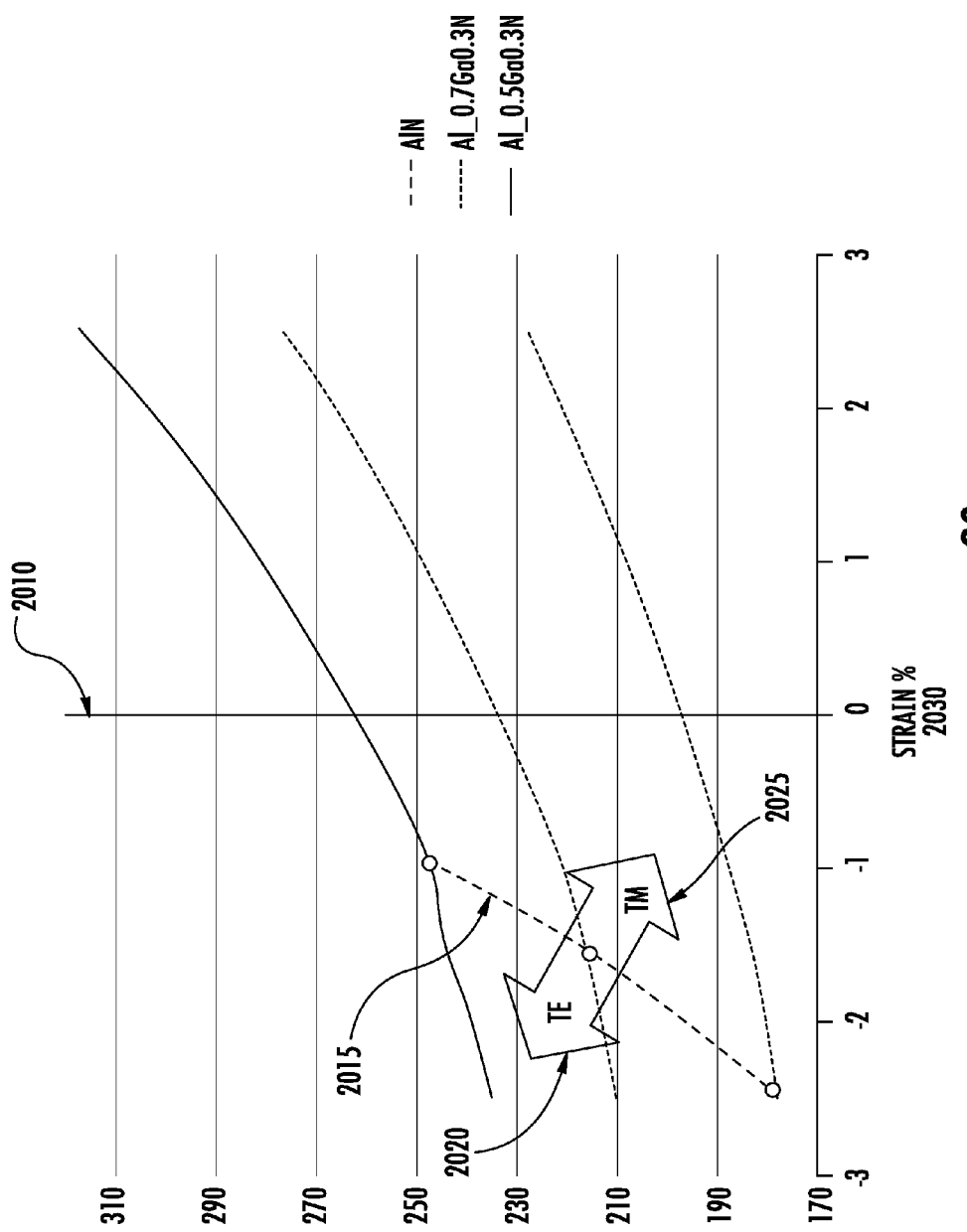
FIG. 20 illustrates the variation in the fundamental energy band gap of three representative group-III Nitride compounds under the condition of in-plane strain. The transition from optical polarizations of TM to TE is indicated.

FIG. 20 discloses the optical properties of group-III Nitride materials as a function composition and applied external in-plane stressors. Three representative $Al_xGa_{1-x}N$ materials subjected to in-plane stress for cases of x=1.0, 0.7 and 0.5 are calculated using a full 8×8 k.p Hamiltonian assuming symmetric in-plane stressors. The vertical axis 2010 of FIG. 20 represents the fundamental band gap in units of wavelength (nm) as a function of the in-plane strain %. The in-plane strain 2030 is defined as the ratio of the in-plane lattice constant $a_e$ dilation or expansion relative to the strain-free in-plane lattice constant $a_0$ case, strain %=100×$(a_e-a_0)/a_0$, whereas $\epsilon=(a_e-a_0)/a_0$. The dotted line 2015 shows the crossover from TE 2020 into TM 2025 and vice versa as a function of in-plane strain for each AlGaN composition. The higher Al % compounds requires a larger in-plane compressive stress ($\epsilon$<0) to achieve TE optical polarization behavior. Using the trends of FIG. 20, a device can be engineered for a desired optical specification of emission wavelength and optical polarization performance by selecting the material composition and the stress state.

Figure 21A:
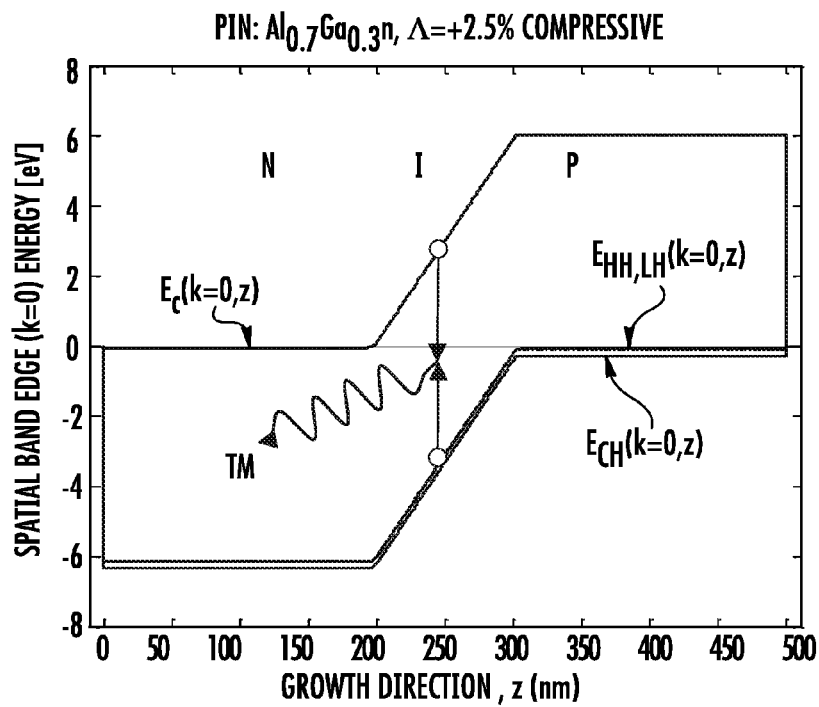
FIG. 21A illustrates the spatial energy band structure of a high Al % wurtzite AlGaN homojunction p-i-n diode subjected to a large in-plane compressive uniaxial stressor.
Figure 21B:
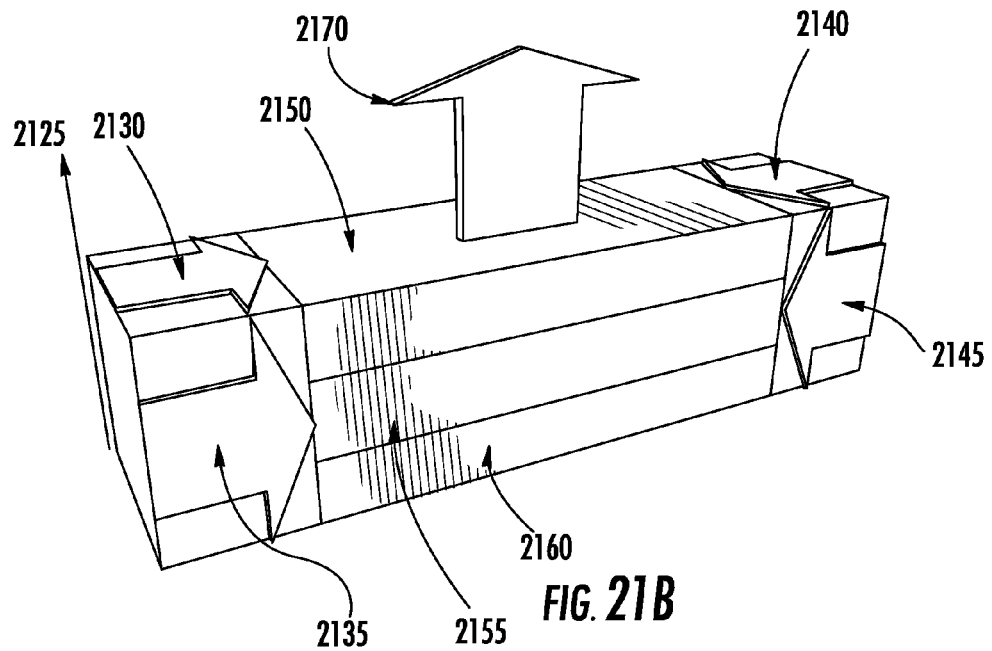
FIG. 21B illustrates the 3D representation a homojunction p-i-n diode subjected to a large in-plane compressive uniaxial stressor oriented with respect to a crystal axis.

Implementing a predetermined stress state enables a homojunction and heterojunction device to operate optimally for a given device configuration. For example, consider the layered p-i-n homojunction devices disclosed in FIGS. 21A and 21B for the case of compressive in-plane uniaxial stress and FIGS. 22A and 22B for the case of tensile in-plane uniaxial stressor. The spatial $\underline{k}$=0 band structures for the p-i-n homojunction diode composed of $Al_{0.7}Ga_{0.3}N$ are shown in FIG. 21A for compressive $\epsilon$=−2.5% and FIG. 22A for tensile $\epsilon$=+2.5% uniaxial stress applied perpendicular to the c-axis 305 and along the <10-1-1> wurtzite axis. Referring to the strain free p-i-n of FIG. 10, it is apparent by the teaching herein that the valence band order is reversed to provide TE-mode optical coupling as the highest lying valence band is transformed from the CH band to the HH band by the application of uniaxial compressive stress. FIG. 21B depicts the uniaxial compressive stressors 2130, 2135, 2140 and 2145 applied perpendicular to the growth direction 2125. The compressive stress is uniformly applied to the contact planes defining the device formed by epitaxial layers of p-type 2150, i-type 2155 and n-type 2160 material. The layers are assumed to be formed upon a c-plane according to the approaches described herein. The fundamental or lowest energy optical emission 2170 is then set to occur preferentially along the growth direction 2125.

Figure 22A:
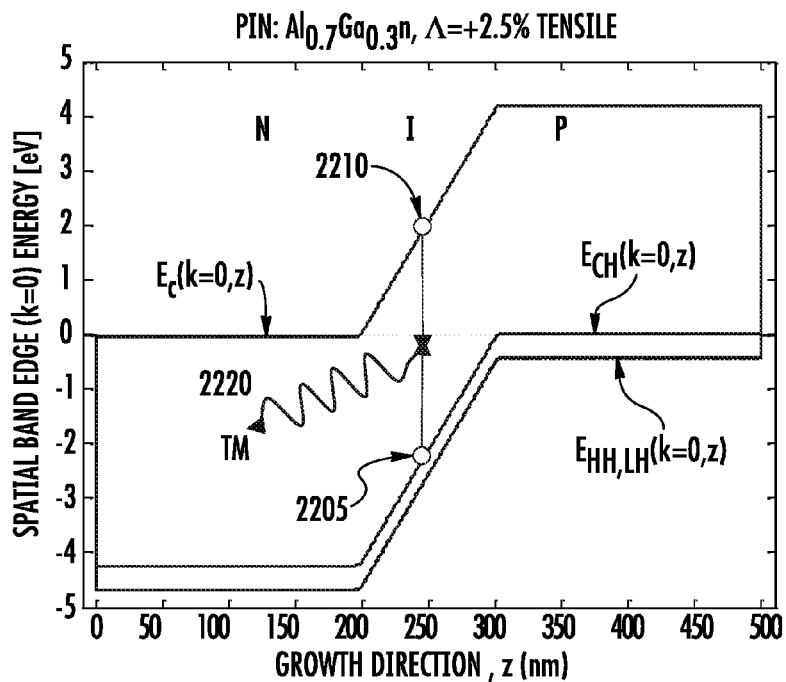
FIG. 22A illustrates the spatial energy band structure of a high Al % wurtzite AlGaN homojunction p-i-n diode subjected to a large in-plane tensile uniaxial stressor.
Figure 22B:
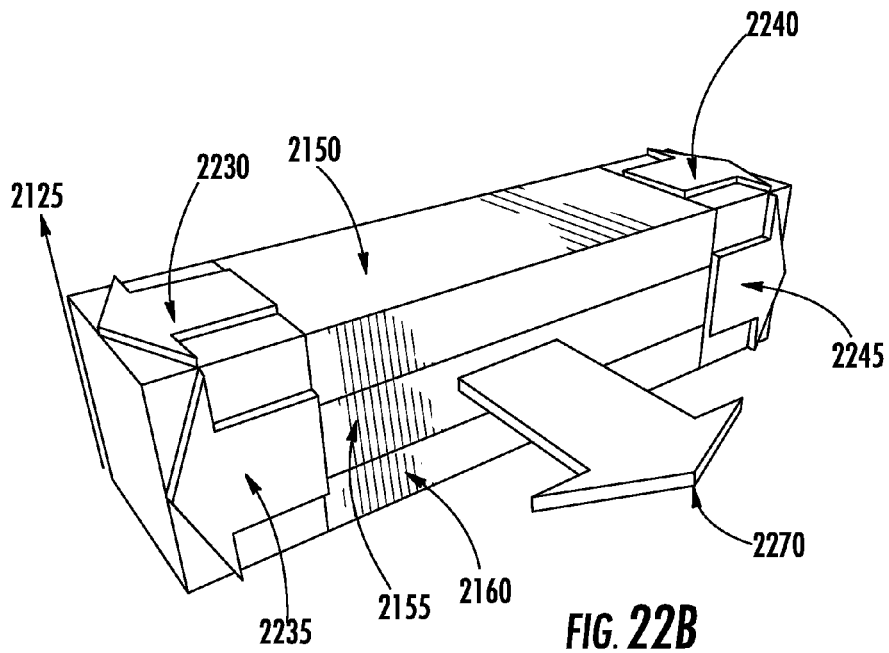
FIG. 22B illustrates the 3D representation a homojunction p-i-n diode subjected to a large in-plane tensile uniaxial stressor oriented with respect to a crystal axis.

Conversely, FIG. 22A shows the band structure for tensile uniaxial stress across the p-i-n $Al_{0.7}Ga_{0.3}N$ homojunction diode. The stress is again assumed to be applied along <10-1-1> wurtzite axis. Tensile stress exacerbates the energy ordering above the strain free case and moves the CH band to a lower energy position through the structure causing the fundamental transition to remain TM-like. FIG. 22B shows the in-plane uniaxial stressors 2230, 2235, 2240, and 2245 applied perpendicular to the c-axis growth direction 2125 pulling uniaxially the p-i-n $Al_{0.7}Ga_{0.3}N$ homojunction diode along the <10-1-1> wurtzite axis. The optical emission of the lowest energy photons 2220 will be TM-like and tend to be emitted in the direction described by vector 2270.

Having described fully the methods for introducing modification of wurtzite optical and electronic properties through the action of at least one stressor, certain preferred devices will now be described, but the approaches disclosed herein are not limited to these specific examples disclosed. There are distinct types of external stressors which can be implemented using the conventional and new fabrication techniques disclosed herein. Certain approaches described herein utilize in-plane stressors applied to wurtzite materials that are directed preferentially along at least one in-plane crystal axis.

Figure 23A:
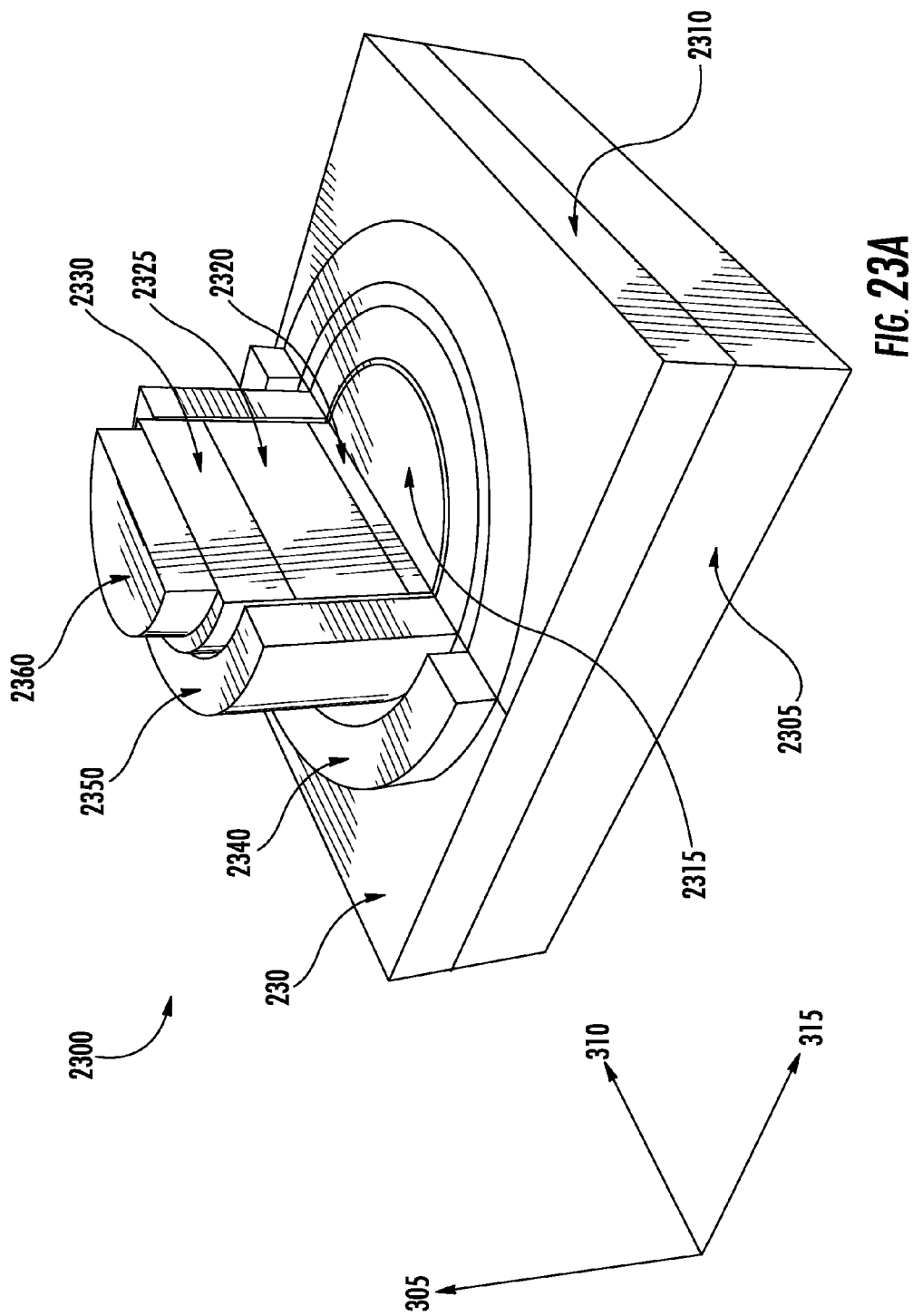
FIG. 23A illustrates a 3D implementation a cylindrical symmetry p-i-n diode comprising a wurtzite semiconductor. The cutaway view shows the interior of the device and position of the cylindrical stressor.
Figure 23B:
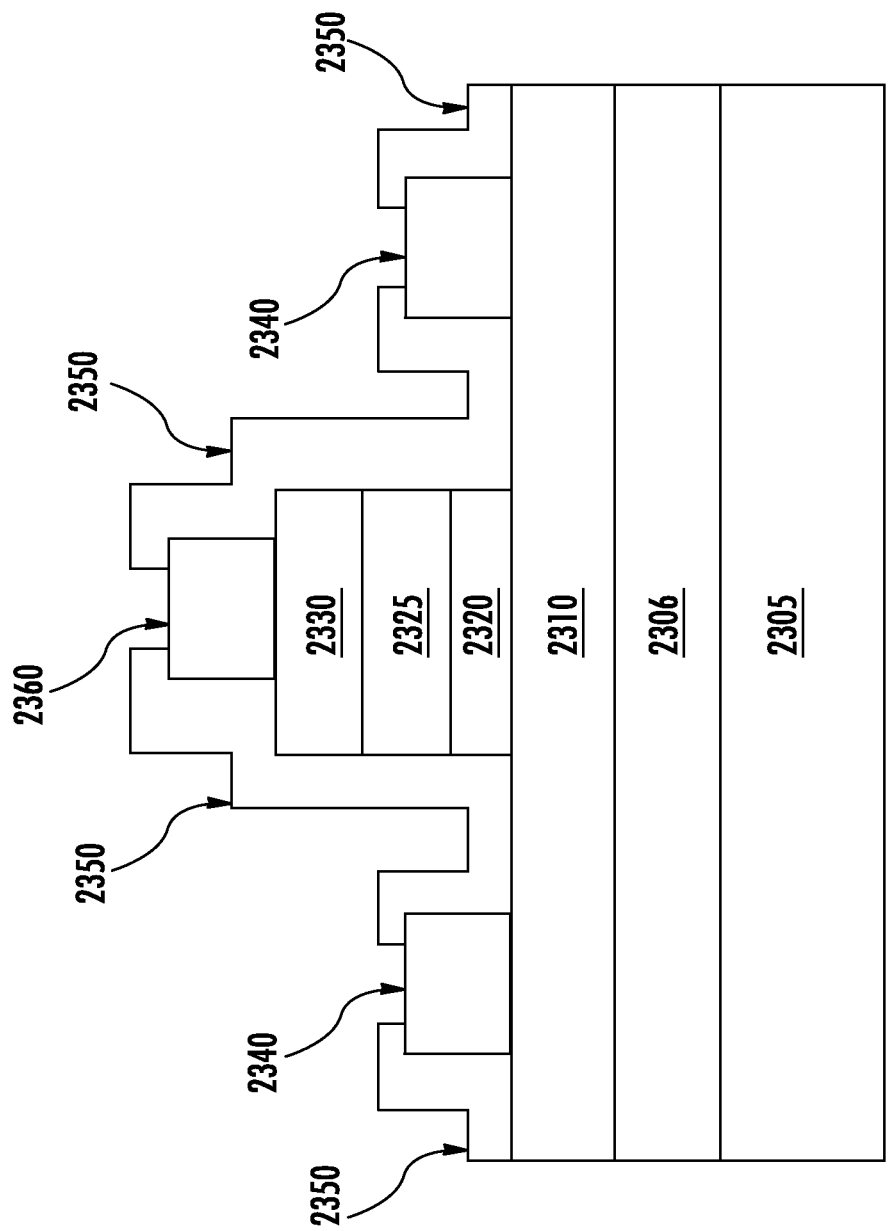
FIG. 23B illustrates a 2D cross-section of implementation a cylindrical symmetry p-i-n diode comprising a wurtzite semiconductor. The cross-sectional view shows the interior of the device and position of the cylindrical stressor.
Figure 23C:
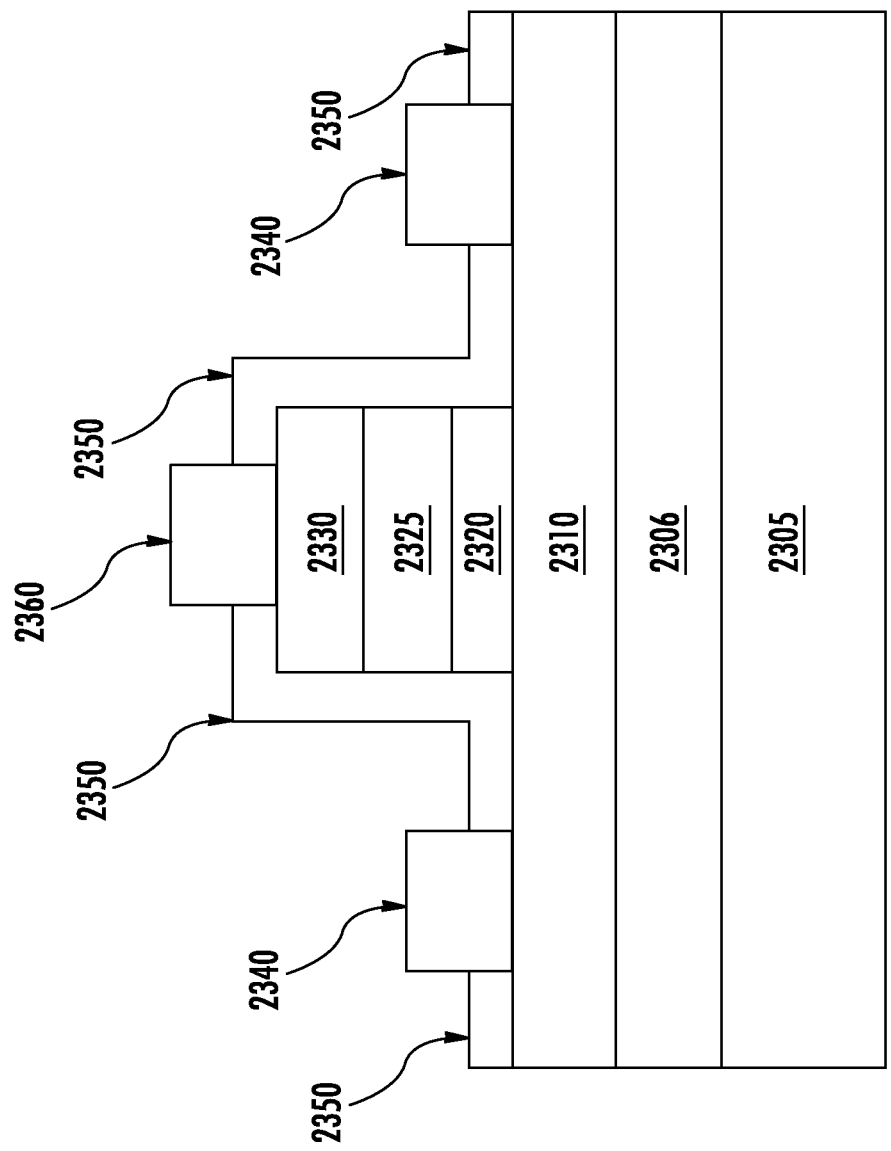
FIG. 23C illustrates a 2D cross-section of implementation a cylindrical symmetry p-i-n diode comprising a wurtzite semiconductor. The cross-sectional view shows the interior of the device and position of the cylindrical stressor.

A symmetrical in-plane stressor is disclosed in FIGS. 23A, 23B, 23C, 24 and 25 showing cylindrical symmetry. FIGS. 23A-C show a cross-sectional 3D view of p-i-n homojunction diode deposited or formed on a substrate 2305. The p-i-n diode comprises n-type layer 2310 that has a portion formed 2315 and 2320 into the active region of the diode. An optional NID region 2325 separates a p-type layer 2330. The p-i-n layered structure is preferentially formed first followed by a patterning step to form the cylindrical diode structure. Metallic and or ohmic contact 2340 is formed on n-type region 2310 and upper metallic and ohmic contact 2360 is formed on a portion of the p-type material that is etched 2330. A cylindrical stressor 2350 is spatially formed by deposition or attachment onto the sidewalls of the p-i-n diode. The stressor can be deposited conformably or via a process which results in substantially uniform material that has a large intrinsic stress. The stressor can also be composed of a material dissimilar to the diode homojunction material and have a large dissimilarity in thermal expansion coefficient. For example, sapphire, aluminum oxide, silicon nitride, silicon oxide, diamond, diamond-like carbon and others are possible. The stressor may also be composed of a multilayered sequence comprising an insulating material separating another highly stressed material from the p-i-n sidewall. For example $Al_2O_3$ can be used as an insulative material separating a highly stressed conductive or metallic material, such as tungsten.

Figure 25:
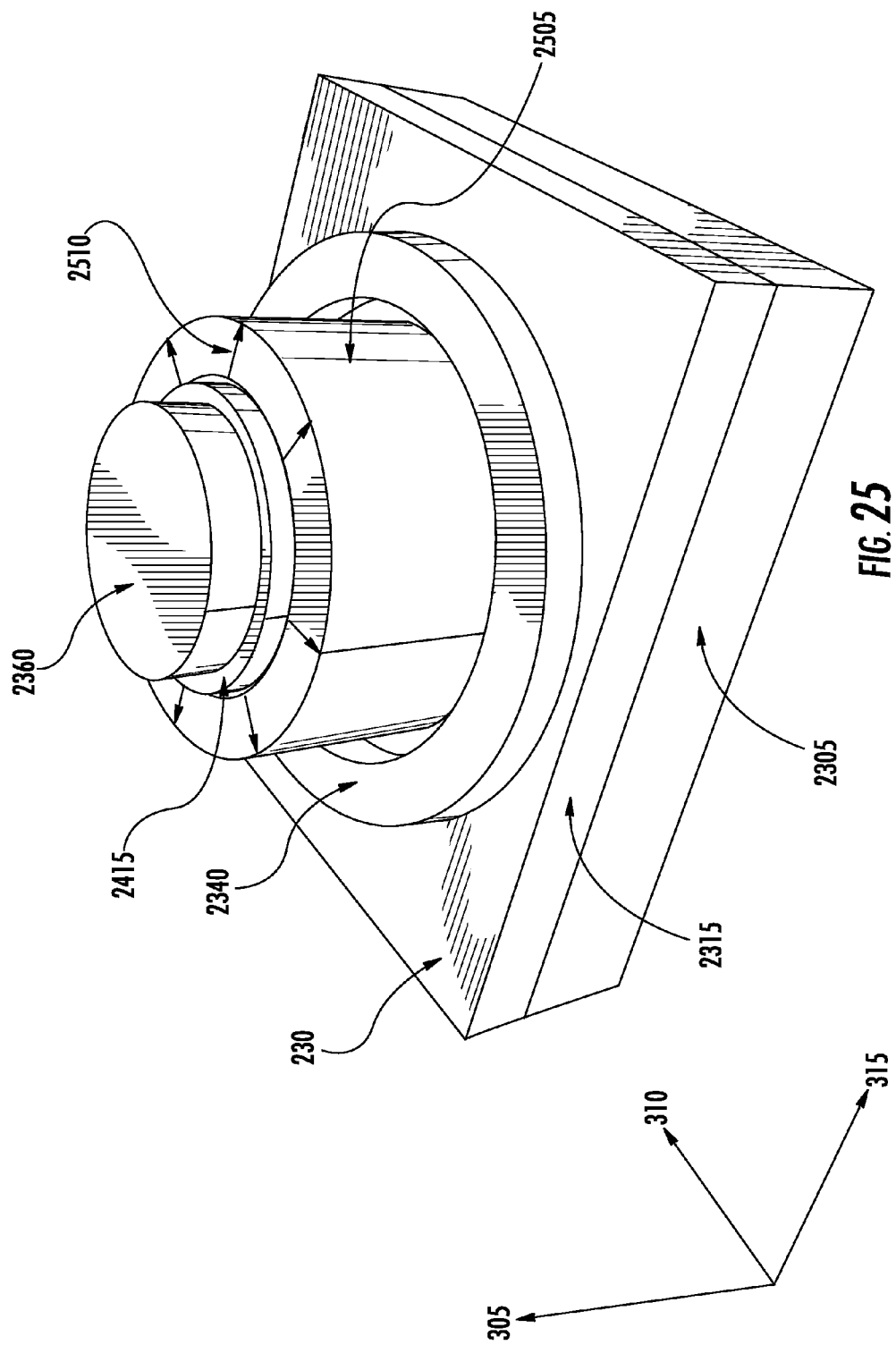
FIG. 25 illustrates a 3D implementation a cylindrical symmetry p-i-n diode comprising a wurtzite semiconductor. The device shows the position of the cylindrical stressor and the in-plane radial symmetric tensile stress applied to the p-i-n diode due to the stressor.

FIG. 24 illustrates a cylindrical and radially symmetric 2510 compressive in-plane stressor 2505 applied to the p-i-n diode 2415. The stressor can contact at least a portion of the p-i-n diode sidewall. FIG. 25 illustrates a cylindrical and radially symmetric 2510 compressive in-plane stressor 2505 applied to the p-i-n diode 2415. The stressor can contact at least a portion of the p-i-n diode sidewall. Therefore, FIGS. 21 and 22 represent uniaxial in-plane stressors applied across a p-i-n diode whereas FIGS. 24 and 25 describe bi-axial and tri-axial in-plane stressors applied across the p-i-n diode.

Figure 26B:
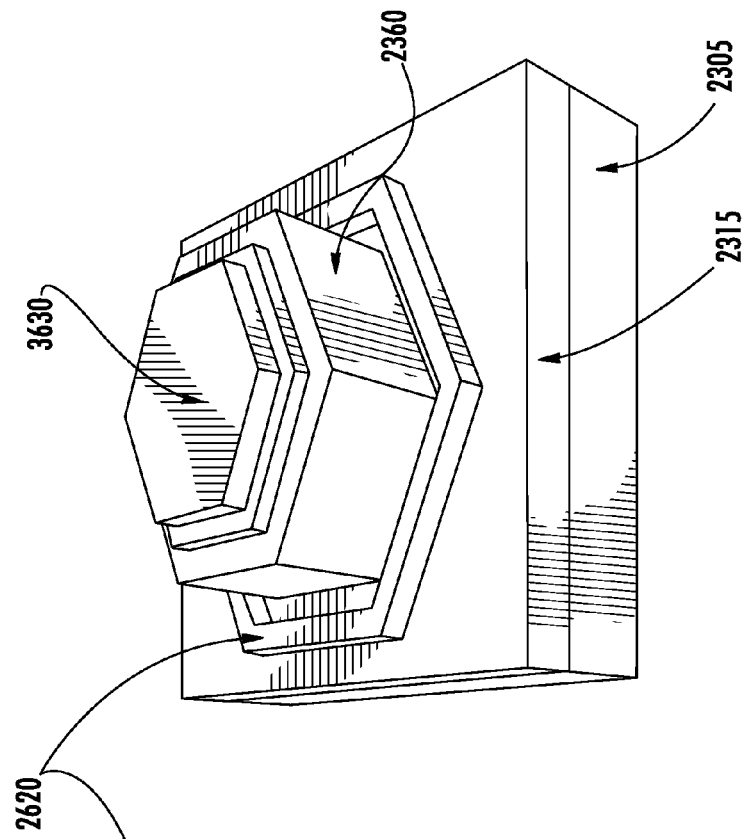
FIG. 26B illustrates the vertical type p-i-n homojunction device with electrical contacts formed into a hexagonal symmetry column of FIG. 26A with a further in-plane stressor coating applied to the mesa sidewall.
Figure 26A:
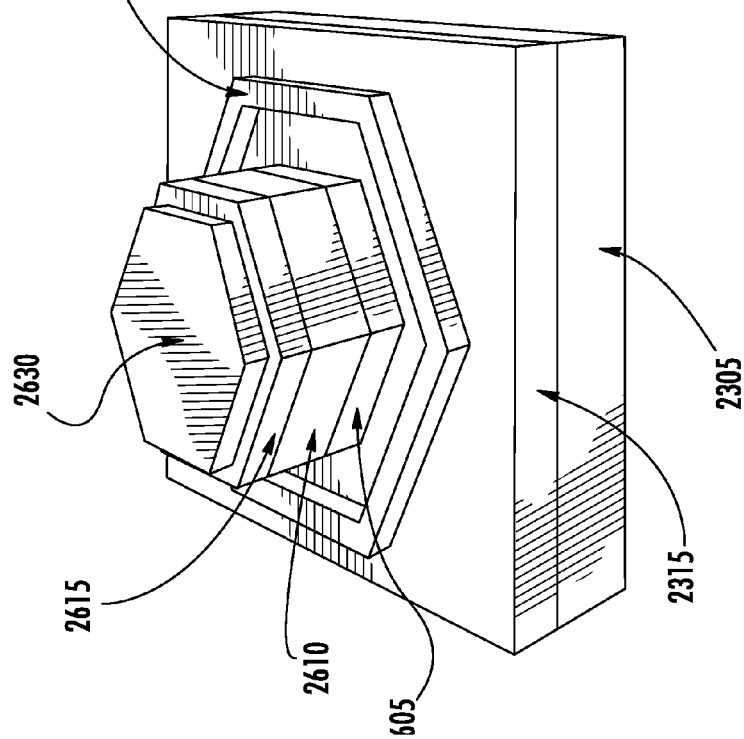
FIG. 26A illustrates a vertical type p-i-n homojunction device with electrical contacts formed into a hexagonal symmetry column.

Other multi-axis in-plane stressors are possible as shown in FIGS. 26A and 26B. FIG. 26A shows a p-i-n homojunction diode fabricated into a hexagonal mesa structure. The n-type region 2605, i-type region 2610 and p-type region 2615 and the contacts 2620 and 2630 complete the two electrical terminal diode. The in-plane stressor 2360 is shown in FIG. 26B as a conformal coating but can also extend laterally beyond the confines of the lower contact 2620.

Figure 28:
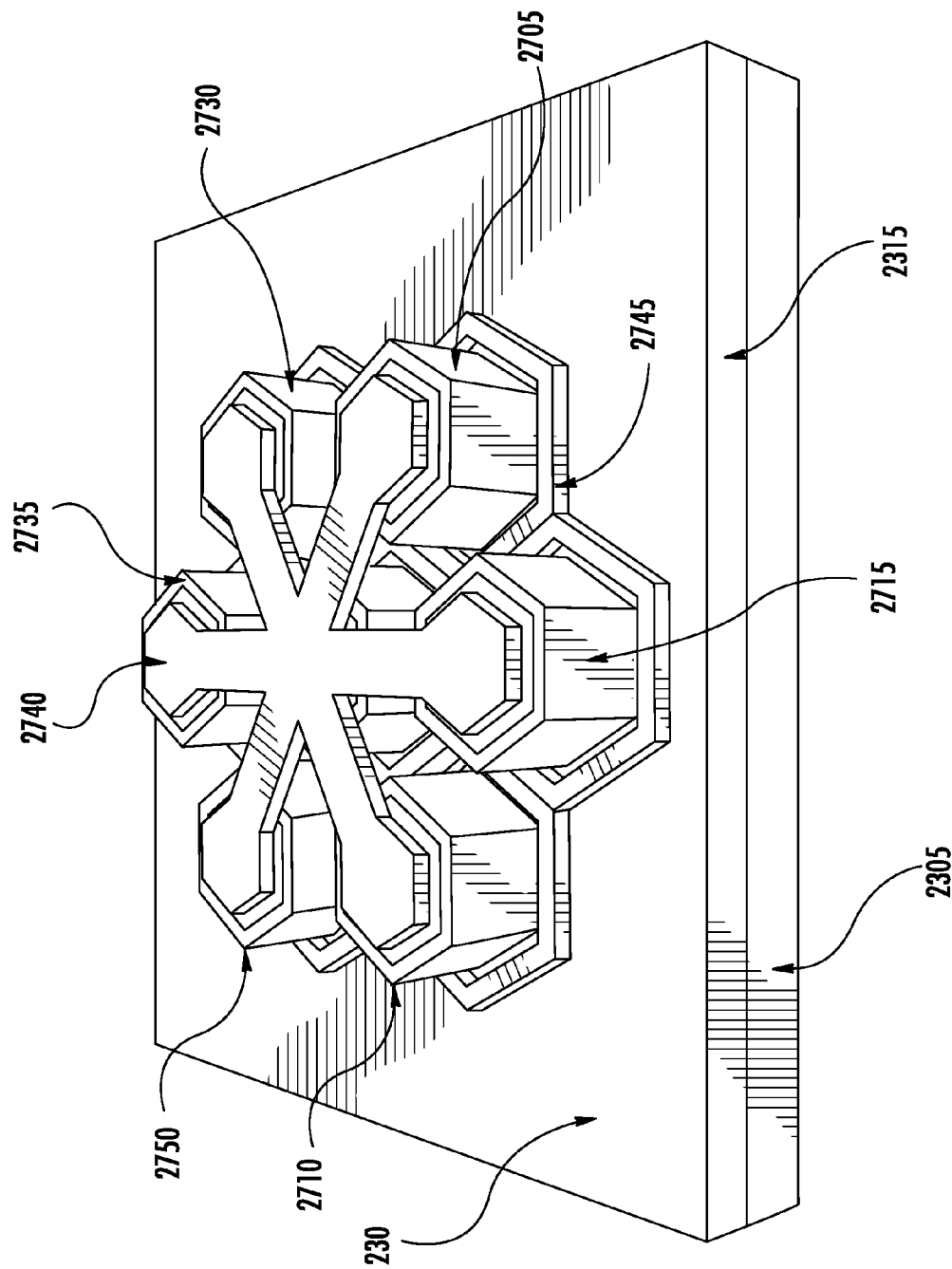
FIG. 28 illustrates a 3D view of the integrated light emitting device comprising a plurality of hexagonal p-i-n mesa diodes close-packed and electrically interconnected. Each p-i-n mesa has an in-plane stressor as shown in FIG. 26B.

FIGS. 27 and 28 show the device of FIG. 26B interconnected into a plurality of devices. FIG. 27 show the plan view of 7 devices interconnected in parallel by bus contacts 2745 and 2740. The seven p-i-n devices 2750, 2705, 2710, 2715, 2720, 2730 and 2735 have in-plane stressors formed. FIG. 28 shows the multi-diode device in detail with wafer scale fabricated stressors.

Figure 29:
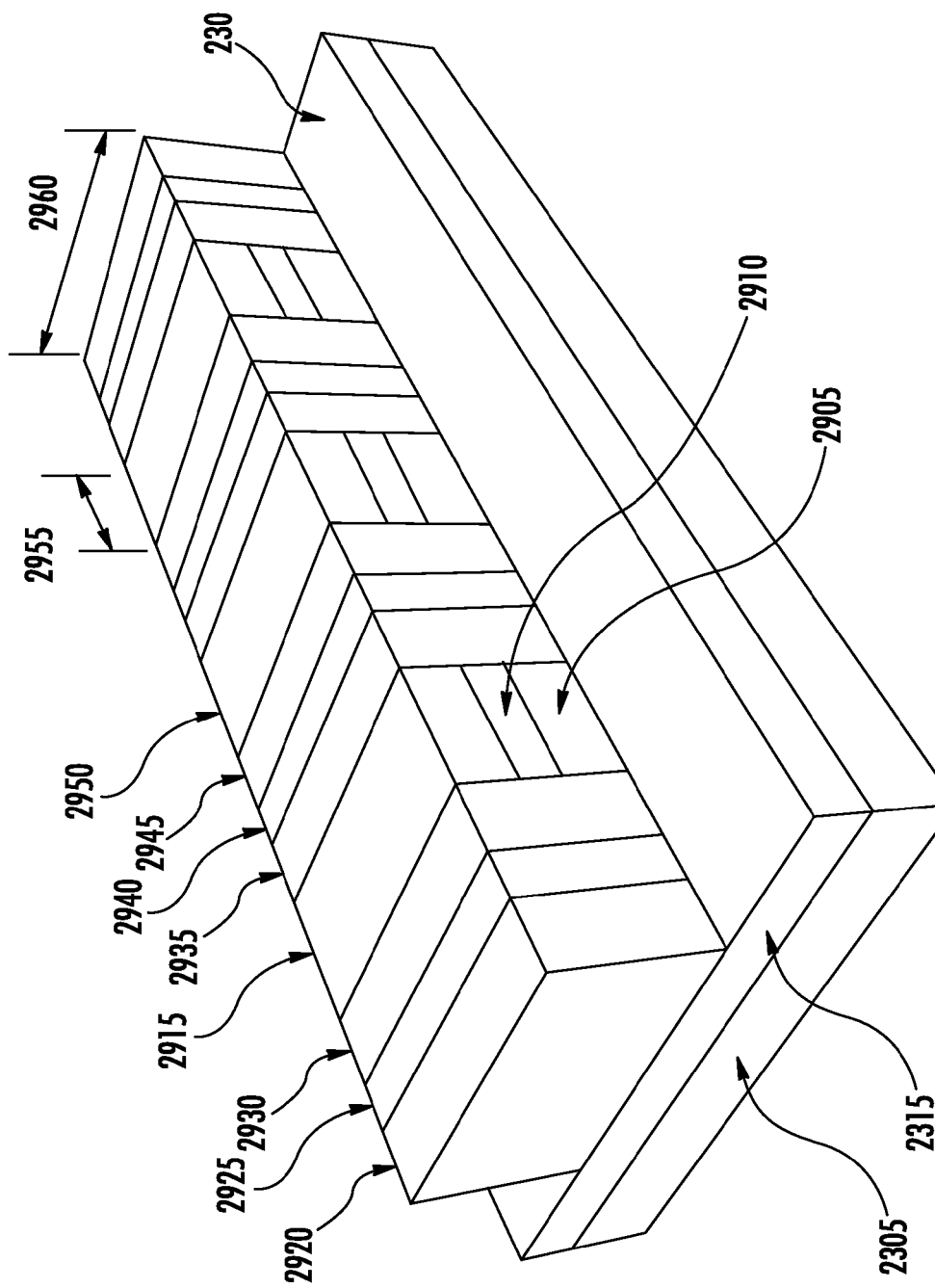
FIG. 29 illustrates an example of a plurality of lateral uniaxial stressors applied to a plurality of p-i-n mesa regions disposed across a planar substrate.

Uniaxial in-plane stressors can also be applied to multi-diode structures as shown in FIG. 29. Substrate 2305 includes buffer or n-type material 2315. A plurality of rectangular p-i-n diodes are fabricated from the p-i-n epilayer materials. The n-type regions 2905, i-type region 2910 and p-type region 2915 after being etched are formed into rectangular fingers of lateral width 2955 and length 2960. The lateral p-i-n fingers have the intervening space separating adjacent mesas filled or formed with lateral stressor regions comprising stressor materials 2920, 2925, 2930, 2935, 2940 and 2945. Each stressor region comprises three materials, for example regions 2935, 2940 and 2950. If the two stressor regions sandwiching a p-i-n finger induces a compressive stress then lateral uniaxial stress is applied to the said finger. The stressor region can for example, comprise stressor materials 2935 and 2945, and may include a contact material capable of electrically connecting the lower conductivity type region of the diodes. For example, each stressor material may comprise insulating materials and a metallic plug that can simultaneously act as a stressor and n-type contact bridge.

Figure 30:
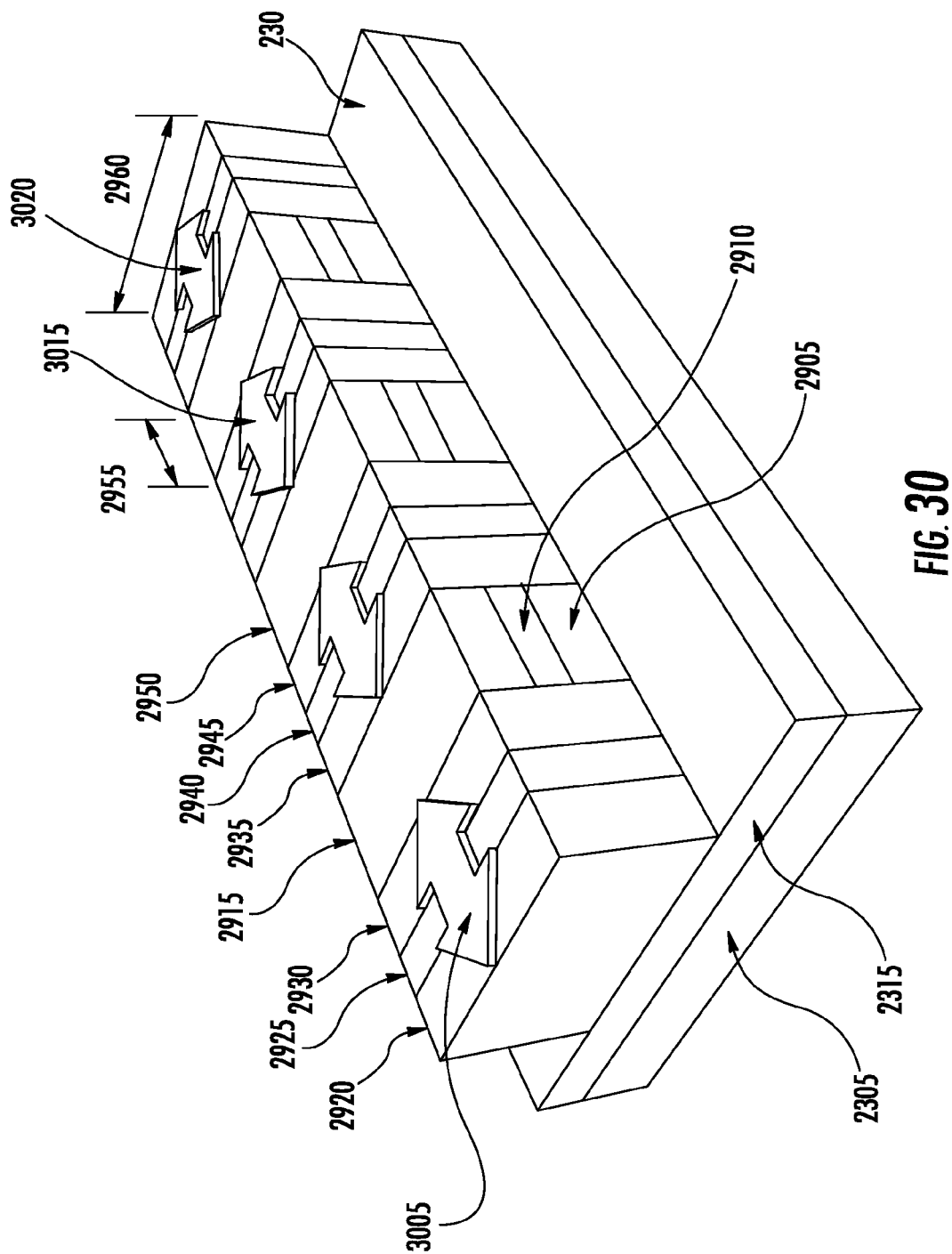
FIG. 30 illustrates an example of a plurality of lateral uniaxial stressors applied to a plurality of p-i-n mesa regions disposed across a planar substrate. The uniaxial compressive in-plane stressor action is shown explicitly acting on the rectangular p-i-n mesa regions.
Figure 31:
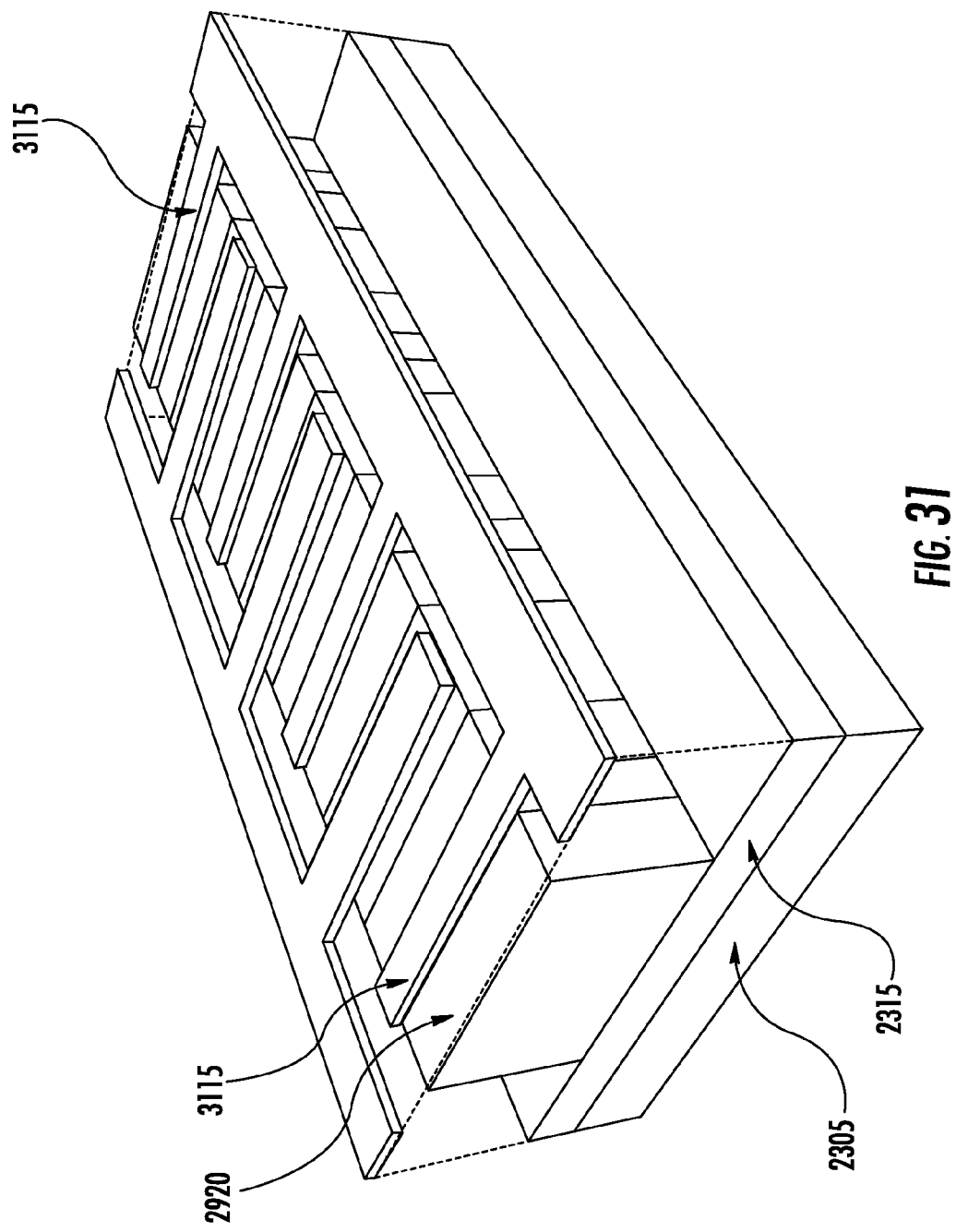
FIG. 31 illustrates an example of a plurality of lateral uniaxial stressors applied to a plurality of p-i-n mesa regions disposed across a planar substrate with the electrical bus bars interconnecting the plurality of p-i-n diodes. The stressor regions incorporate an electrical connection to a lower conductivity type region of the p-i-n diodes. The electrical contacts are show to co-exist in the same upper plane.

FIG. 30 shows the action of the stressor regions providing uniaxial strain across a plurality of rectangular p-i-n fingers. The expansion of each stressor region exerts compressive stress against the respective sidewalls of the p-i-n mesa. A further optional feature of the stressor regions incorporating a conductive bridge from the surface to a lower n-type region is shown in FIG. 31. Interdigitated contacts 3115 contact the conductive bridge down to the lower n-type region. Interdigitated contacts 3115 connect in parallel the p-type regions of all the p-i-n finger mesas. The interdigitated electrical structure interconnects a plurality of lateral p-i-n mesa diodes in parallel.

Figure 32:
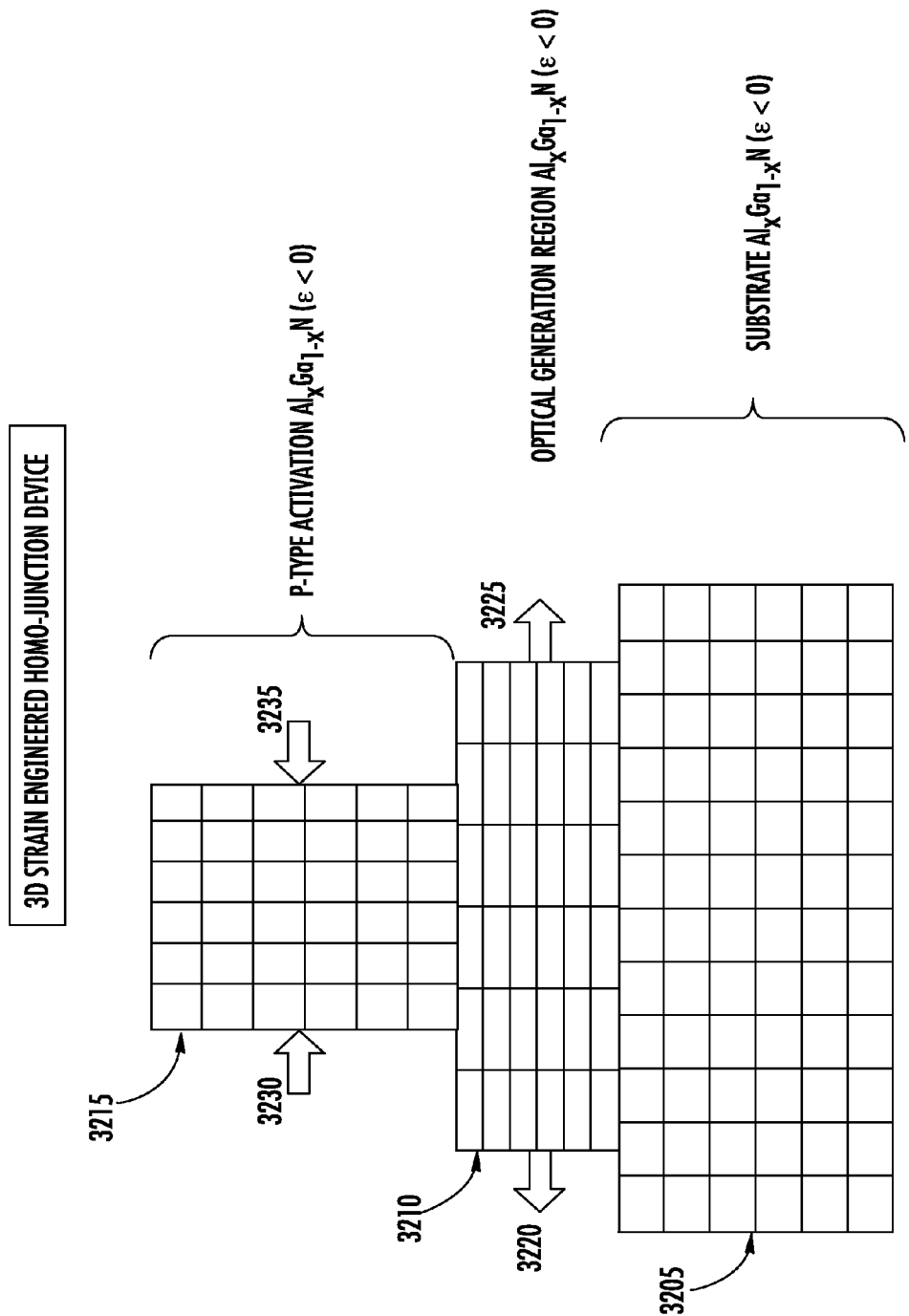
FIG. 32 illustrates a schematic representation of plurality of in-plane stressors applied to group-Ill nitride semiconductor. The stressors can be wholly within a plane of the layer or disposed along a growth direction of the semiconductor.

A plurality of stressor regions can also be enabled to exhibit multi stressor components along a vertical axis, for example perpendicular to the plane of the layers. FIG. 32 shows schematically a vertical structure comprising a homogeneous material composition, for example AlGaN. The device is physically etched and or patterned so as to form three distinct regions 3205, 3210 and 3215 with dissimilar strain states. The lower portion 3205 can be a substrate and the region 3210 enabled with tensile in-plane stressors 3220 and 3225. This is useful for reducing the energy of the optical emission region. The upper region 3215 can be enabled with a different strain field, such as, compressive in-plane stressors 3230 and 3235. Region 3215 could be a p-type AlGaN layer that is desired to have compressive stress to improve the p-type activation by virtue of the strain induced valence band energy shift relative to the ionized impurity.

Simple structures using uniform strain fields have been described. Sub-micron scaled devices comprising wurtzite materials offer further opportunities for advantageous utilization of strain. It is anticipated that sub-micron scaling using silicon CMOS style fabrication techniques will enable greater control and opportunity for bandgap engineering of homojunction devices. It is further anticipated that strain engineered homojunction wurtzite devices fabricated using nanometer scale dimensions will be competitive and potentially outperform heterojunction type compound semiconductors. That is, complex heterogeneous multilayered wurtzite epilayer structures may eventually be replaced by extremely high quality and low defect density homojunction epilayers which are then formed into nanoscale devices. Anticipating these technology advancements, the following disclosure describes how the wurtzite bandstructure can be engineered using uniaxial stressors and size effects.

Figure 33:
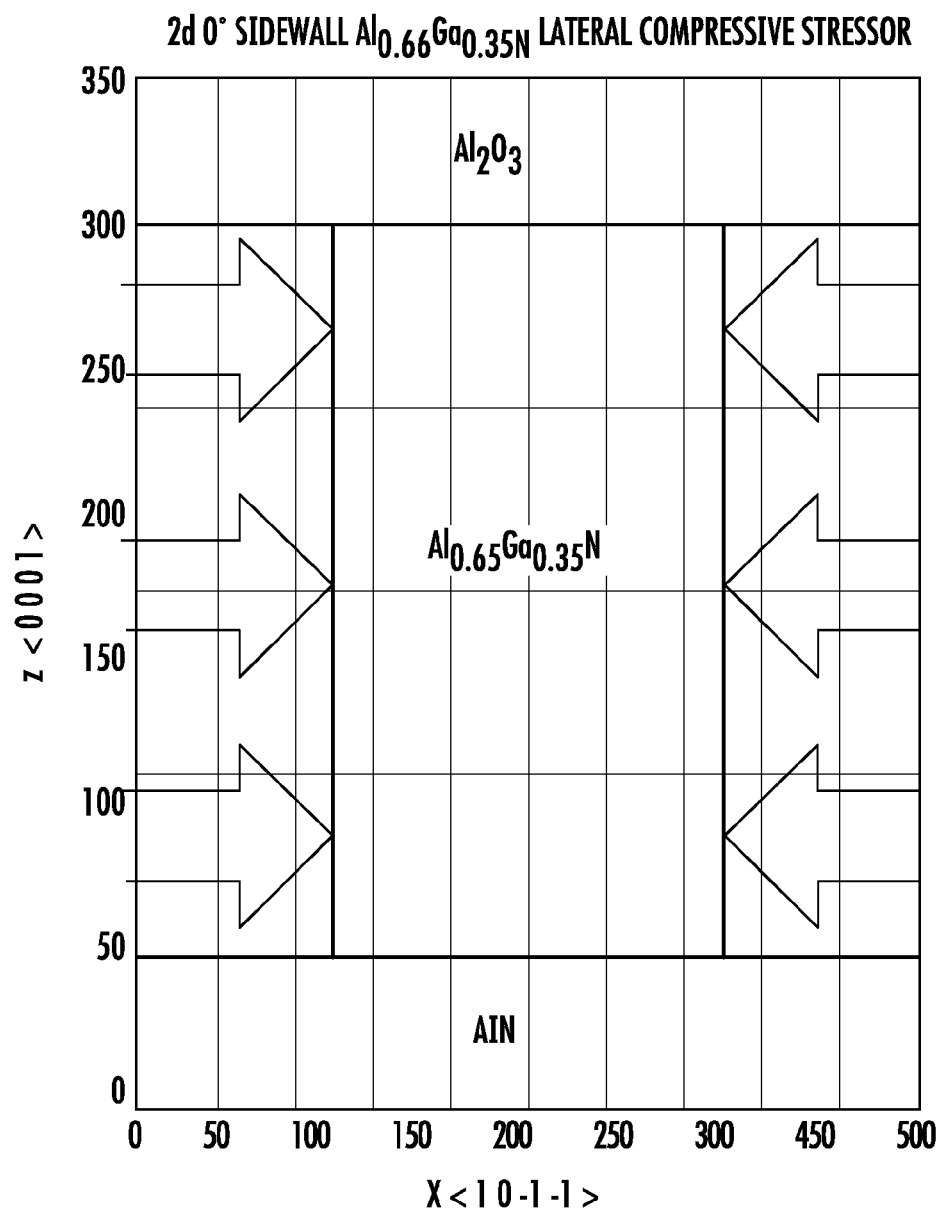
FIG. 33 illustrates the 2D model of a straight side walled wurtzite AlGaN mesa disposed upon a substrate and capped with a passivation layer of $Al_2O_3$. The lateral stressors impart a compressive in-plane strain into the AlGaN mesa. The AlGaN is oriented upon a c-plane according to the present invention.
Figure 34:
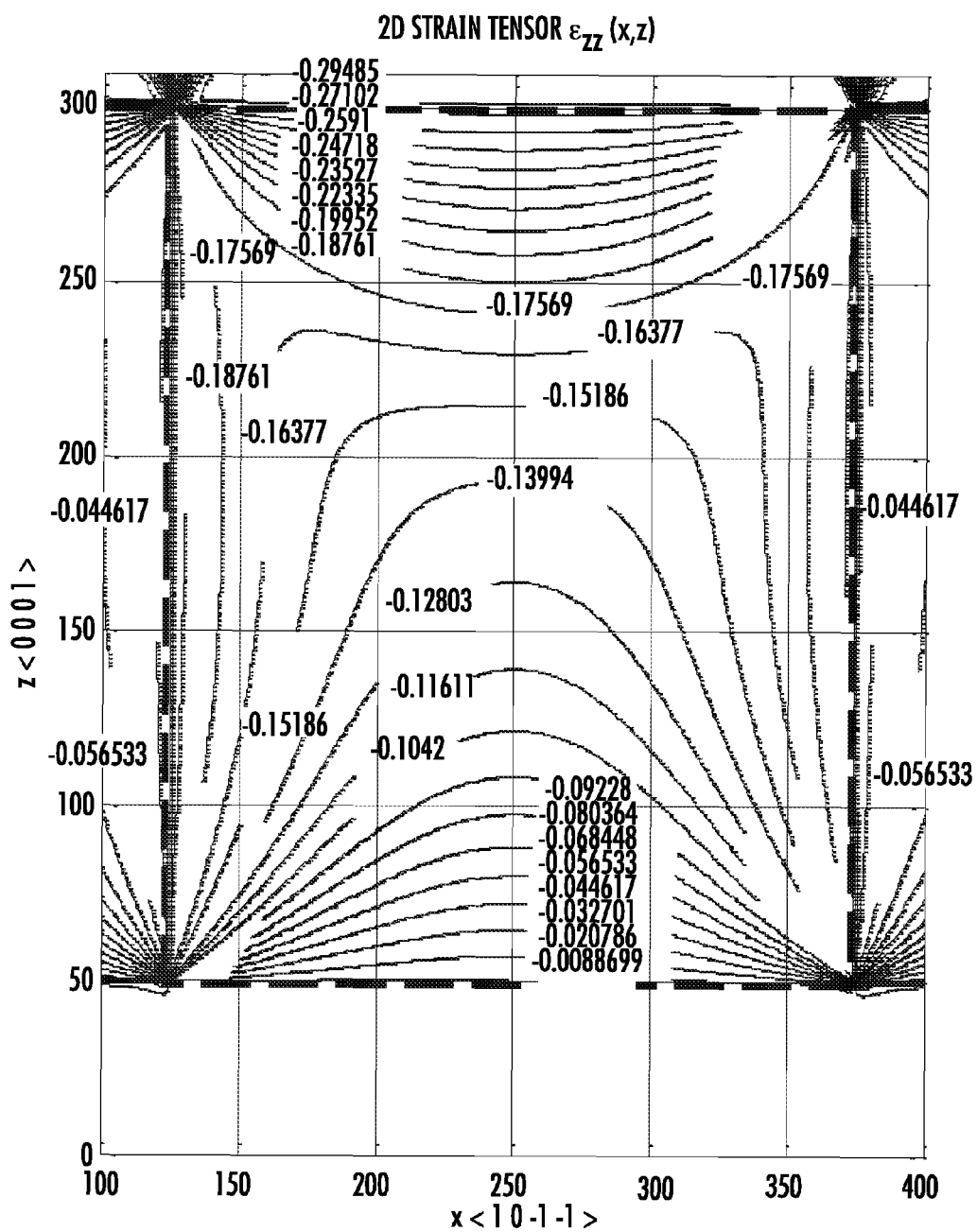
FIG. 34 illustrates the 2D spatial variation of the stress tensor exx(x,z) in a region containing the strained AlGaN mesa.
Figure 35:
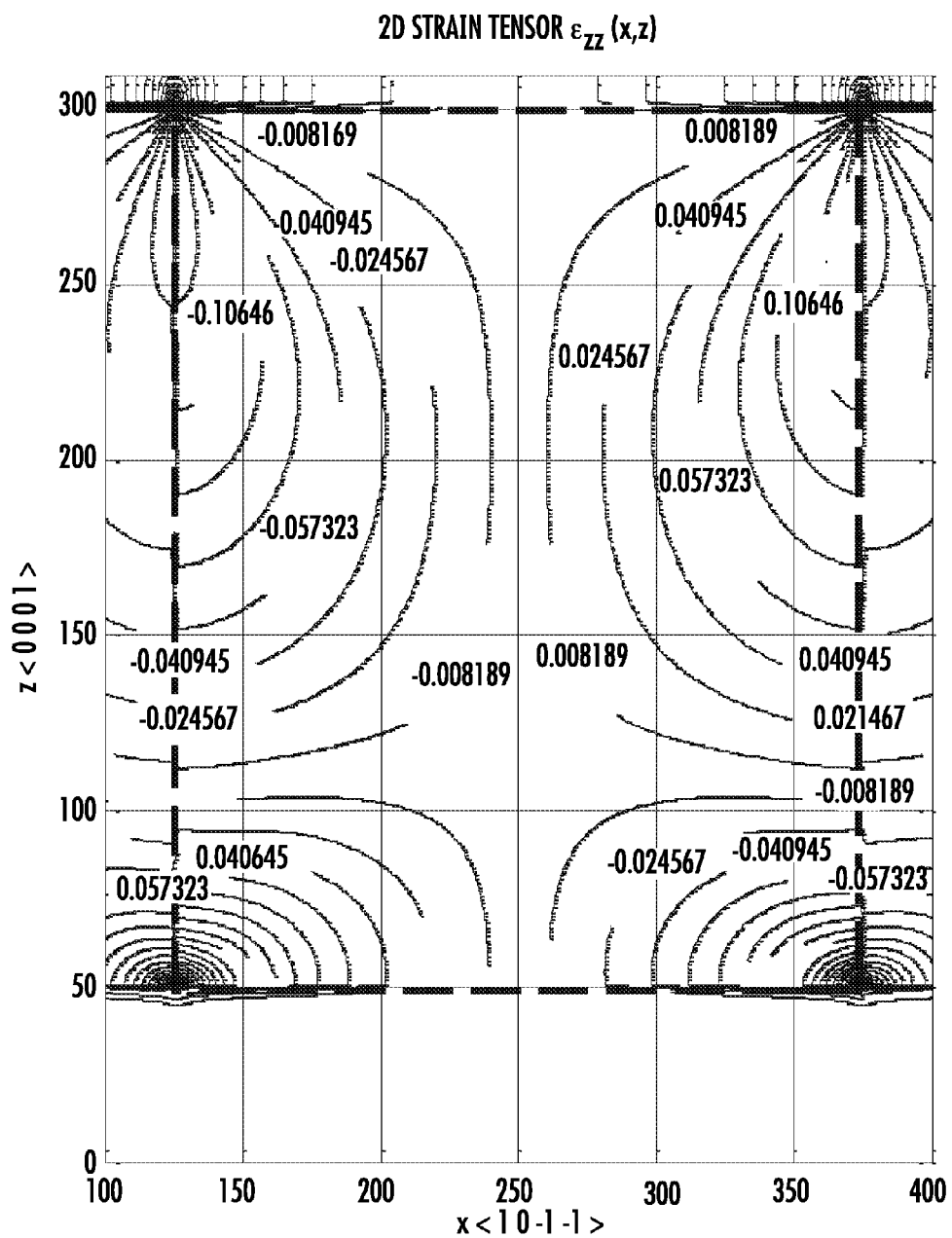
FIG. 35 illustrates the 2D spatial variation of the stress tensor exz(x,z) in a region containing the strained AlGaN mesa.
Figure 36:
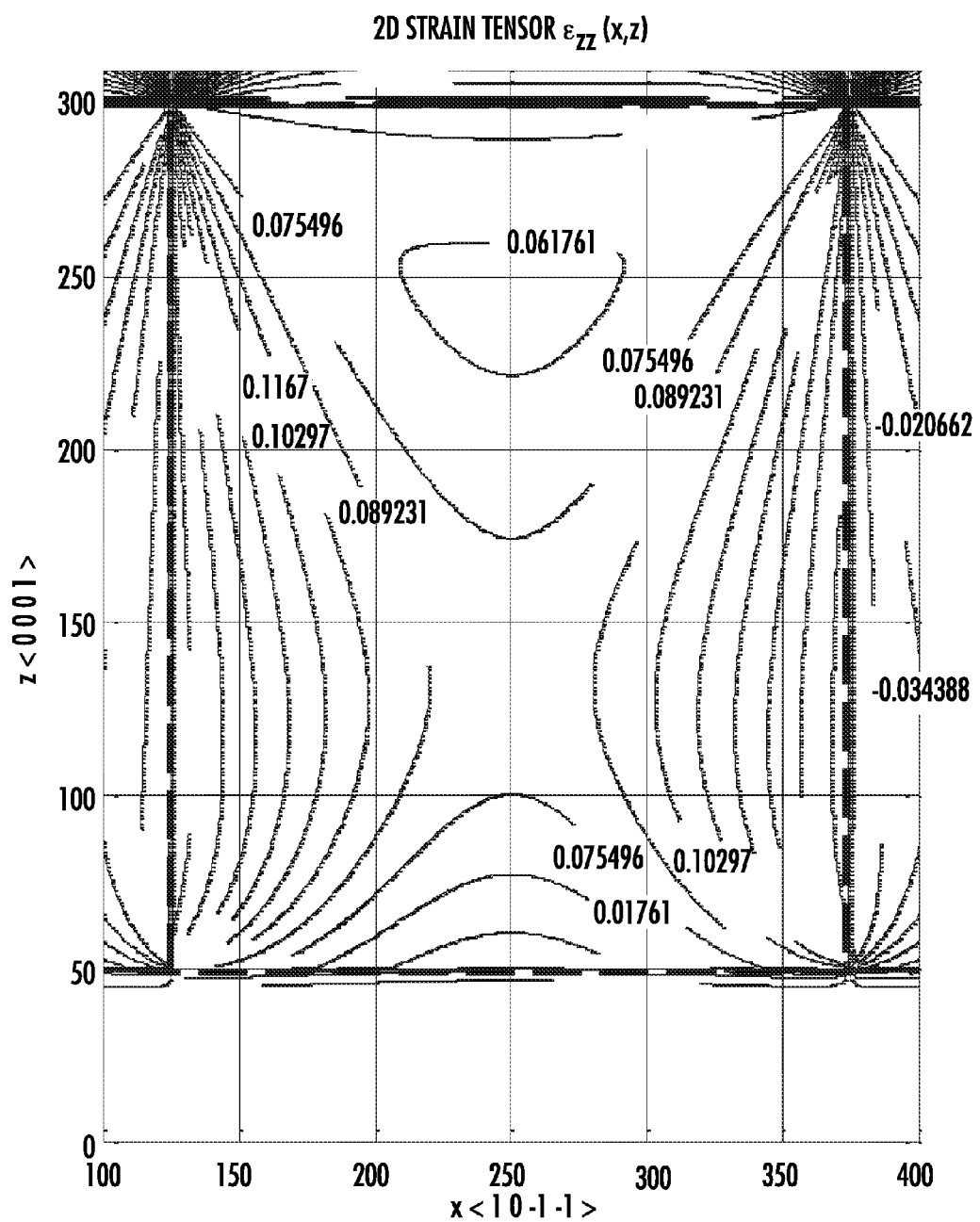
FIG. 36 illustrates the 2D spatial variation of the stress tensor ezz(x,z) in a region containing the strained AlGaN mesa.
Figure 37:
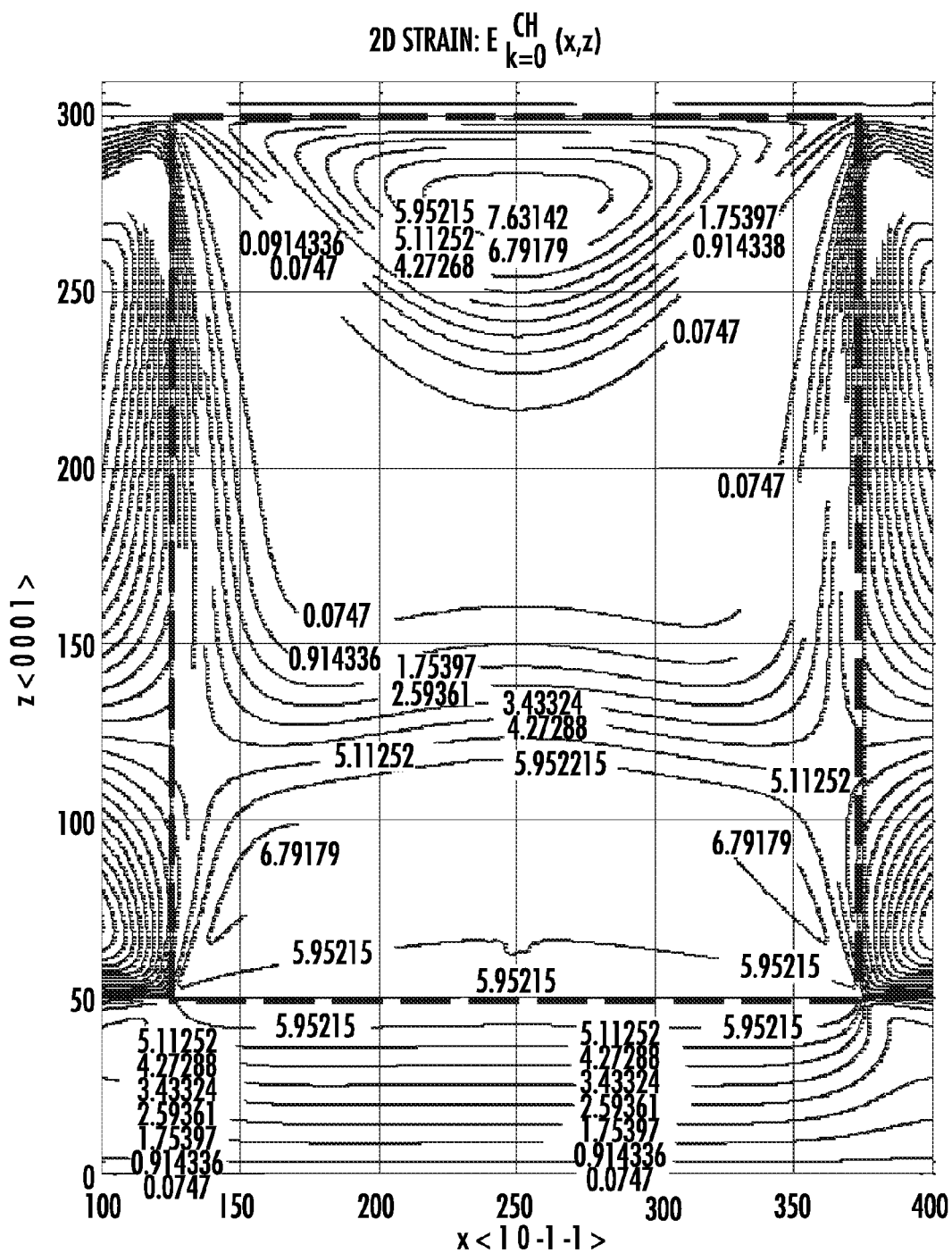
FIG. 37 illustrates the 2D spatial variation of the conduction band energy $E_C(x,z)$ in a region containing the strained AlGaN mesa.
Figure 38:
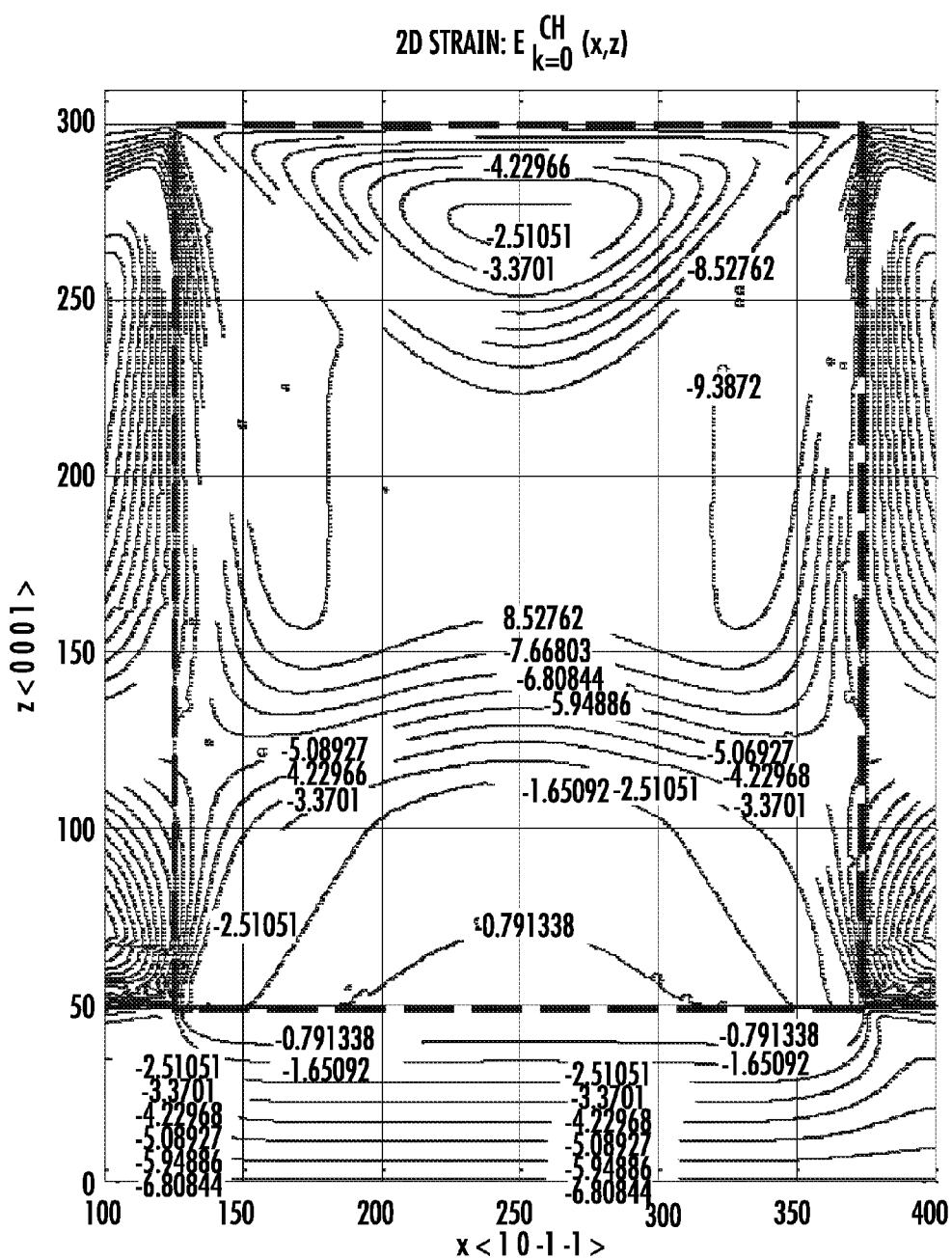
FIG. 38 illustrates the 2D spatial variation of the crystal split band energy $E_{CH}(x,z)$ in a region containing the strained AlGaN mesa.
Figure 39:
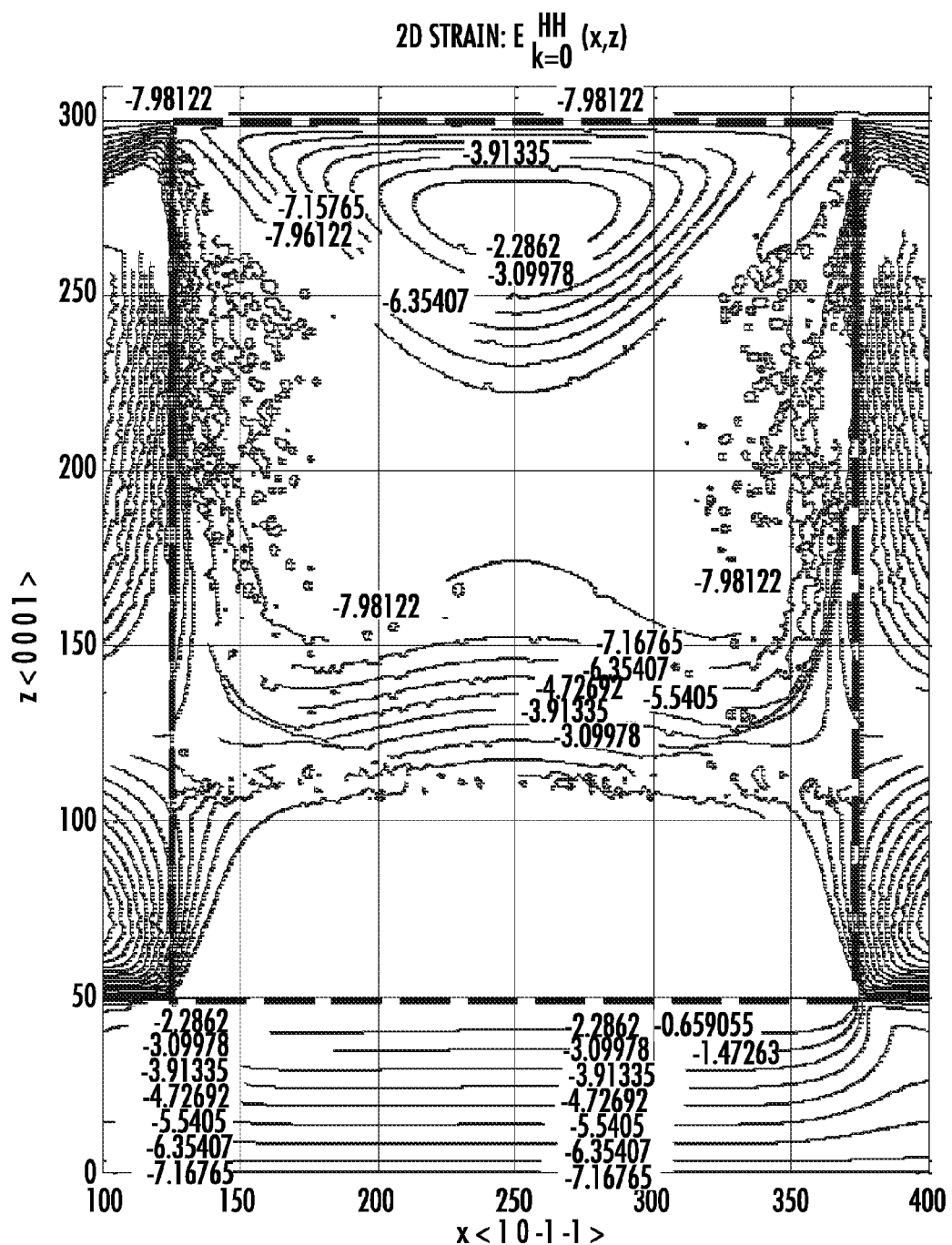
FIG. 39 illustrates the 2D spatial variation of the heavy-hole band energy $E_{HH}(x,z)$ in a region containing the strained AlGaN mesa.
Figure 40:
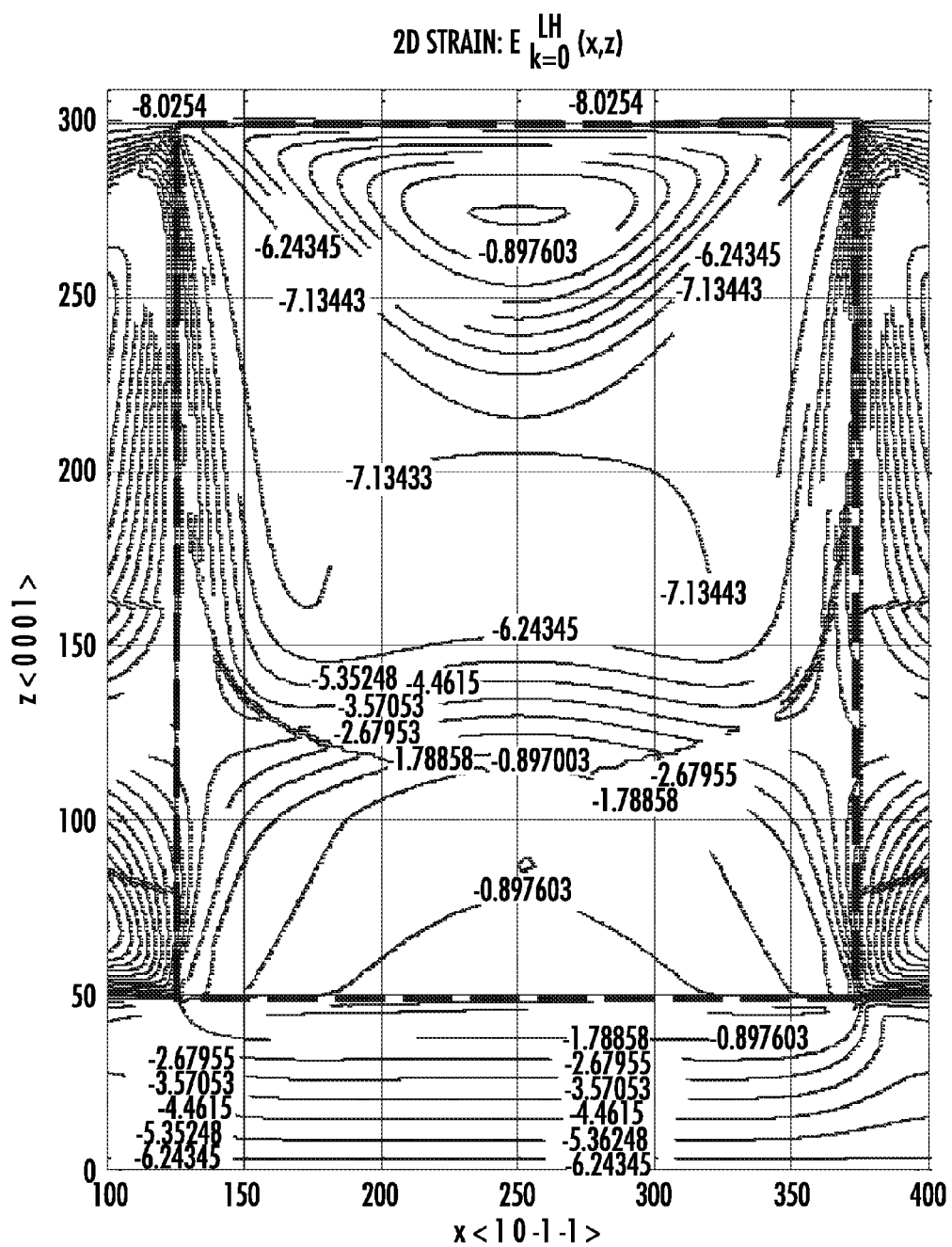
FIG. 40 illustrates the 2D spatial variation of the light-hole band energy $E_{LH}(x,z)$ in a region containing the strained AlGaN mesa.

FIG. 33 shows an ideal bulk-like AlGaN mesa structure sandwiched by two compressive uniaxial stressors. The wurtzite AlGaN material is formed epitaxially on an AlN substrate or buffer. The lateral stressors are direct along the <10-1-1> in equal and opposite amount perpendicularly against the sidewalls of the AlGaN mesa. Straight and ideal sidewalls (0° slope) are shown, with the lateral stressors introduced by selective area regrowth of material. A topmost passivation layer of $Al_2O_3$ serves to conserve shear flow and protect the device from the external environment. The mesa dimensions in the x and z directions are 250×250 nm and chosen to be compatible with conventional Si CMOS 0.25 um lithography. The z-direction is selected along the c-axis and thus the AlGaN epilayer is grown with c-plane oriented growth. The unique elastic tensor of the wurtzite crystal provides advantageous properties for such a uniaxially stressed AlGaN mesa. FIGS. 34, 35 and 36 show the calculated 2D stressor elements $e_{xx}(x,z)$, $e_{xz}(x,z)$ and $e_{zz}(x,z)$ due to the uniaxial compressive stressors, respectively. The electronic band structure is a sensitive function of the strain tensor and thus the conduction and valence bands will be spatially modified in a non-trivial manner.

Figure 41:
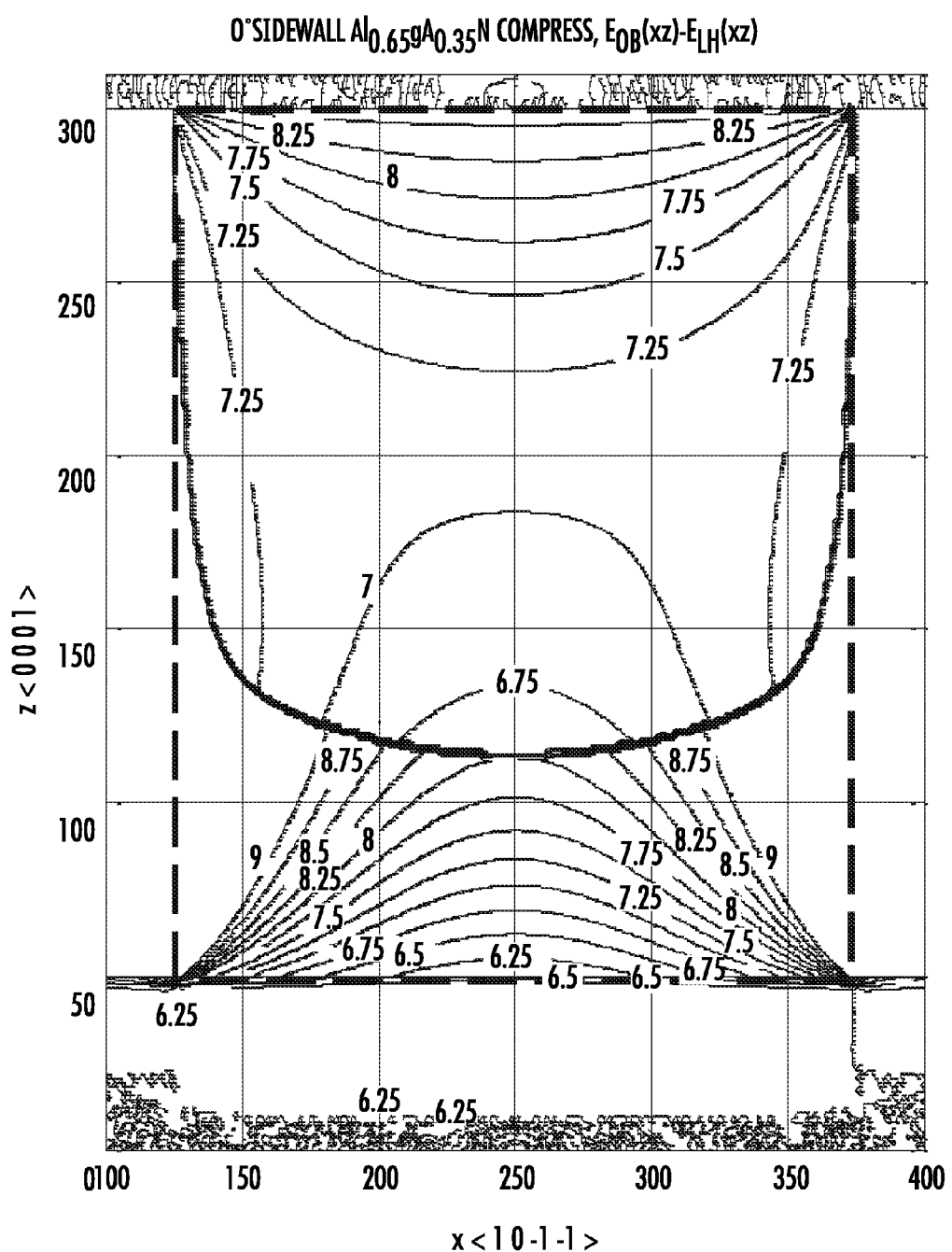
FIG. 41 illustrates the 2D spatial variation of the lowest transition energy between conduction band to light-hole band in a region containing the strained AlGaN mesa.

FIGS. 34, 35 and 36 disclose the strain tensor map within the AlGaN mesa and clearly demonstrate the non-uniform effect of the uniaxial stressor. Vertical through the mid-section of the mesa along the z-direction it is evident that large changes in elastic strain occur. The calculated effect on the spatial distribution of the conduction and valence bands within the AlGaN mesa region is disclosed in FIGS. 37, 38, 39 and 40 for the conduction band minimum, CH, HH, and LH bands, respectively. FIG. 41 shows the actual 2D spatial variation in the conduction to LH transition energy within the mesa structure. The effective bandgap of the mesa along the mid-section along the z-direction is shown to be larger at the top compared to the bottom. This effect is particularly useful for a p- in homojunction diode wherein the optical generation region occurs in the lower portion of the mesa and the p-type region is activated by the increase in effective bandgap. Therefore, it is shown that a homojunction p-i-n device using wurtzite materials can be bandgap engineered using in-plane lateral stressors.

Figure 42:
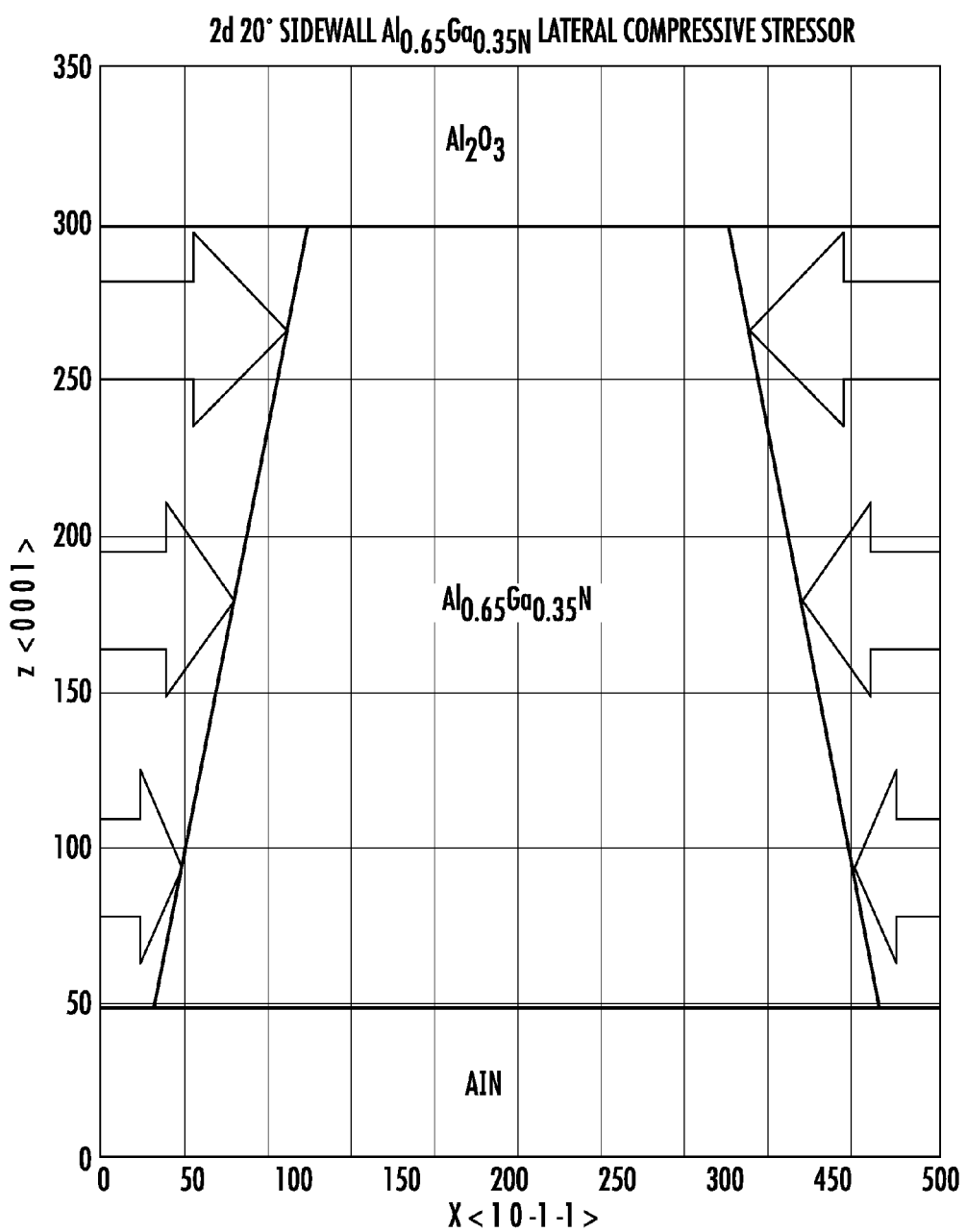
FIG. 42 illustrates the 2D model of a tapered side walled wurtzite AlGaN mesa disposed upon a substrate and capped with a passivation layer of $Al_2O_3$. The lateral stressors impart a compressive in-plane strain into the AlGaN mesa. The AlGaN is oriented upon a c-plane.

The ideal straight sidewall mesa of FIG. 33 can also be modified to provide an angled sidewall as shown in FIG. 42. A sidewall of 20° from the vertical is modelled forming the trapezoidal AlGaN mesa. Again compressive uniaxial stressors are applied. Periodic boundary conditions are modelled in the x-direction to simulate a plurality of such devices as shown for example in FIG. 30.

Figure 43:
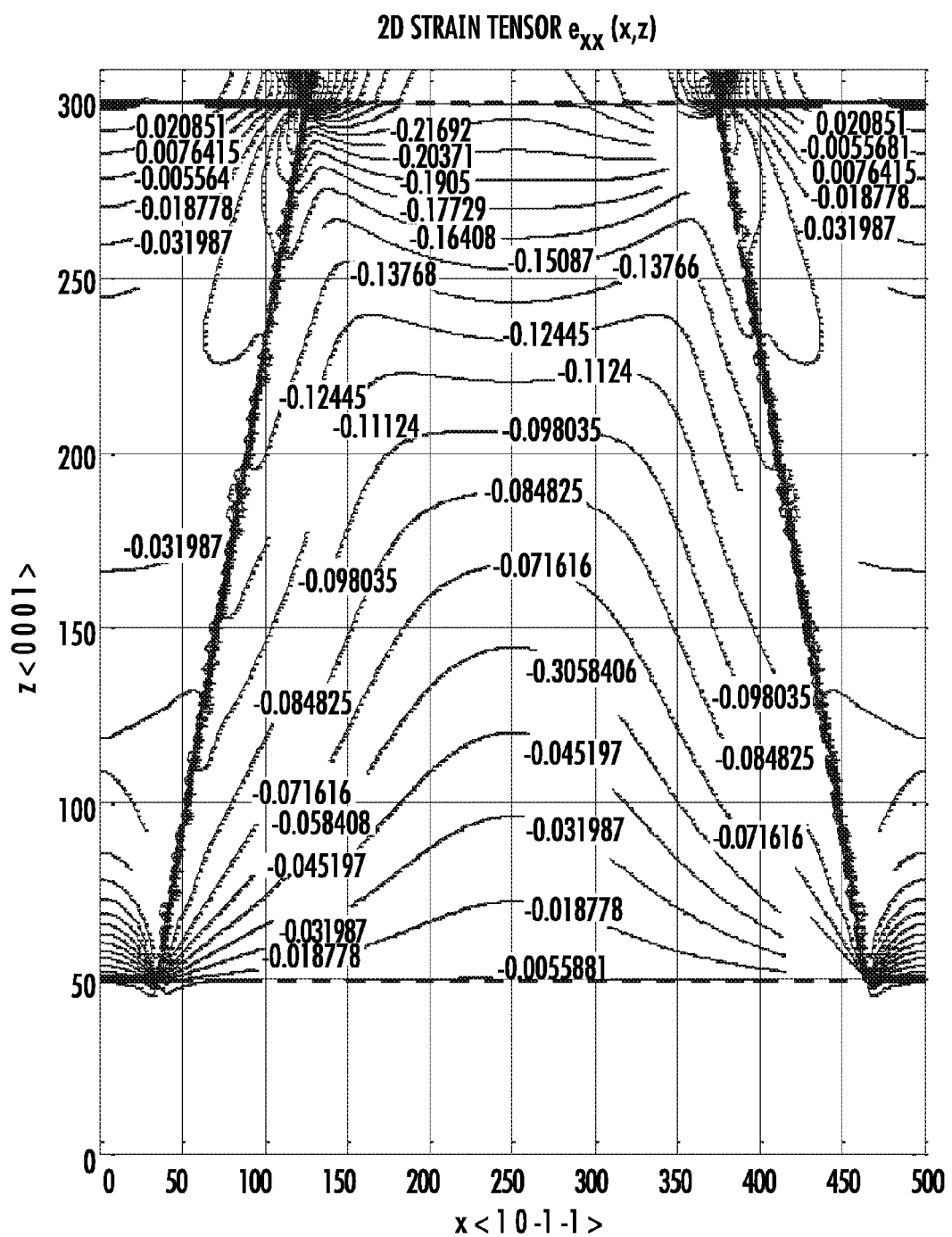
FIG. 43 illustrates the 2D spatial variation of the stress tensor exx(x,z) in a region containing the strained AlGaN mesa.
Figure 44:
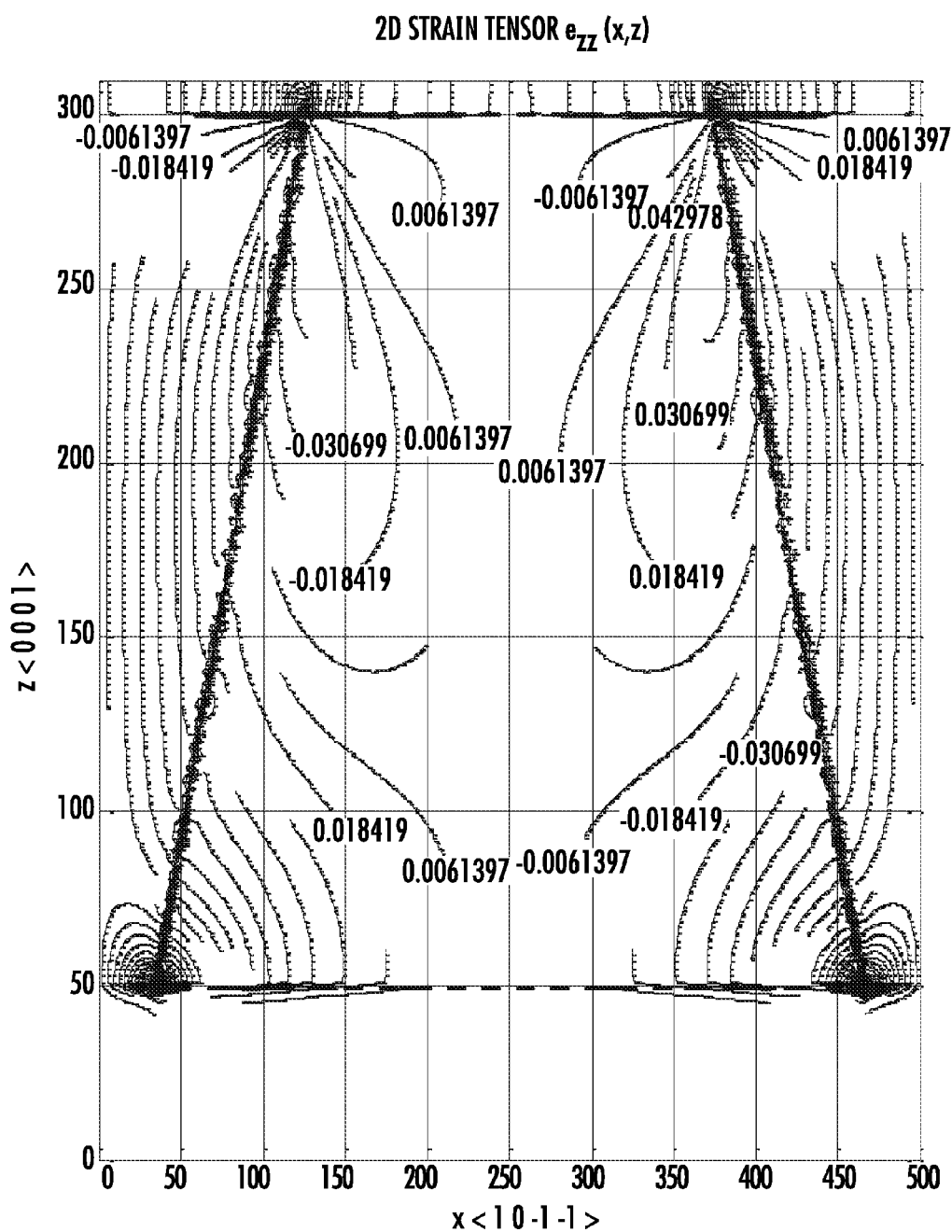
FIG. 44 illustrates the 2D spatial variation of the stress tensor exz(x,z) in a region containing the strained AlGaN mesa.
Figure 45:
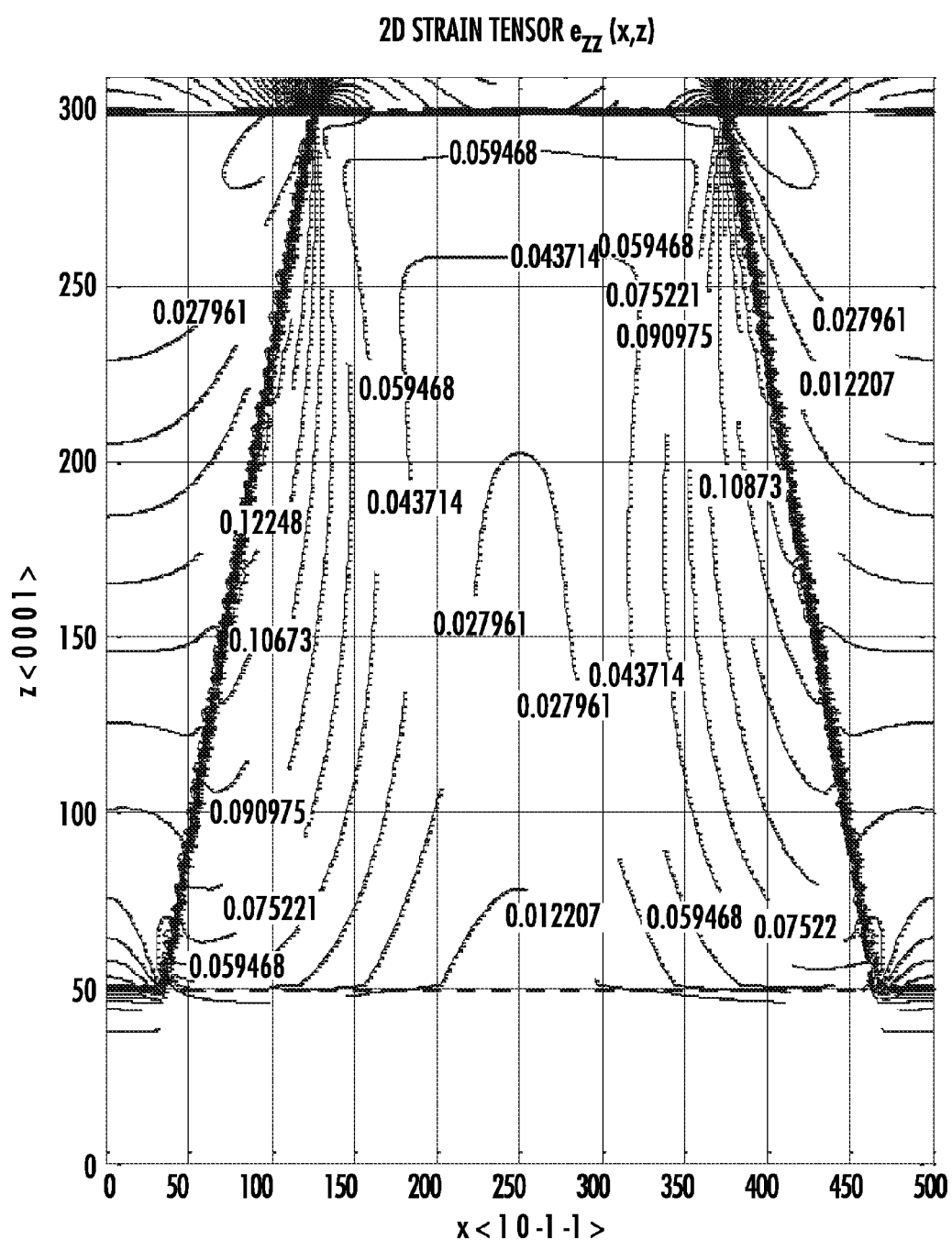
FIG. 45 illustrates the 2D spatial variation of the stress tensor ezz(x,z) in a region containing the strained AlGaN mesa.

The calculated 2D spatial stress tensor components for the angled sidewall mesa are shown in FIGS. 43, 44, and 45 for $e_{xx}(x,z)$, $e_{xz}(x,z)$ and $e_{zz}(x,z)$, respectively. Compared to the straight sidewall case, the angled sidewall shows larger effect for bandgap modification near the top of the mesa. For the case of p-i-n diode with p-type as the topmost region, the angled sidewall device would provide an improved current aperture effect further improving hole injection efficiency into the center portion of the mesa.

Figure 46:
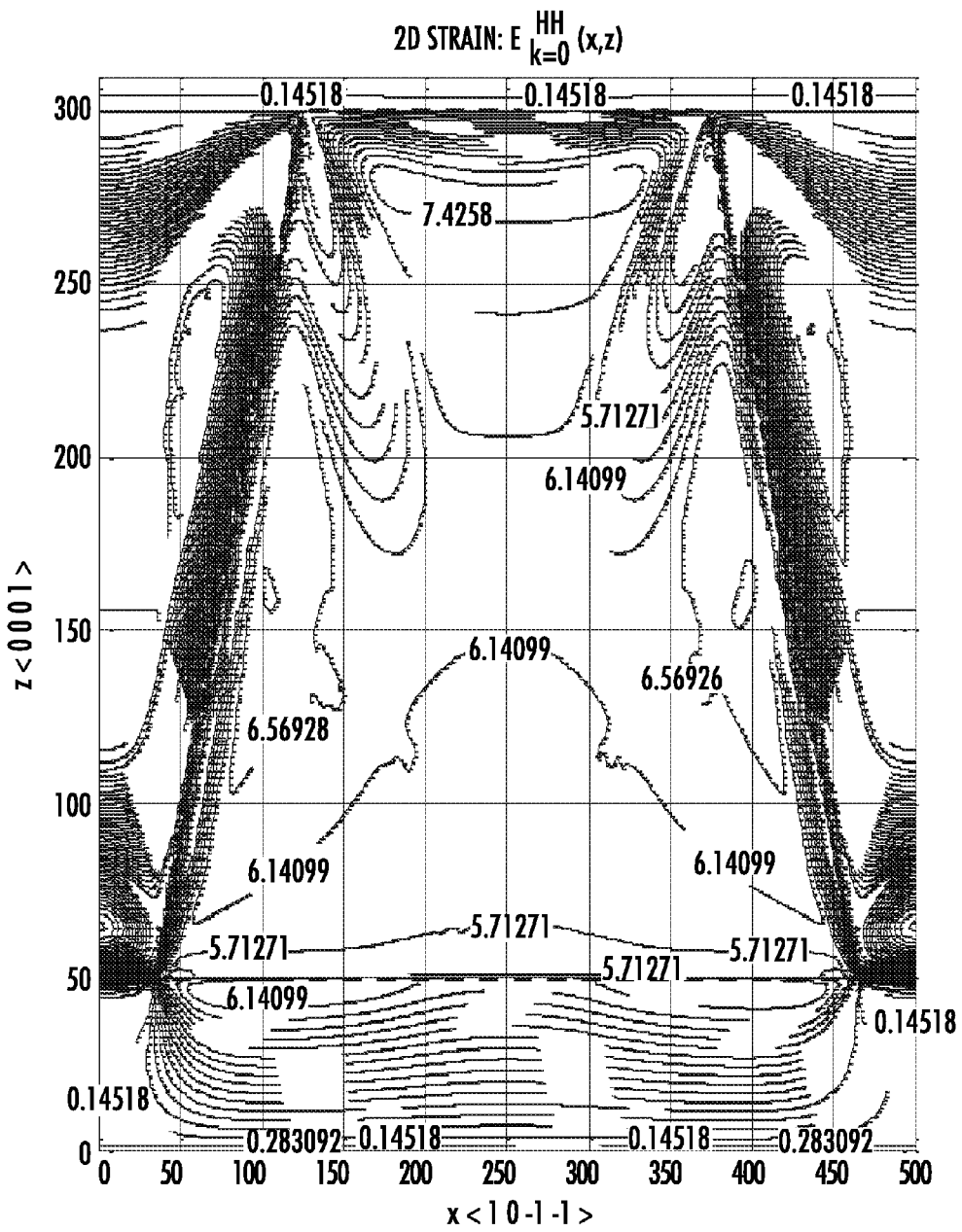
FIG. 46 illustrates the 2D spatial variation of the conduction band energy $E_C(x,z)$ in a region containing the strained AlGaN mesa.
Figure 47:
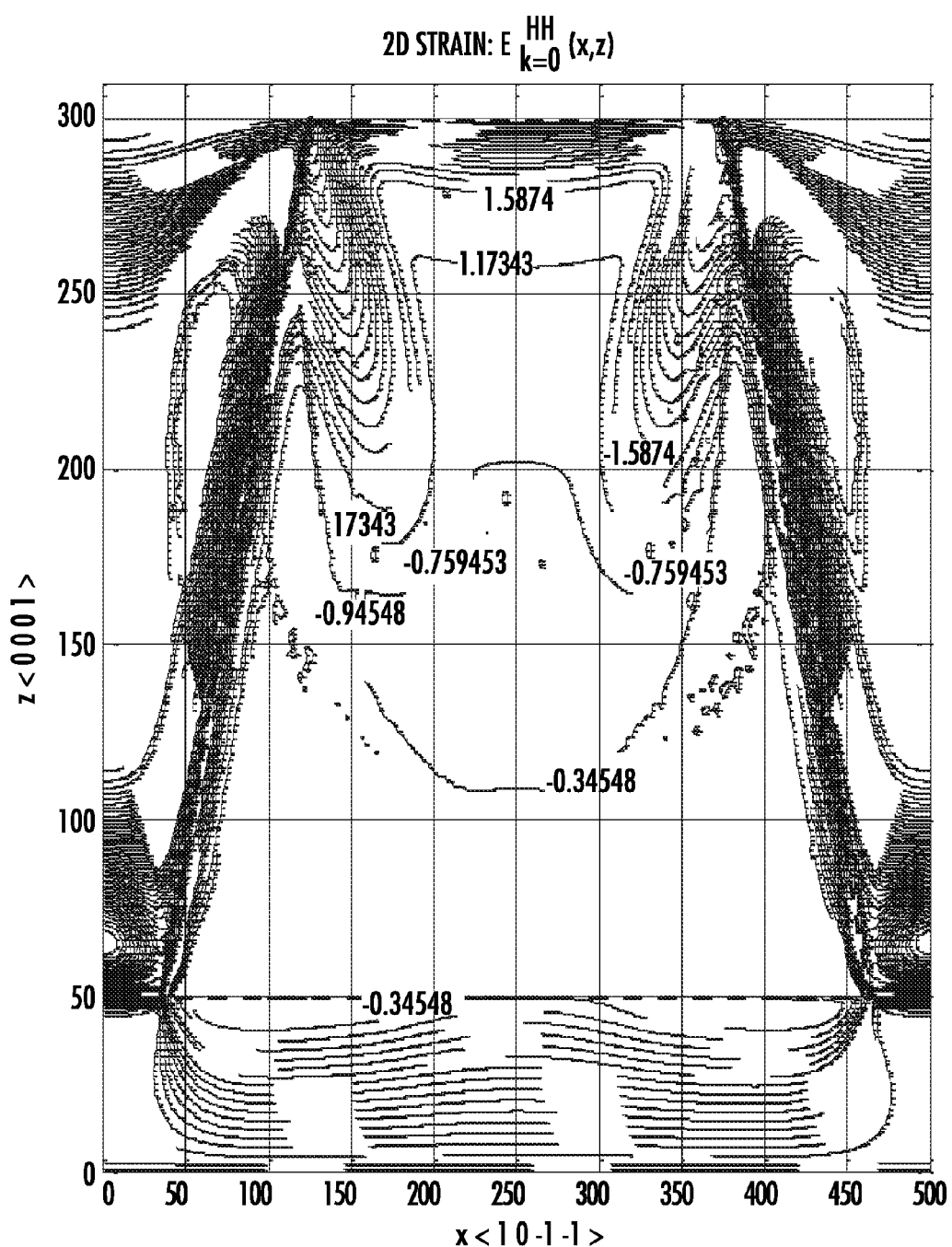
FIG. 47 illustrates the 2D spatial variation of the crystal split band energy $E_{HH}(x,z)$ in a region containing the strained AlGaN mesa.

Therefore, the geometry of the mesa and the application of the in-plane stressors can improve the p-i-n device performance for application to DUV light emitters. FIGS. 46 and 47 further show the calculated 2D spatial variation of the conduction band and HH band within the tapered sidewall mesa under the influence of externally applied uniaxial compressive stressors.

Devices formed using some of the approaches described herein can provide advantageous device performance above those achieved in the prior art using wurtzite materials. As the methods for design of external applied stressors for application to wurtzite crystal structured materials have been fully enabled and described in detail, the manufacture of externally applied stressors to wurtzite semiconductors is now disclosed.

Figure 1B:
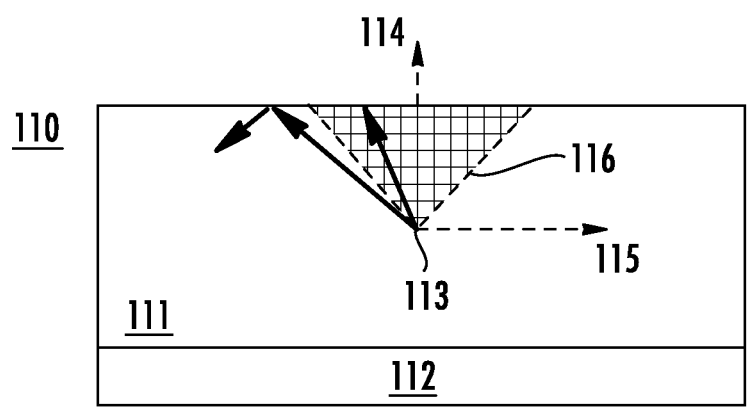
FIG. 1B illustrates a light emitting semiconductor structure that is found in the related art. The escape cone and total internal reflection of light generated within the interior of the device is described.

Referring again to FIG. 1B, examples of single crystal and transparent substrate 112 are crystalline sapphire (i.e., crystalline aluminium oxide $Al_2O_3$), wide bandgap metal-oxides, crystalline native group-III Nitride substrates such as AlN and GaN. Ternary substrates of aluminium-gallium-nitride ($Al_xGa_{1-x}N$ where $0<x<1$) are also possible.

Light generated at point 113 in active layer 111 will disperse in all directions, but the crystal structure and chemistry of active layer 111 will produce an emission pattern that favors certain directions. Emission patterns favoring direction 114 are said to favor the transverse electric or s-propagation direction. Emission patterns favoring direction 115 are said to favor the transverse magnetic or p-propagation direction. For various applications of semiconductor light generators, both the polarization and wavelength of light needs to be tuned to a desired value, and that value needs to be maintained within a predetermined acceptance window across the expected operating conditions of the device. Techniques for adjusting the polarization and wavelength of light generated by semiconductor light generators are therefore important for both the design and operation of those devices.

Once the wafer scale epitaxial material formation process is completed a post epitaxy selective area strain inducing process can be applied to the wafer globally to further modify the band structure of the semiconductor. Significant cost savings can be realized as every device on the wafer can be tuned in a single processing step by using semiconductor material of lower material variation and high crystalline quality. In this regard, processes that are conducted prior to singulation of the individual die from a wafer provide significant cost benefits. As the cost of semiconductor devices is intimately tied to the amount of processing time required to fabricate each die, approaches that process and tune wafers in batched format are less costly to those that apply to individual dice.

Finally, the usage of processing methods to induce selective area and strain provides additional benefits over methods that induce strain internally within the epilayer formation process. This epilayer material requires less growth complexity and can improve at least one of the most important crystal structure properties, defect density. In fact, this is what historically occurred to the silicon microelectronics industry. During early Si microelectronics development both device fabrication and advanced material formation methods were investigated. Eventually, a consensus for improving Si device performance was found to require an improvement in bulk Si crystal quality. It was the single most important attribute for large volume yield improvement. Post epitaxial crystal device formation leveraged advanced lithography and device formation techniques, such as oxidation and ion implantation. Approaches disclosed herein anticipate a similar trend in compound semiconductors and more specifically wide band gap semiconductors applicable for optical emissive devices. That is, simplifying the epitaxial structure and improving the structural quality is a key aspect for increasing the group-III Nitride yield and device performance. Approaches that induce strain as a band structure tuning methodology independent to and after the active semiconductor deposition process enables access to technologically mature Si CMOS compatible fabrication processes.

Numerous types of strain tuned light emitting semiconductor junction devices can exhibit some or all of the benefits described above. The devices can be formed using a bulk-like epilayer or substrate that comprises the material used for the junction. The function of bulk-like semiconductor could then be fabricated into a wider array of devices using standard fabrication procedures. That is epilayer can be tailored in part using device fabrication methods rather than relying solely on the epitaxial structure itself. This implementation highlights another advantage to partly disassociating the material selection for the junction and the light generated by the junction. Providing greater flexibility for selection of the material used to build the semiconductor junction can lead to significant cost savings as fabrication procedures that are unavailable for devices with exotic substrates are generally less expensive due to economies of scale and a greater degree of industry experience.

Referring again to FIG. 23A and FIG. 23B, strain is induced in device 2300 through a region of set straining material 2350. In this situation, the region of set straining material is not a contiguous region. As shown, breaks in the region of straining material are made to provide electrical contacts 2350 and 2360 to the device. Additional breaks in the region may be formed elsewhere to accommodate other features of the device. The region of set straining material 2350 lays outside the current paths that includes the first electrical contact formed by the electrode 2360 on the first side of the junction above p-type layer 2330, and the second electrical contact formed by either of the electrodes 2340 that are coupled to n-type layer 2320. Furthermore, the electrodes 2340 and 2360 provide current paths for the light emitting junction that are independent of the region of set strain material, and the region of set strain material is not on the current path between any of the electrodes. As a result, current can be provided to the junction and the light emitted by the junction can be measured prior to the introduction of the set strain region. This measurement could be conducted as a wafer level process using test equipment that applies a current to each of the many junctions that may exist on a single die. As a result, the recipe and final characteristics of the region of set straining material can be adjusted and calibrated to affect the optical polarization and emission wavelength of the particular junctions on the die. In specific instances, the strain inducing region can alter the optical polarization of the devices so that their polarization is opposite before and after the introduction of the set straining material. In the particular situation of a DUV LED, the ability of the set strain inducing region to alter the optical polarization from transverse electric to transverse magnetic provides a particularly appealing benefit in that higher wavelength light can be created with less strain in the device.

FIG. 23C shows yet another example of fabricating the in-plane stressor of device shown in FIG. 23A. The stressor material 2350 can be formed as a blanket and or conformal layer after the p-i-n mesa is patterned. The stressor material can also function as a passivation material to the active semiconductor material. Alternately, the stressor layer 2350 can be formed by consuming a portion of the immediate surface of the active semiconductor after the p-i-n mesa is formed. For example, a group-III Nitride can be converted via selective oxidation into a group-III oxide or oxynitride.

The region of set strain material in device 2300 can also be a passivation layer 2350. Passivation layer 2350 is deposited after the junction has been created. The passivation layer can be deposited in such a way that it creates a tensile or compressive force across the surface of the entire wafer and thereby induces strain in the semiconductor junction. The strain induced in the junction can be uniaxial, biaxial or tri-axial, as described herein. The deposition conditions and the material deposited can affect whether the passivation layer creates a tensile or compressive force. In fact, the same material can produce either kind of force depending upon the conditions by which it is deposited (i.e., if it is deposited at a temperature below regular operating temperature or above regular operating temperature). Likewise, the thickness of an inherently strained film deposited or formed upon the junction can also be used as a further mechanism for strain tuning in that a similar layer will exert a different degree of force based on its thickness.

Numerous benefits are provided by introducing strain through passivation layer 2350. In contrast to methods that involve heterogeneous material selection with variant crystal structures, passivation layer 2350 does not induce strain through epitaxial crystal lattice mismatch and does not ideally affect the light generated by the device except through the induction of strain.

Furthermore, the light generated by the semiconductor junction can be measured before and after the deposition of the strain inducing stressor or passivation layer because the device is substantially complete by the time passivation layer 2350 is put into place. Also, after the passivation layer is deposited, openings can be made in the passivation to reconnect to the control electrodes to measure the performance of the device again with the strain layer in place. As described below, this facilitates the iterative design of a desired junction and also improves the accuracy of manufacturing processes meant to minimize wafer to wafer variation. Finally, stressor layer 2350 is deposited globally across the surface of a wafer such that the strain induced by the passivation layer affects all devices on the wafer at the same time which provides cost benefits and simplifies the tuning procedure.

Strain can be introduced at multiple stages during fabrication; however, it is beneficial to introduce the stain towards the end of the fabrication cycle.

For example, the deposition of technologically mature amorphous silicon oxide and silicon nitride stressor films using plasma enhanced chemical vapor deposition (PECVD), atomic layer deposition (ALD) and sputter deposition processes can be used to form layer 2350 as shown in FIG. 23C. Windows can then be opened in stressor layer 2350 to form electrodes 2340 and 2360. Additional stressor layers can then be deposited or formed to increase the desired stressor strength and type (namely, compressive or tensile). As a result, externally induced strain is achieved with minimal additional cost. Also, PECVD generally allows for tight global control of the deposited material and therefore minimizes within-wafer non-uniformity and improves the ability of a designer to select the right material. In general, processes that can be applied globally on a wafer, but still allow control of the degree of strain at the device level, should be favored above those that do not. The aforementioned characteristics make PECVD stressor films well suited to provide strain in a manner that is disassociation from the selection of material for the active layer.

Another strain tuned light emitting semiconductor device can be described with reference to wafer section 4800 in FIG. 48. An active diode 4825 composed of wurtzite semiconductor material is patterned into rectangular mesa as shown. The device is formed in semiconductor material similar to the epitaxial layer 4820, which is formed on a substrate 4805. An optional surface stressor 4830 is shown on the topmost portion of the device 4825. Furthermore, asymmetric and uniaxial strain is induced into at least a portion of device 4800 through the formation of excavated trench regions 4850 in layer 4820. Furthermore, an undercut region 4840 is etched beneath at least a portion of the active device 4825. These trenches 4840 can be etched deep into layer 4820, and can further be backfilled with a contact material or stressor material.

Once the trenches are formed and optionally filled, a strain field is induced in at least a portion of the junction structure 4825 by virtue of device having intimate epitaxial contact at regions 4815 while being suspended along the side 4860. The trenches could be filled with material that will exhibit an intrinsic compressive or tensile stress on the light emitting junctions. The strain could be induced through a difference in the thermal expansion coefficients of the material in the trench and the material surrounding the trench. The trenches could be filled with material and that material could then be treated using another processing step to induce the material to cause a compressive or tensile stress on the light emitting junctions. Finally, the trenches could be exposed to a chemical treatment directly that will cause the native material to exhibit an intrinsic compressive or tensile stress on the light emitting junctions.

The strain induced in the light emitting junction can be tuned by the geometry of the trench pattern, the nature of the treatment applied to the trenches, the type of material deposited in the trenches, and the conditions under which such materialize are deposited. The geometry of the trench pattern can vary as to both the general location of the trenches on a device relative to the light emitting junctions on that device, and can also vary as to the shape of individual trenches. Regarding the shape of individual trenches, the depth of the trench relative to other layers can vary as well as the shape of the sidewalls of the trench. For example, the trench could have a curved shape such that the volume of material contained in the trench varied inversely with the depth of the trench. Each of these approaches is discussed in more detail immediately below. In all of these approaches, the region of strain inducing material can comprise a material having a band gap that is significantly larger than that of the active material of the junction such that the material will serve as a passivant and insulating material in addition to providing a straining force to the junction.

Trenches 4850 could be filled with material that will contact the surrounding substrate, or other layers 4820, and exert either an expansive or implosive force on the surrounding substrate, or other layers, which will in turn exert either a compressive or tensile force on junction structure 300. The filled trenches will then comprise a set strain inducing region to tune the optical characteristics of the light emitting junctions in the device. In certain circumstances, the trenches will not need to be completely filled to induce strain in the light emitting junction. The location of the trenches may be configured to induce either tri-axial, biaxial or uniaxial strain on junction structure 4825. The force of the strain inducing trenches can be imparted to the device through the deposition of material that changes its volume after it has been deposited. For example, certain deposited materials are deposited in temperatures above or below ambient and expand or contract as they return to ambient temperatures. A material that can exhibit an intrinsic compressive or tensile stress is silicon nitride deposited through PECVD. The strain induced by the silicon nitride will depend on the conditions in which the material is deposited and the geometry of the trenches and trench pattern.

Trenches 4850 could be filled with a material that will not induce strain until it is treated with an additional processing step. In particular, polysilicon could be deposited into the trenches and then thermally oxidized to produce silicon dioxide. This oxidation process can achieve a 2.5 volume expansion to the original material and thereby impart a large in-plane uniaxial or biaxial stress to junction structure 4825. The strain induced in the junction could be controlled through the selection of alternative materials or through a modification of the length and concentration of the oxidation. In addition, different processing steps besides oxidation could be conducted to alter the characteristic of the deposited material. Oxidation, or some other chemical treatment, could also be conducted without filling the trenches, in which case the expansion or contraction of the material in which the trenches were formed would be relied upon to generate a region of strain inducing material. The top surface of the material in which the trenches were formed could be covered by a mask during this step to prevent oxidation of the entire surface of the material.

Figure 49A:
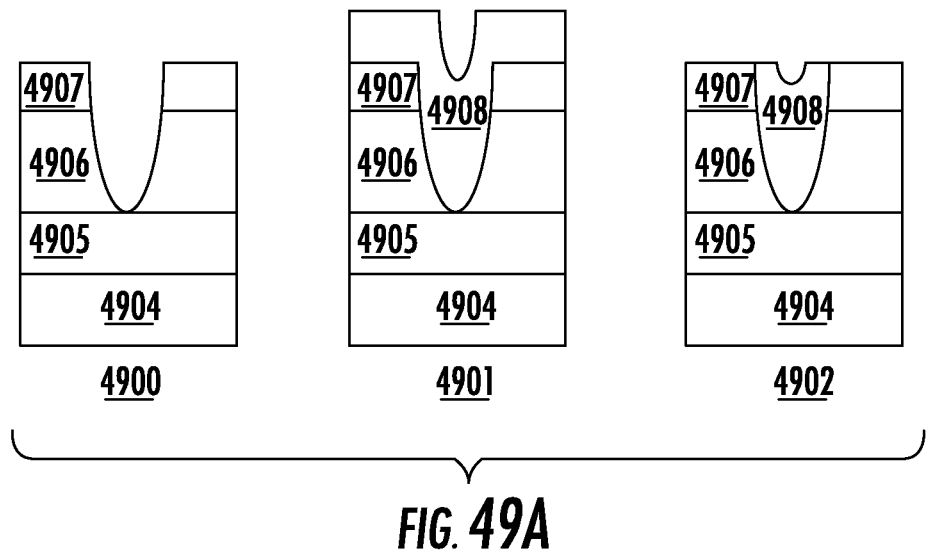
FIGS. 49A and 49B illustrate cross sections of various strain inducing trench processes.

A specific example of approaches in which the region of strain inducing material is formed using deposition of a material with an intrinsic strain can be described with reference to FIG. 49A. The figure illustrates a cross section of a light emitting junction device stressor region at three stages of fabrication 4900, 4901 and 4902. In stage 4900 a trench has been etched through a sacrificial mask layer 4907, into active layer 4906, and terminates on a barrier layer 4905. The barrier layer 4905 separates substrate 4904 from active layer 4906. The active layer 4906 can include several sub-layers used to form the light emitting semiconductor junction. In stage 4901, a layer of material 4908 has been deposited globally across a wafer to fill the trenches. As described above, this material can provide an intrinsic strain that is controlled by the chemistry of the material, the conditions in which the material is deposited, and the geometry of the trench. In the illustrated example, material 4908 is silicon nitride deposited via PECVD, and it will exert a compressive force on a junction that extends perpendicular to the illustrated cross section. In stage 4902, the layer of material 4908 has been planarizied. The planarization step can be conducted via numerous processes such as a chemical mechanical polish or a chemical etch. The remaining material 4908 will induce strain in active layer 4906 to thereby tune the optical characteristics of the light generated by junctions formed in the active layer.

Figure 49B:
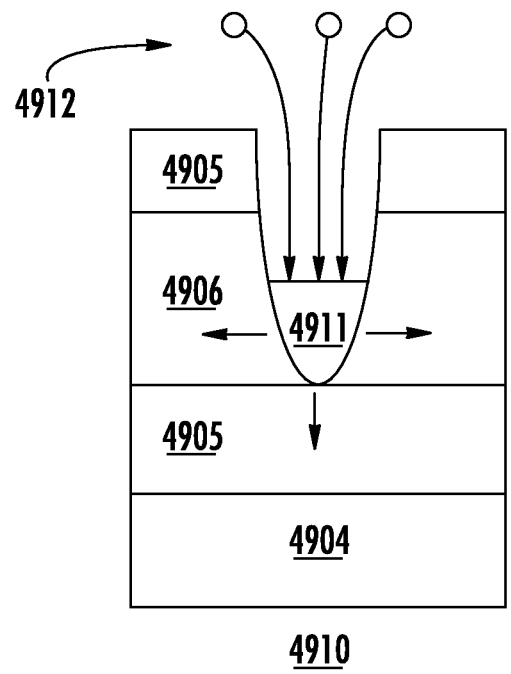

A specific example of approaches in which the region of strain inducing material is formed using a chemical treatment of a trench in the device can be described with reference to FIG. 49B. The figure illustrates a cross section of a light emitting junction device stressor region 4910. In cross section 4910, the trench that was formed in stage 4900 has been filled with material 4911. However, it should be noted that additional material does not need to have been deposited, as the native material that surrounds the trench could be directly treated to produce the strain inducing region. Also, the material 4911 does not need to fill the trench, as it may only fill a bottom portion of the trench. Furthermore, the point at which the trench is filled can affect the profile of the strain because most chemical processes will affect the exposed surface of material 4911 most vigorously. As such, the trench could be filled half way before being treated to target strain at the active region that is at the same depth as half the depth of the trench. Material 4911, or the native walls of the trench, may undergo a phase or composition change under the influence of the chemical treatment to induce a strain in junctions of the device. For example, the deposited material could be polysilicon and the chemical treatment could be the introduction either a dry oxidizer or a wet oxidizer such as steam. Alternatively, the deposited material could be a nitrogen based compound that oxidizes through the generation of ammonia. In either case, oxygen atoms 4912 will be introduced to the material 4911 to induce strain in the surrounding material as illustrated by the lines extending from material 4911 in active layer 4906 and barrier layer 4905. The deposited material could indeed by any kind of semiconductor material that has been oxidized. The oxidation process could be via the lateral oxidation of silicon process (LOCOS) or oxidation of a metal nitride M-N compound into an oxide $M_2O_3$. Likewise, the active layer could be directly oxidized such that in situations where the active layer comprised metal alloys, the region of straining material could be a metal oxide of the material used to form the light emitting junction.

If the chemical treatment discussed immediately above is oxidation, certain benefits can be realized. Since oxidized materials tend to have a high band gap, the strain inducing region can also act as an insulant and passivant. As can be seen in FIG. 49B, if the material were to be deposited to cover the entire exposed surface of the active layer 4906, or covered the entire exposed surface after being oxidized, the strain inducing region could act in tandem with mask layer to provide a fully encapsulating passivant for the active layer.

The devices described with reference to FIGS. 48A and 49A, similar to the passivation layer approach, provides certain benefits in that the trench pattern and trench modification processing can be applied globally to a semiconductor wafer. Furthermore, the trenches can be formed after the junction structure 4825 has been finalized such that the effect of the strain on the device can be measured. In addition, the trench approach can induce different kinds of strain such as tri-axial, biaxial and uniaxial strain based on the pattern selected for the trench holes which provides a refined level of control for tuning the behavior of the junction. In addition, the trench pattern could be modified across the surface of the wafer such that a single wafer could be used to test the effect of various different strain levels on a particular junction material. For example, one device on the wafer could have no trenches and the number of trenches per device could be ramped across different devices on the same wafer. This approach would provide significant benefits because wafer-to-wafer process variations would not have an effect on the collected measurements thereby isolating the effect of the pattern on the junctions.

Figure 50A:
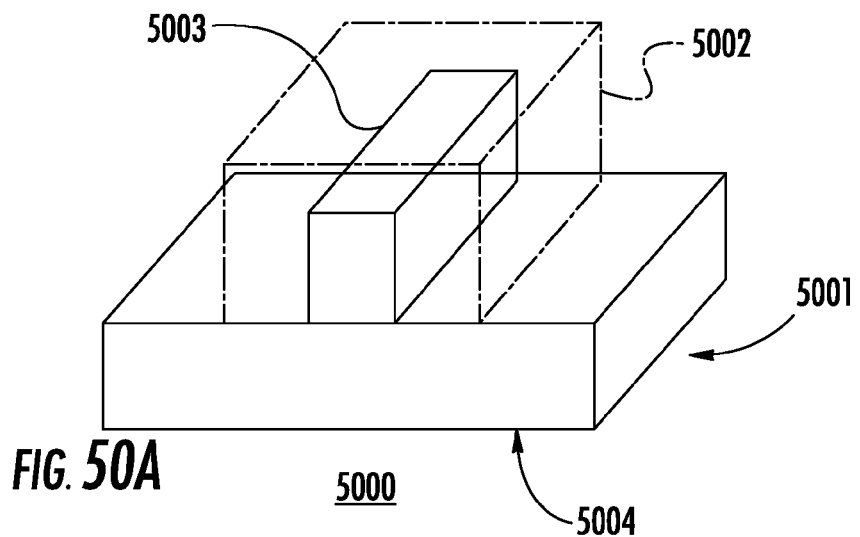
FIGS. 50A and 50B illustrate cross sections of a strain tuned light generating semiconductor junction devices using a strain inducing sheathing layer.
Figure 50B:
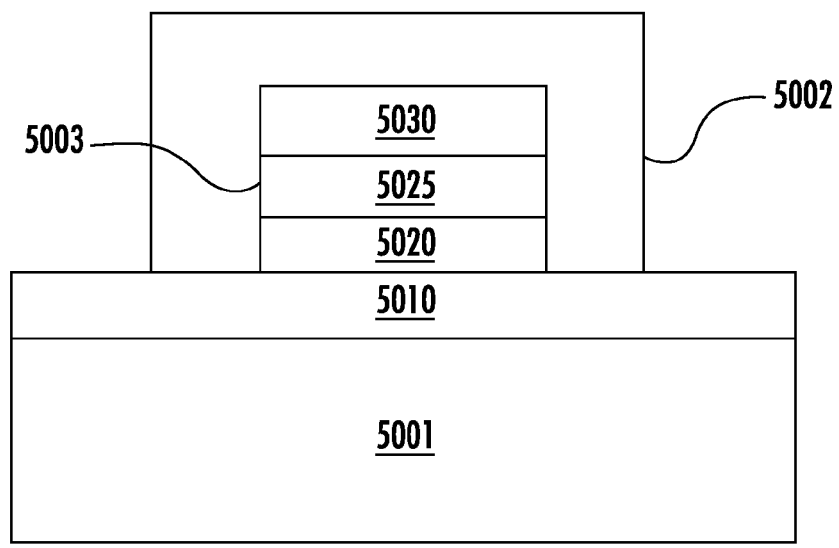

Another strain tuned light emitting semiconductor devices can be described with reference to the wafer cross section 5000 and junction cross section 5010 in FIGS. 50A and 50B. Wafer cross section 5000 illustrates a light emitting semiconductor junction 5003 formed on a substrate 5001 and encapsulated by region of strain inducing material 5002 acting as a wrap-around stressor. Cross section 5010 illustrates a two dimensional cross section of the wafer cross section 5000 along line 5004. FIG. 50B illustrates the light emitting junction 5003 using the reference numerals from FIG. 23 to illustrate how a vertical p-i-n junction with an optional buffer layer could be strained under this approach. However, as mentioned above, a light emitting junction with any number of structures could be strained in a similar manner. As shown in cross section 5010, the region of set strain material fully encompasses the junction in two directions along the illustrated cross section and is in direct contact with the active layer of the junction. The region of set strain material 5002 also fully encompasses the junction along a third direction along illustrated cross section (i.e., the top of the junction is fully covered by the strain inducing region in this cross section). Therefore, in combination with the substrate, or the optional buffer layer, the strain inducing region fully encompasses the junction in every direction along the illustrated cross section. In an alternative approach, the strain inducing region can leave the top side of the junction exposed to provide space for an electrical contact.

Figure 51:
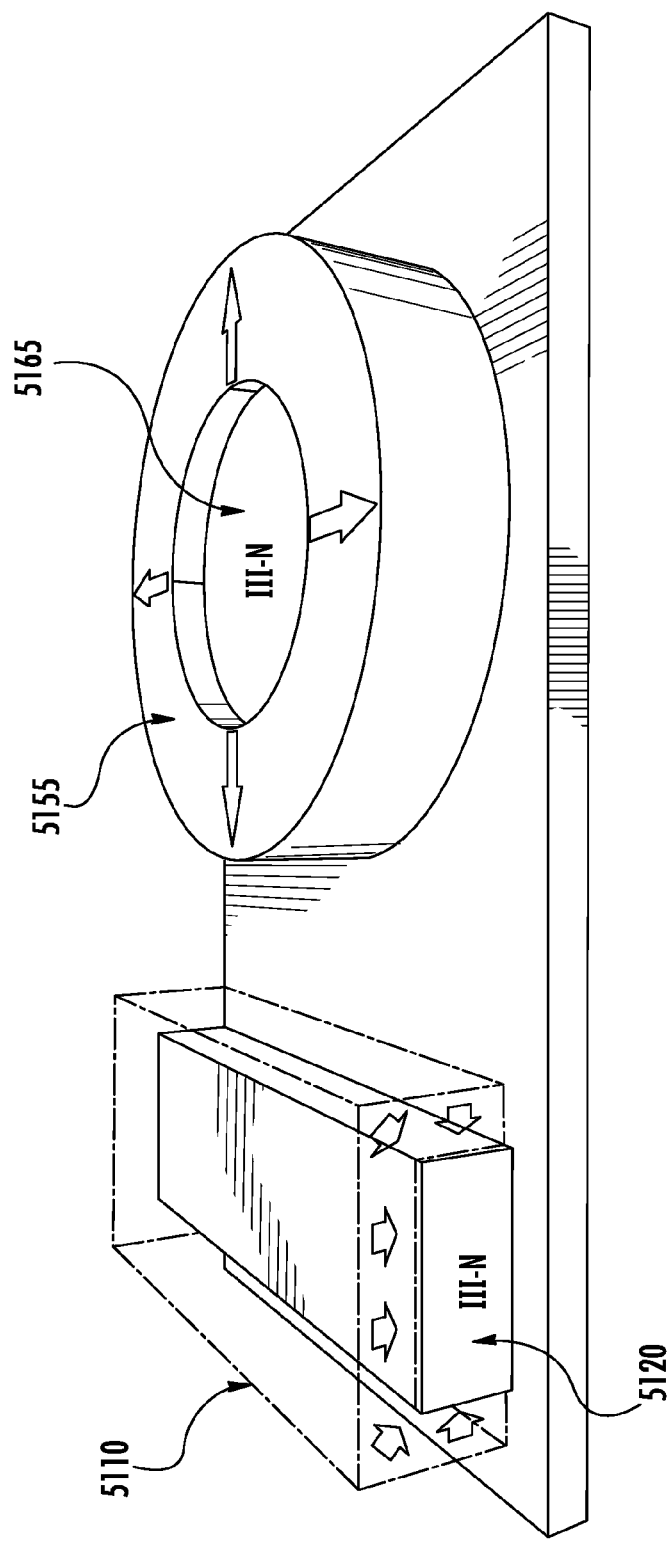
FIG. 51 shows a comparison of two example stressor types provided by a sheathing stressor and a cylindrical stressor applied to a wurtzite active region.

Regions of strain inducing material 5110 and 5155 shown in FIG. 51 are formed using similar methods. In either case, the junction layers 5120 and 5165 can be etched to form mesas that will each serve as independent junctions. A stressed film, or films, can then be deposited over the wafer to produce in-plane stress on the junctions. As an example, a tensile stressed film could be deposited globally across the wafer to produce strain in the junctions. As a specific example, silicon nitride or tungsten could be deposited across the entire wafer via evaporation. However, multiple films can be deposited using any kind of deposition process. The films could also be deposited in sequence such that different types of strain were introduced at different strata of the mesas. As a result, the p-type layer of a p-i-n junction could be strained using a different strain than that used to strain the n-type layer of the junction.

Figure 52:
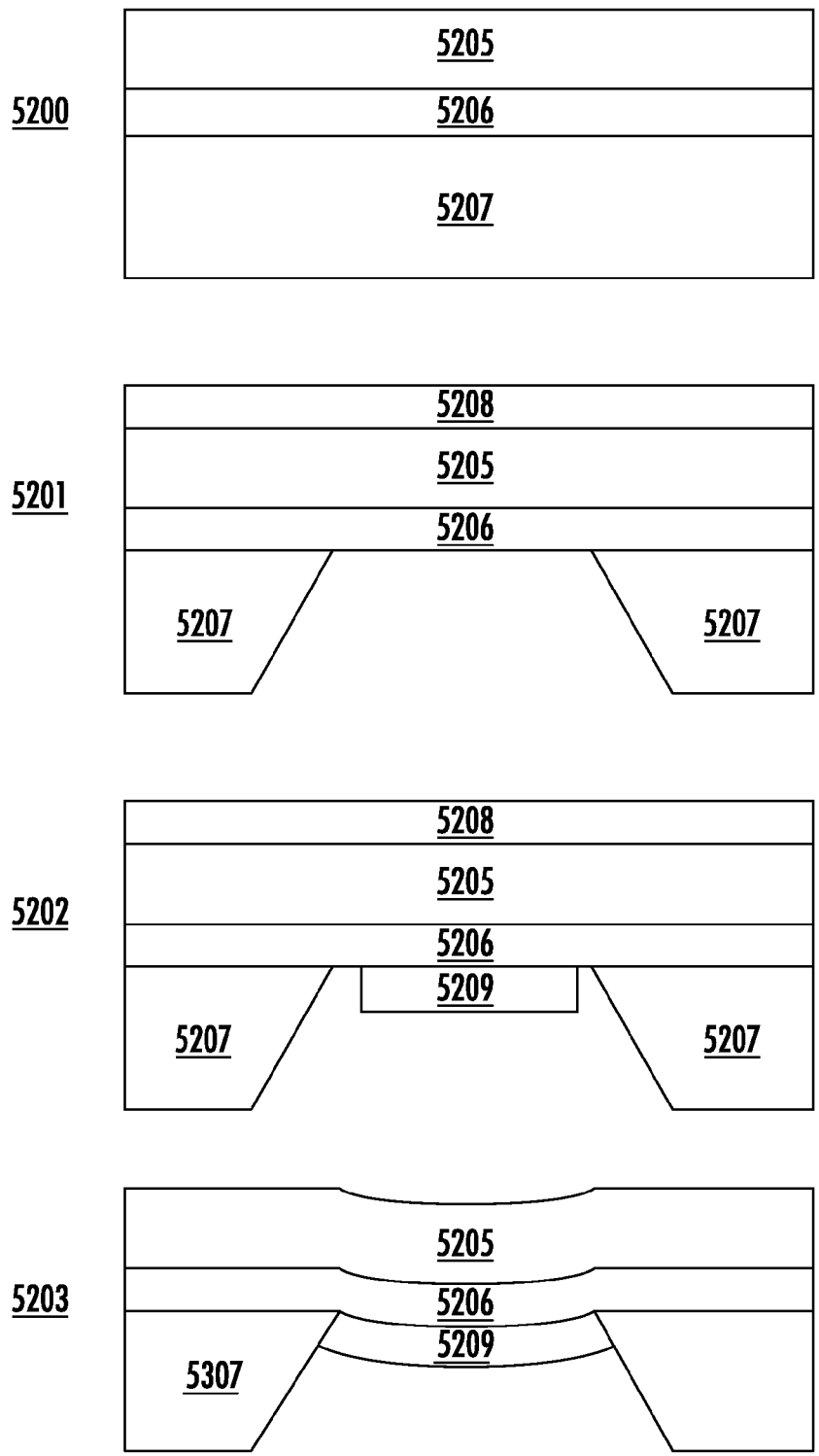
FIG. 52 illustrate a process for producing a strain tuned light generating semiconductor junction device using a back side strain inducing layer.

A specific example of approaches in which the region of strain inducing material is formed using the backside processing can be described with reference to FIG. 52. The figure illustrates a cross section of a light emitting junction device at four stages of fabrication 5200-03. Stage 5200 illustrates a light emitting junction having active layer 5205, optional barrier layer 5206, and substrate layer 5207. Stage 5201 illustrates the device after a stabilizing layer 5208 has been added to the device and a portion of the substrate has been removed to expose barrier layer 5206. In an alternative approach, the excavated substrate layer terminates in substrate layer 5207 such that the substrate is only partially removed. The stabilizing layer 5208 can be a handle wafer or mechanical chuck used to hold the device wafer in place during back side processing.

In stage 5202, a strain inducing layer of material 5209 has been deposited on the back side of the device. This material could be deposited in a targeted manner or it could be globally deposited and then removed using a planarization step. The strain inducing material 5209 could also be a via deposited on the back side of the device. The via could be tungsten, copper, or any other conductive material. The via could also be a portion of a solder bump deposited on the back side of the wafer. The strain inducing material could induce strain by having a different thermal coefficient of expansion that other layers in the wafer, by having an intrinsic strain due to the characteristics of the bond with the wafer, or by its weight pulling down on the wafer. Strain could also be induced without the deposition of a straining inducing material. For example, active layer 5205 could be a thin membrane that would strain under its own weight once the substrate below it and the support layer above it were removed. In a combination of these approaches, the strain inducing material 5209 could enhance the deformation of the membrane by increasing the weight that the membrane needed to support.

In stage 5203, the support layer 5208 has been removed from the wafer. This step could involve reversing a temporary bond between a handle wafer and the device wafer, releasing an electrostatic bond between a chuck and the device wafer, releasing an air pressure seal between a vacuum chuck and the device wafer, or gradually thinning the support layer through a chemical mechanical polish or etching step until a desired level of deformation has been achieved. In this approach, the strain could be monitored in situ as the support layer was thinned, and the thinning process could be terminated when the desired strain profile was achieved. As illustrated, active layer 5205 has warped under the influence of its own weight, the strain induced by region of material 5209, or a combination of both of those influences. The deformation could occur in tandem with the removal or thinning of support layer 5208 or it could subsequently occur as part of an additional temperature treatment or chemical processing step applied to the wafer after support layer 5208 was removed or thinned.

Figure 53:
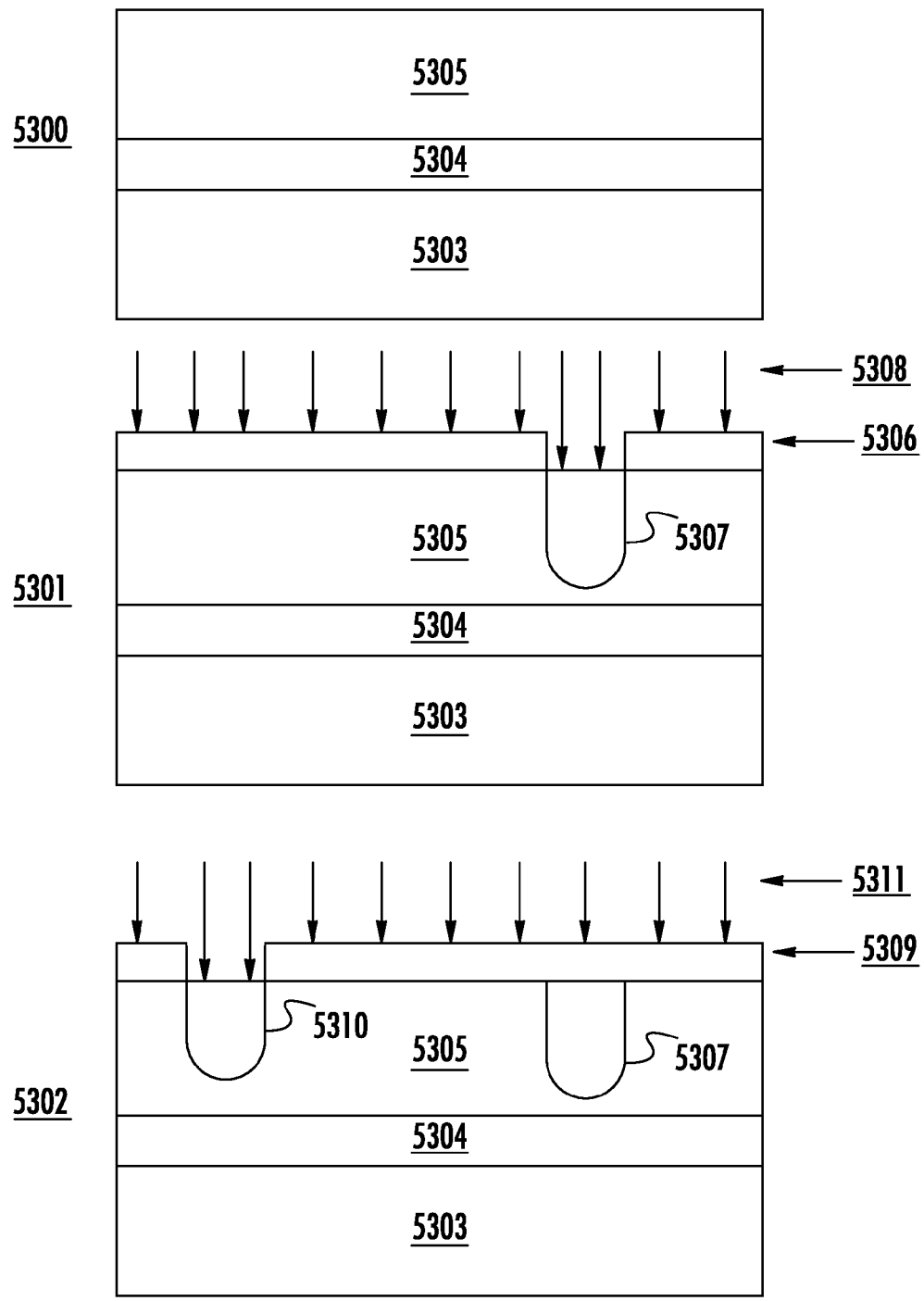
FIG. 53 illustrate a process for producing a strain tuned light generating semiconductor junction device using ion implantation and diffusion.

A specific example of approaches in which the region of strain inducing material is formed using ion-implantation can be described with reference to FIG. 53. The figure illustrates a cross section of a light emitting junction device at three stages of fabrication 5300-02. Stage 5300 illustrates a light emitting junction device having active layer 5305, optional barrier layer 5304, and substrate layer 5303. In the device shown in stage 5300, the actual light emitting junction may or may not have been formed in the device. This is because the strain inducing region in this approach can be formed using the same processing approach used to form the different layers required for the active devices. A further benefit of this approach is that in certain cases the strain inducing region and the actual junctions can be formed in either order based on whichever is convenient.

Stage 5301 shows the wafer after a mask 5306 has been placed over the wafer that covers the wafer except for in region 5307. Also illustrated is an ion bombardment 5308 which implants ions to form region 5307. This ion bombardment can introduce impurity ions into a non-intentionally-doped film of active material which could be a III-N material. The ion bombardment can form the junction structures such as p-type and n-type regions. However, the ion bombardment can also form strain inducing regions.

In stage 5302, a different mask 5309 has been placed over the wafer. Mask 5309 exposes region 5310. After a second ion-bombardment 5311, region 5310 will have a different characteristic than the rest of active layer 5305. Again, this region can be part of the junctions, or it can be a strain inducing region. Various ion bombardments such as 5308 and 5311 can be applied to create different regions. By adjusting the chemical composition of the bombardment and the energy of the bombardment, a multitude of potential strain patterns can be induced in the junctions formed in the device. For example, an oxygen or hydrogen implant can induce large changes in the material elastic parameters of active layer 5305 to create a compressive or tensile force on the portions of active layer 5305 surrounding region 5307 or region 5310. Furthermore, the implanted species can be further activated by a thermal or chemical step such as a thermal anneal and recrystallization to convert the material such that it induces a different kind of strain. For example, AlGaN can be converted into AlGaON or AlGaO$_x$. As a specific example, an oxygen ion implant of 50 keV can be used to induce structural changes in the III-N regions. Multiple energy implants can also be used to control the depth profile of the stressors. For example, in the case of a vertical p-i-n device with an n-type region towards the surface of the wafer, a low energy implant can be used to strain the n-type region alone while leaving the rest of the device unstrained. As illustrated, implant region 5307 is deeper than region 5310 such that any strain induced via region 5307 will have a more direct effect on the deeper regions of layer 5305. Also, although regions 5307 and 5310 are drawn as if they are homogenous from top to bottom, if the proper implant species and energy are applied, the implant can be conducted to target certain depths while leaving shallower depths unchanged.

Methods for tuning a light emitting semiconductor junction that are in keeping with the disclosures above can be described with reference to FIGS. 54-56. These methods allow for the production of light emitting semiconductor junctions that are tuned to produce a desired emissivity wavelength and polarization that stays within a desired acceptance window over a predetermined range of operating conditions. The methods involve the fabrication of a semiconductor junction and the application of strain to that junction. In specific instances, the methods include measuring the polarization and wavelength of the light generated by the junctions before applying strain. The methods can be applied to select the materials and degree of strain necessary to fabricate the junctions, calibrate the production line used to fabricate the junctions, and assure uniformity across various runs of the production line. In specific instances, the methods include iteratively measuring the polarization and wavelength of the light generated by the junctions and applying strain to the junctions based on those measurements.

Figure 54:
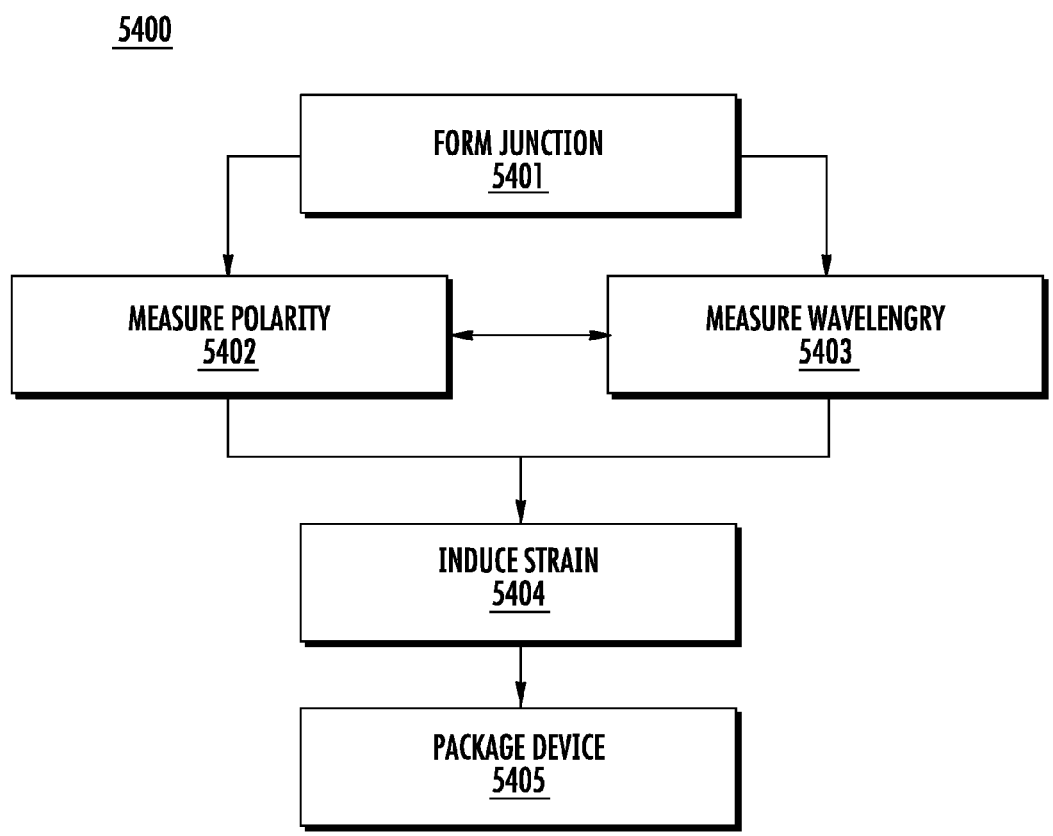
FIG. 54 illustrates a process of fabricating a DUV-LED with a desired emission wavelength.

FIG. 54 illustrates a process 5400 for fabricating a DUV-LED with a desired polarization and emission wavelength. As with tuning graph of FIG. 20, process 5400 is directed to DUV-LEDs because they provide an illustrative application of the processes disclosed in this specification, not because the disclosure is limited to DUV-LEDs. Process 5400 begins with step 5401 in which a homojunction is formed to generate light for the DUV-LED. The homojunction can be formed using the deposition of various materials and the doping of these materials through chemical vapor deposition, sputtering processes, or ion implantation. The homojunction can be formed on a substrate of glass, sapphire, native compound semiconductor, silicon or some other kind of material that differs from the composition of the homojunction. However, the homojunction can also be formed on a bulk substrate that matches the composition of the homojunction prior to the introduction of dopants. As mentioned previously, this can provide certain cost benefits and increase the flexibility of the fabrication procedure as a greater number of fabrication steps are amenable to bulk wafer processing. The homojunction can be formed using any of the materials described above.

Process 5400 continues with either step 5402 or 5403. In step 5402, a polarization of the light generated by the homojunction is measured. In step 5403, a wavelength of the light generated by the homojunction is measured. The steps are drawn in parallel and with arrows connecting the two steps because they can generally be conducted in any order. In addition, it is possible for the two steps to be conducted in parallel using the same device. However, steps 5402 and 5403 must follow step 5401 because it is not possible to measure the light generated by the homojunction before the device is formed. Step 5401 could include the formation of electrical contacts to the homojunction in order to apply an electromagnetic force used by the device to generate light. The electrical contacts could be the permanent contacts that will be used by the device when it is in finished form. However, the electrical contacts could also be temporary or unfinished contacts that are meant to be used in combination with a probe device that is part of the fabrication line used to produce the device.

Process 5400 continues with step 5404 in which a biaxial or uniaxial strain is induced in the device. The induced strain can be calibrated and applied based on the measurements taken in steps 5402 and 5403. The strain can be induced by any of the procedures mentioned above. In particular, the strain can be induced via the deposition of a passivation layer across the top surface of the light emitting diode that applies a biaxial strain to the junction. The passivation layer could be directly in contact with the material that comprises the junction or there could be various layers in between the junction and the passivation layer. In the case of a DUV-LED, the strain will generally be a biaxial compressive strain intended to switch the polarization of the emitted light to transverse electric.

After the strain is introduced, process 5400 will continue with step 5405 in which the device is packaged. The packaging step could include the introduction of solder bumps or metal posts in contact with the electrodes of the DUV-LED and the addition of optical components for directing the generated light. In situations where multiple LEDs were being fabricated on a wafer, packaging would be preceded by singulating the LEDs from the wafer. This singulation could be conducted on sets of LEDs if keeping multiple LEDs on a single wafer was desired such as in applications where multiple LEDs were being integrated in a single-chip system.

Figure 55:
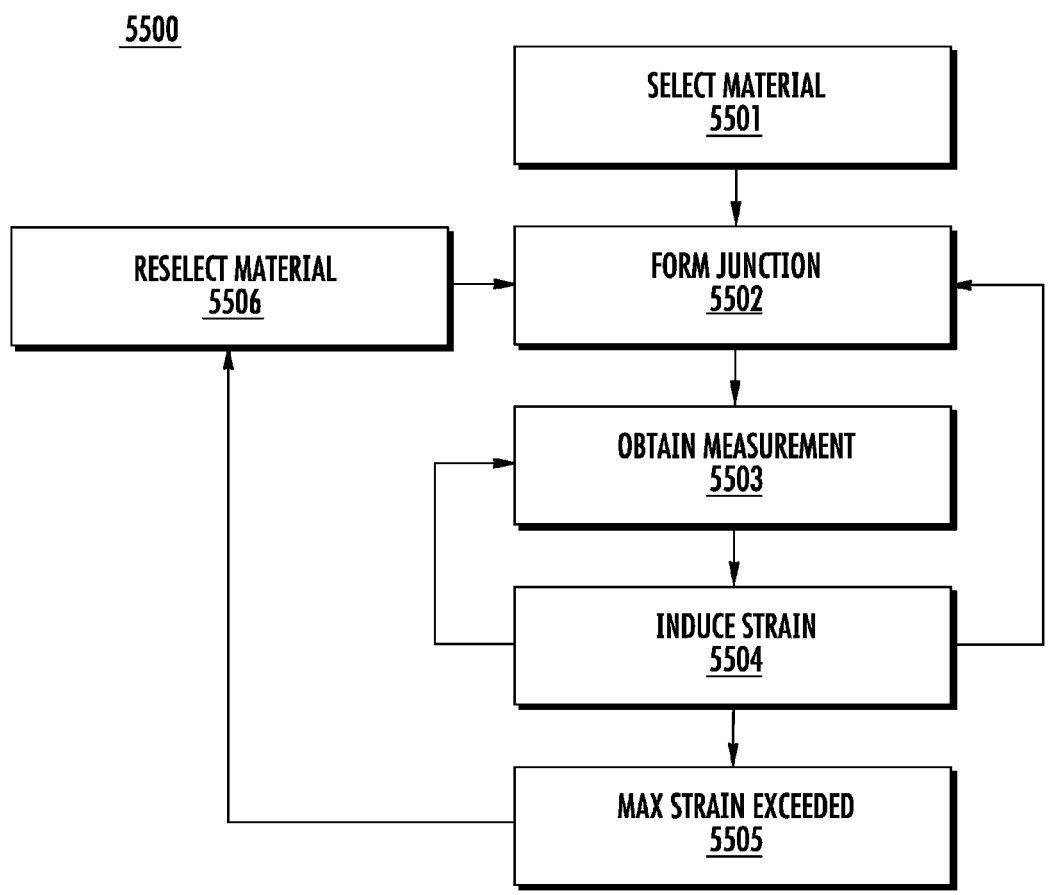
FIG. 55 illustrates a process for calibrating a fabrication line for producing devices with light emitting semiconductor junctions.

FIG. 55 illustrates a process 5500 for calibrating a fabrication line for producing devices with light emitting semiconductor junctions. Process 5500 allows a designer to calibrate a production line to produce a light emitting semiconductor junction that produces light with a desired emission wavelength and optical polarization. In step 5501, a material for the junction will be selected. The material will be selected to generally meet the target emission wavelength range and specific device requirements of the desired device. Specific device requirements include an acceptable lattice match to the buffer layer of the device as well as a high activated doping density for the p-type and n-type regions. The optical polarization of the light generated by the material can also be taken into account in step 5501 such that if an LED is required, materials that produce light with transverse electric polarization can be selected. Returning to the example of a DUV-LED, step 5501 could comprise the selection of AlGaN with the primary composition of aluminum exceeding 0.115. The material could be grown as a wurzite crystal on a c-axis oriented buffer of AlN and a sapphire substrate. In step 5502, a junction is formed using the selected material.

In step 5503, a measurement is obtained for the polarization and wavelength of the light generated from the junction. If the measurement indicates that the polarization and wavelength of the generated light meet the desired criteria for the device, process 5500 will terminate and the current strain profile and material selection will be saved to calibrate the manufacturing line. If the measurement indicates that the polarization and wavelength are not acceptable, strain will be induced in the device in step 5504 to alter the polarization and wavelength of the light as needed. Steps 5503 and 5504 will be repeated iteratively to tune both the wavelength and polarization of the emitted light. If the process for inducing strain can be iteratively conducted on the same device, the process can iteratively cycle directly through steps 5503 and 5504. For example, a MEMS could be built into the device or a testing structure could be in contact with the device such that the strain induced in the junction could be tuned in either direction while measurements were being conducted on that single device. As another example, certain procedures may allow the strain to be tuned in a single direction in-between measurements—the application of successively more and more trenches in the excavated trenches approach described with reference to FIG. 48 is an example of this type of tuning mechanism. However, if the process for inducing strain cannot be reliably overridden and controlled by a subsequent iteration of step 5504, the process may have to cycle back from step 5504 to step 5502 before another measurement could be taken. A subsequent iteration of step 5502 could include the production of another junction using the same material selected in step 5501.

The measurement obtained in step 5503 can be obtained in situ while the device is in one of the tools used to form the junction in step 5502 or while the device is in the tool used to induce strain in step 5504. However, the measurement could also be obtained after removing the device from the tool and placing it on a separate station. The station could be one that is specifically designed to conduct the measurement efficiently. Since the calibration of the manufacturing line will not need to be conducted every time a new batch of wafers is processed, the additional time needed to remove the device from the assembly line and conduct measurements on the device will not significantly impact the cost of production for the device. One benefit of conducting the tuning of steps 5502-04 in the manufacturing line is that fabrication facilities generally have stations where the temperature of a wafer and device can be monitored and controlled with high accuracy. Therefore, determining if a certain level of induced strain has resulted in a device that will perform within the desired acceptance window across the desired range of operating temperatures is generally easier if done while the device is in the fabrication facility. Also, some of the processing steps associated with steps 5504 and 5502 may be conducted in environments where the temperature of the wafer is already controlled as part of the processing step or is already monitored for quality control purposes. Therefore, the device may already be in a conducive environment for obtaining the required measurements for step 5503.

Optional step 5505 will be accessed if a maximum level of strain is induced, or will be induced in the next instance of step 5504. As mentioned previously, devices cannot be strained to any desired degree without running the risk of degraded performance of the device or triggering a catastrophic failure of the device's crystal lattice. The maximum strain can be set based on the qualities of the material selected in 5501 and measurements of how similar devices have performed over the long term when subjected to certain degrees of strain. If the maximum strain for the device is exceeded before step 5503 obtains a sufficient measurement for the device's performance, the method will proceed to step 5501 in which a different material is selected. The material can be reselected based on information obtained from prior iterations of step 5503. For example, if the maximum compressive strain was exceeded in an Aluminum-based nitride alloy DUV LED without reaching the desired polarization, then the material selected in step 5501 would have a lower aluminum content than the material that was selected in step 5501 or a previous iteration of step 5505.

Figure 56:
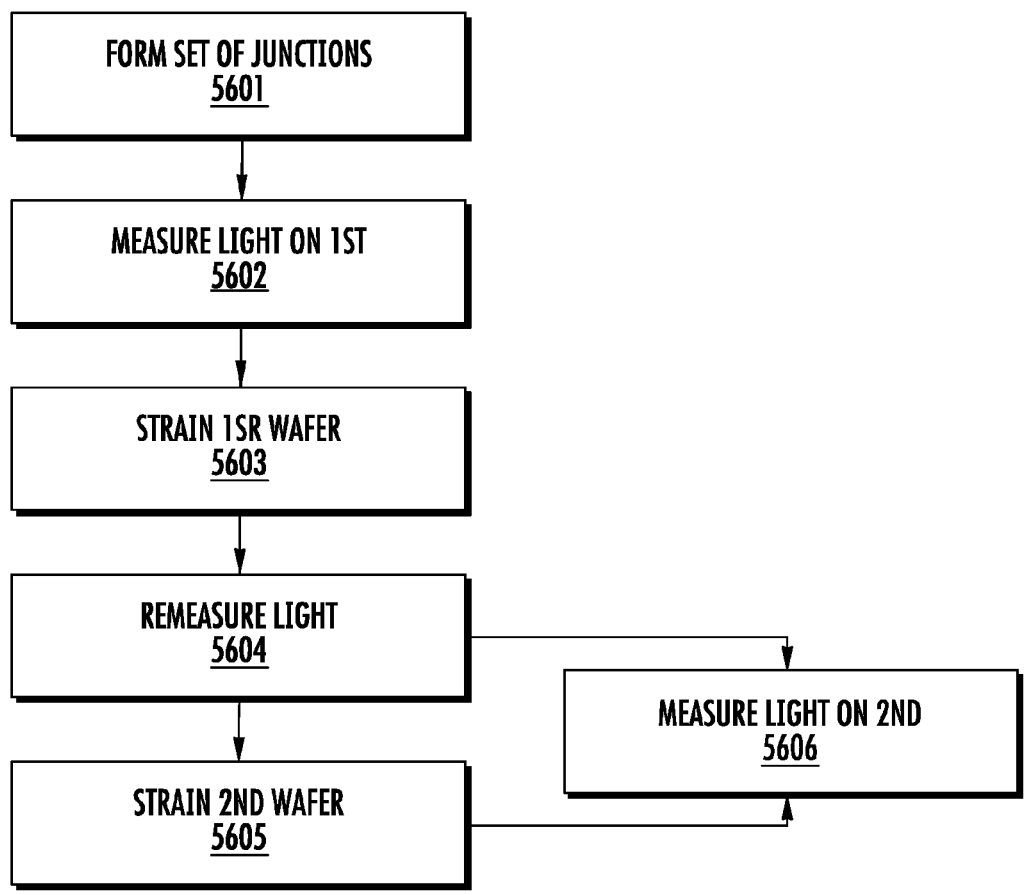
FIG. 56 illustrates a process for fabricating a light emitting semiconductor junction.

FIG. 56 illustrates a process 5600 for fabricating a light emitting semiconductor junction. Process 5600 begins with step 5601 in which a set of semiconductor junctions are formed on a lot of semiconductor wafers using a semiconductor material. The semiconductor material could be any of the materials mentioned above, and, in particular, could comprise a three-five material such as a group three nitride alloy. Step 5601 can include various processing steps—some of which may involve batch processing the lot of wafers while others are implemented one wafer at a time. Process 5600 continues with step 5602 in which the light generated by one of the light emitting junctions is measured. Both the polarization and the wavelength of the light can be measured in this step. The procedure for measuring can match any of those described above. In particular, the measurement could be conducted in situ. Also, step 5601 and 5602 may be interspersed such that a first junction is produced and the light from that junction is measured before another junction in the set is produced.

Process 5600 will then continue with steps 5603 and 5604 in which a wafer is strained using a wafer process and then the generated light is remeasured. The wafer process could be the deposition of a strain inducing passivation layer, the introduction of strain inducing trenches, or any of the other methods described above. The process by which the light is measured could match the process applied in step 5602 or a different measurement process could be applied. For example, the first measurement could be conducted in situ and the second measurement could be conducted at a specialized off-line measurement device. The temperature and other operating conditions for both measurements would beneficially be as close to identical as possible in order for the two measurements to isolate the effect of the wafer processing step on the generated light. The isolated information would then allow the manufacturing system to adjust the strain applied to another wafer in the lot of wafers in step 5605. For example, if the light measured in step 5604 indicated that the strain needed to be increased, the wafer processing in step 5605 could be conducted in a way that would induce a greater degree of strain in the device. The manufacturing system could save the measurements taken in previous iterations of steps 5602 and 5604 to determine what degree of adjustment needed to be made prior to inducing strain in step 5605. This procedure could be conducted periodically to align the fabrication facility back in line with a desired tolerance.

Process 5600 could also include step 5606 in which the light from the device on the second wafer is measured prior to inducing strain in the second wafer. This information could then be combined with information from step 5603, step 5604, and the stored information describing prior iterations of those steps to select a proper degree of strain to be applied in step 5605. Although this process will likely provide a greater degree of confidence and precision in the performance of the devices on the second wafer, the cost of the additional step should be weighed against the fact that the first and second wafers are part of the same lot. Depending on the prior processing steps for the lot the two wafers could have substantially the same characteristics such that step 5606 serves as an unnecessary repetition of step 5602.

The methods described with reference to both FIG. 55 and FIG. 56 could be conducted using a strain inducing wafer processing step that exhibits a different level of strain across the wafer. The example of varying numbers of excavation trenches and patterns for those trenches across the different devices in the wafer is an example of such a varying global wafer process. As a result, a single wafer could be used to obtain several different data points regarding the amount of strain induced in a device and the resulting characteristic of the light generated by the device. When used in combination with process 5500, the efficiency of the original calibration of the manufacturing line could be greatly enhanced. When used in combination with process 5600, the varying global processing step could be applied periodically to a calibration wafer that would be used to adjust the processing step in the future. The varying global processing step would not be applied to regular production wafers because such an approach would run contrary to the desire to produce devices having matching and predictable characteristics. In either situation, the use of a varying global processing step would allow the manufacturing line to obtain a greater degree of information than would be provided by a single wafer undergoing a uniform global processing step which would provide clear benefits to the initial calibration and adjustment of the manufacturing line.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those skilled in the art, without departing from the spirit and scope of the present invention, which is more particularly set forth in the appended claims.

What is claimed is:

1. A process for fabricating a deep ultraviolet light emitting diode comprising:
    forming a homojunction of said light emitting diode;
    testing an optical polarization of said light emitting diode;
    testing an emission wavelength of said light emitting diode;
    introducing a set strain to said light emitting diode after testing said optical polarization of said light emitting diode; and
    packaging said light emitting diode after introducing said set strain.

2. The process of claim 1, further comprising:
    forming a passivation layer across a top surface of said light emitting diode;
    wherein said passivation layer provides said set strain to said light emitting diode; and
    said set strain is a biaxial strain.

3. The process of claim 1, wherein:
    said homojunction comprises aluminum; and
    said homojunction is supported by a bulk substrate.

4. The process of claim 1, wherein:
    said set strain alters an emitted light propagation direction of said light emitting diode from a transverse magnetic direction to a transverse electric direction.

5. A process for calibrating a fabrication line for producing devices with light emitting semiconductor junctions, comprising:
    selecting a primary composition proportion for a group three material in a three five semiconductor material;
    forming a light emitting semiconductor junction using said semiconductor material;
    obtaining a first measurement of an optical polarization and emission wavelength of light generated by said light emitting semiconductor junction;
    straining said light emitting semiconductor junction using a wafer process to target a desired emission wavelength and a desired optical polarization; and
    reselecting said primary composition proportion if said straining cannot achieve said desired emission wavelength and said desired optical polarization.

6. The process of claim 5, wherein:
    said straining induces a tensile strain if said first measurement determines that said optical polarization is transverse electric; and
    said light emitting semiconductor junction produces light for a light emitting diode.

7. The process of claim 5, wherein:
    said straining induces a compressive strain if said first measurement determines that said optical polarization is transverse magnetic; and
    said light emitting semiconductor junction produces light for a semiconductor laser.

8. The process of claim 5, wherein:
    said straining induces a tensile strain if said first measurement determines that said emission wavelength is less than said desired emission wavelength; and
    said straining induces a compressive strain if said first measurement determines that said emission wavelength is more than said desired emission wavelength.

9. The process of claim 5, further comprising:
    obtaining a second measurement of said emission wavelength after said straining has induced a maximum acceptable strain of said light emitting semiconductor junction; and
    wherein:
        said reselecting increases said primary composition proportion if said second measurement of said emission wavelength is less than said desired emission wavelength; and
        said reselecting decreases said primary composition proportion if said second measurement of said emission wavelength is greater than said desired emission wavelength.

10. The process of claim 5, wherein
said group three material is aluminum.

11. The process of claim 10, wherein:
said semiconductor material is a ternary group-three nitride alloy; and
said ternary group-three nitride alloy comprises gallium.

12. The process of claim 5, wherein said straining comprises
conducting said wafer process on a wafer after obtaining said first measurement and before singulating dies from said wafer; and
wherein said wafer comprises said light emitting semiconductor junction.

13. The process of claim 12, wherein said wafer processing step comprises
forming a passivation layer on a top surface of said wafer.

14. The process of claim 12, wherein said wafer process comprises:
etching into a top surface of said wafer to form a set of excavated regions in said wafer; and
forming a set of pillars in said excavated regions, said pillars comprising a straining material.

15. A process for fabricating a light emitting semiconductor junction comprising:
forming a set of light emitting semiconductor junctions on a lot of wafers using a semiconductor material, said light emitting semiconductor junction being in said set of light emitting semiconductor junctions and on a wafer in said lot of wafers, and said semiconductor material comprising a group three material and a group five material;
measuring an optical polarization and an emission wavelength of light generated by said light emitting semiconductor junction to obtain a measurement;
straining said light emitting semiconductor junction using a wafer process conducted on said wafer after said measuring of said optical polarization and said emission wavelength of light generated by said light emitting semiconductor junction, said wafer process being conducted before singulating a die from said wafer;
remeasuring said optical polarization and said emission wavelength of light generated by said light emitting semiconductor junction after straining said light emitting semiconductor junction to obtain a second measurement; and
straining a second light emitting semiconductor junction from said set of light emitting semiconductor junction on a second wafer from said lot of wafers based on said measurement, a desired optical polarization and a desired emission wavelength.

16. The process of claim 15, wherein:
said group three material is aluminum; and
said semiconductor material is ternary group-three nitride alloy.

17. The process of claim 15, wherein:
said wafer process is a variant wafer process; and
said remeasuring collects a plurality of different data points based on said variant wafer process.

18. The process of claim 15, wherein said wafer process comprises
forming a passivation layer on a top surface of said wafer.

19. The process of claim 18, wherein:
said measurement indicates that said optical polarization of light generated by said light emitting semiconductor junction is a transverse magnetic polarization;
said light emitting semiconductor junction is used for a semiconductor laser; and
said passivation layer introduces a tensile strain to said second wafer.

20. The process of claim 18, wherein:
said measurement indicates that said optical polarization of light generated by said light emitting semiconductor junction is a transverse electric polarization;
said light emitting semiconductor junction is used for a light emitting diode; and
said passivation layer introduces a compressive strain to said second wafer.

* * * * *